United States Patent
Sole Rojals et al.

(10) Patent No.: US 9,055,290 B2
(45) Date of Patent: *Jun. 9, 2015

(54) CODING THE POSITION OF A LAST SIGNIFICANT COEFFICIENT WITHIN A VIDEO BLOCK BASED ON A SCANNING ORDER FOR THE BLOCK IN VIDEO CODING

(71) Applicant: QUALCOMM Incorporated, San Diego, CA (US)

(72) Inventors: Joel Sole Rojals, La Jolla, CA (US); Muhammed Zeyd Coban, Carlsbad, CA (US); Yunfei Zheng, San Jose, CA (US); Rajan Laxman Joshi, San Diego, CA (US); Marta Karczewicz, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/448,936

(22) Filed: Jul. 31, 2014

(65) Prior Publication Data

US 2014/0341274 A1 Nov. 20, 2014

Related U.S. Application Data

(63) Continuation of application No. 13/303,015, filed on Nov. 22, 2011.

(60) Provisional application No. 61/419,740, filed on Dec. 3, 2010, provisional application No. 61/426,426, filed on Dec. 22, 2010, provisional application No. 61/426,360, filed on Dec. 22, 2010, provisional application No. 61/426,372, filed on Dec. 22, 2010.

(51) Int. Cl.
*H04N 19/13* (2014.01)
*H03M 7/40* (2006.01)
(Continued)

(52) U.S. Cl.
CPC ............... *H04N 19/13* (2014.11); *H04N 19/91* (2014.11); *H03M 7/4018* (2013.01);
(Continued)

(58) Field of Classification Search
CPC ............................... H04N 19/13; H04N 19/91
See application file for complete search history.

(56) References Cited

U.S. PATENT DOCUMENTS

| 1,679,903 A | 8/1928 | Holinger |
|---|---|---|
| 5,295,203 A | 3/1994 | Krause et al. |

(Continued)

FOREIGN PATENT DOCUMENTS

| EP | 1041826 A1 | 10/2000 |
|---|---|---|
| EP | 1679903 A2 | 7/2006 |

(Continued)

OTHER PUBLICATIONS

T. Davies, K.R. Andersson, R. Sjoberg, T. Wiegand, D. Marpe, K. Ugur, J. Ridge, M. Karczewicz, Peisong Chen, G. Martin-Cocher, K. McCann, W.J. Han, G. Bjontegaard, & A. Fuldseth, "Suggestion for a Test Model", JCT-VC Document No. A033 (Apr. 2010).*

(Continued)

*Primary Examiner* — David N Werner
(74) *Attorney, Agent, or Firm* — Shumaker & Sieffert, P.A.

(57) ABSTRACT

In one example, an apparatus is disclosed for coding coefficients associated with a block of video data during a video coding process, wherein the apparatus includes a video coder configured to code x- and y-coordinates that indicate a position of a last non-zero coefficient within the block according to a scanning order associated with the block when the scanning order comprises a first scanning order, and code interchanged x- and y-coordinates that indicate the position of the last non-zero coefficient within the block according to the scanning order when the scanning order comprises a second scanning order, wherein the second scanning order is different than the first scanning order.

15 Claims, 11 Drawing Sheets

(51) Int. Cl.
  *H03M 7/30* (2006.01)
  *H04N 19/176* (2014.01)
  *H04N 19/70* (2014.01)
  *H04N 19/61* (2014.01)
  *H04N 19/436* (2014.01)
  *H04N 19/91* (2014.01)

(52) U.S. Cl.
  CPC .......... *H03M 7/6035* (2013.01); *H04N 19/176* (2014.11); *H04N 19/70* (2014.11); *H04N 19/61* (2014.11); *H04N 19/436* (2014.11)

(56) References Cited

U.S. PATENT DOCUMENTS

| | | |
|---|---|---|
| 5,583,657 A | 12/1996 | Jeong |
| 5,631,744 A | 5/1997 | Takeuchi et al. |
| 5,818,877 A | 10/1998 | Tsai et al. |
| 5,838,825 A | 11/1998 | Obayashi et al. |
| 5,852,469 A | 12/1998 | Nagai et al. |
| 6,301,304 B1 | 10/2001 | Jing et al. |
| 6,646,578 B1 | 11/2003 | Au |
| 6,680,974 B1 | 1/2004 | Faryar et al. |
| 6,775,414 B1 | 8/2004 | Fogg et al. |
| 6,856,701 B2 | 2/2005 | Karczewicz et al. |
| 7,369,066 B1 | 5/2008 | Benzreba et al. |
| 7,376,280 B2 | 5/2008 | Handley et al. |
| 7,379,608 B2 | 5/2008 | Marpe et al. |
| 7,483,575 B2 | 1/2009 | Fukuhara et al. |
| 7,522,774 B2 | 4/2009 | Ramasastry et al. |
| 7,535,387 B1 | 5/2009 | Delva |
| 7,609,904 B2 | 10/2009 | Miller |
| 7,702,013 B2 | 4/2010 | Schwarz et al. |
| 7,813,567 B2 | 10/2010 | Sankaran |
| 7,843,998 B2 | 11/2010 | Bjontegaard |
| 7,885,473 B2 | 2/2011 | Sankaran |
| 7,920,629 B2 | 4/2011 | Bjontegaard et al. |
| 8,311,119 B2 | 11/2012 | Srinivasan |
| 8,446,301 B2 | 5/2013 | He et al. |
| 8,687,904 B2 | 4/2014 | Sasai et al. |
| 8,861,599 B2 | 10/2014 | Auyeung et al. |
| 2002/0122483 A1* | 9/2002 | Tanaka et al. ............ 375/240.03 |
| 2002/0163967 A1* | 11/2002 | Youn et al. ............... 375/240.12 |
| 2003/0016876 A1 | 1/2003 | Chai et al. |
| 2003/0048208 A1 | 3/2003 | Karczewicz |
| 2003/0128886 A1 | 7/2003 | Said |
| 2004/0131272 A1* | 7/2004 | Kobayashi et al. ........... 382/247 |
| 2004/0184544 A1 | 9/2004 | Kondo et al. |
| 2005/0036549 A1 | 2/2005 | He et al. |
| 2005/0078754 A1 | 4/2005 | Liang et al. |
| 2005/0123207 A1 | 6/2005 | Marpe et al. |
| 2006/0078049 A1 | 4/2006 | Bao et al. |
| 2006/0227865 A1 | 10/2006 | Sherigar |
| 2007/0036223 A1 | 2/2007 | Srinivasan |
| 2007/0071331 A1 | 3/2007 | Liu |
| 2007/0285285 A1 | 12/2007 | Puri et al. |
| 2008/0013633 A1 | 1/2008 | Ye et al. |
| 2008/0089425 A1 | 4/2008 | Karczewicz |
| 2008/0152015 A1 | 6/2008 | Benzreba et al. |
| 2008/0219578 A1 | 9/2008 | Lee |
| 2008/0310504 A1 | 12/2008 | Ye et al. |
| 2008/0310507 A1 | 12/2008 | Ye et al. |
| 2008/0310745 A1 | 12/2008 | Ye et al. |
| 2009/0067503 A1 | 3/2009 | Jeong et al. |
| 2009/0154820 A1 | 6/2009 | Li et al. |
| 2009/0175332 A1 | 7/2009 | Karczewicz et al. |
| 2009/0201994 A1 | 8/2009 | Schwarz et al. |
| 2009/0201995 A1 | 8/2009 | Schwarz et al. |
| 2009/0201996 A1 | 8/2009 | Schwarz et al. |
| 2009/0202158 A1 | 8/2009 | Hwang et al. |
| 2009/0232204 A1* | 9/2009 | Lee et al. ............... 375/240.02 |
| 2009/0273706 A1 | 11/2009 | Tu et al. |
| 2010/0020867 A1 | 1/2010 | Wiegand et al. |
| 2010/0040148 A1 | 2/2010 | Marpe et al. |
| 2010/0097248 A1 | 4/2010 | Sze et al. |
| 2010/0097250 A1 | 4/2010 | Demircin et al. |
| 2010/0098155 A1 | 4/2010 | Demircin et al. |
| 2010/0111432 A1 | 5/2010 | Mohr |
| 2010/0118971 A1 | 5/2010 | Tanida et al. |
| 2010/0141489 A1 | 6/2010 | Reznik |
| 2010/0150226 A1 | 6/2010 | Hallapuro et al. |
| 2010/0324912 A1 | 12/2010 | Choo et al. |
| 2011/0001643 A1 | 1/2011 | Sze et al. |
| 2011/0080956 A1 | 4/2011 | Zhou et al. |
| 2011/0090955 A1 | 4/2011 | Liu et al. |
| 2011/0096834 A1 | 4/2011 | Cheon et al. |
| 2011/0097003 A1 | 4/2011 | Alshina et al. |
| 2011/0103489 A1 | 5/2011 | Takada |
| 2011/0206135 A1 | 8/2011 | Drugeon et al. |
| 2011/0206289 A1 | 8/2011 | Dikbas et al. |
| 2011/0243220 A1 | 10/2011 | Seregin et al. |
| 2011/0249755 A1 | 10/2011 | Shibahara et al. |
| 2011/0255799 A1 | 10/2011 | Omori |
| 2011/0268183 A1 | 11/2011 | Sole et al. |
| 2012/0008683 A1 | 1/2012 | Karczewicz et al. |
| 2012/0027081 A1 | 2/2012 | Endersen et al. |
| 2012/0082233 A1 | 4/2012 | Sze et al. |
| 2012/0140813 A1 | 6/2012 | Sole et al. |
| 2012/0140814 A1* | 6/2012 | Sole Rojals et al. ..... 375/240.02 |
| 2012/0163456 A1 | 6/2012 | Coban et al. |
| 2012/0163469 A1 | 6/2012 | Kim et al. |
| 2012/0163472 A1 | 6/2012 | Sole et al. |
| 2012/0183052 A1 | 7/2012 | Lou et al. |
| 2012/0183235 A1* | 7/2012 | Sasai et al. .................... 382/233 |
| 2012/0207400 A1* | 8/2012 | Sasai et al. .................... 382/233 |
| 2012/0230402 A1* | 9/2012 | Auyeung et al. ......... 375/240.12 |
| 2012/0230417 A1 | 9/2012 | Sole et al. |
| 2012/0230418 A1 | 9/2012 | Sole et al. |
| 2012/0230419 A1 | 9/2012 | Sole et al. |
| 2012/0230420 A1 | 9/2012 | Sole et al. |
| 2012/0236929 A1 | 9/2012 | Liu |
| 2012/0262313 A1 | 10/2012 | He et al. |
| 2012/0269263 A1 | 10/2012 | Bordes et al. |
| 2012/0288003 A1 | 11/2012 | Do et al. |
| 2013/0003834 A1 | 1/2013 | Rojals et al. |
| 2013/0003835 A1 | 1/2013 | Sole et al. |
| 2013/0051472 A1 | 2/2013 | Wiegand et al. |
| 2013/0058407 A1 | 3/2013 | Sole et al. |
| 2013/0114731 A1 | 5/2013 | Lee et al. |
| 2013/0343454 A1 | 12/2013 | Yeo et al. |
| 2014/0307777 A1 | 10/2014 | Sole et al. |
| 2014/0362925 A1* | 12/2014 | Nguyen et al. ........... 375/240.18 |

FOREIGN PATENT DOCUMENTS

| | | |
|---|---|---|
| EP | 1768415 A1 | 3/2007 |
| EP | 2182732 A1 | 5/2010 |
| JP | 2003224851 A | 8/2003 |
| JP | 2006211304 A | 8/2006 |
| WO | WO-2007043583 A1 | 4/2007 |
| WO | WO-2007063472 A2 | 6/2007 |
| WO | WO-2009075445 A1 | 6/2009 |
| WO | 2009134575 A2 | 11/2009 |
| WO | 2010018138 A1 | 2/2010 |
| WO | WO-2010131546 A1 | 11/2010 |
| WO | WO-2010143853 A2 | 12/2010 |
| WO | WO-2011128303 A2 | 10/2011 |

OTHER PUBLICATIONS

V. Seregin & J. Chen, "Low-complexity adaptive coefficients scanning", JCT-VC Document No. C205 (Oct. 2010).*

D. Marpe, H. Schwarz, & T. Wiegand, "Context-Based Adaptive Binary Arithmetic Coding in the H.264/AVC Video Compression Standard", 13 IEEE Transactions on Circuits & Sys. for Video Tech. 620-636 (Jul. 2003).*

"Test Model under Consideration", Joint Collaborative Team on Video Coding (JCT-VC) of ITU-T SG16 WP3 and ISO/IEC JTC1/SC29/WG11, Document: JCTVC-B205, Status: Output Document (draft000), Jul. 2010, 153b pgs.

Bjontegaard et al., "Context-Adaptive VLC (CVLC) Coding of Coefficients (JVT-C028)", Joint Video Team (JVT) of ISO/IEC MPEG & ITU-T VCEG (ISO/IEC JTC1/SC29/WG11 and ITU-T SG16 Q6), May 6, 2002, 8 pp.

(56) References Cited

OTHER PUBLICATIONS

Bross et al., "High efficiency video coding (HEVC) text specification draft 6," 8th Meeting: San Jose, CA, USA, Feb. 1-10, 2012, JCTVC-H1003, 259 pp.
Bross et al., "High efficiency video coding (HEVC) text specification draft 7," 9th Meeting: Geneva, CH, Apr. 27-May 7, 2012, JCTVC-I1003_d2, 290 pp.
Bross et al., "High efficiency video coding (HEVC) text specification draft 8," 10th Meeting: Stockholm, SE, Jul. 11-20, 2012, JCTVC-J1003_d7, 261 pp.
Bross et al., "WD4: Working Draft 4 of High-Efficiency Video Coding," 6th Meeting: JCTVC-F803_d2, Torino, IT, Jul. 14-22, 2011, 226 pp.
Bross et al., "WD5: Working Draft 5 of High-Efficiency Video Coding," 7th Meeting: Geneva, Switzerland, Nov. 21-30, 2011, JCTVC-G1103_d2, 214 pp.
Budagavi et al., "TE8: TI Parallel context processing (PCP) proposal," JCTVC-C062, Oct. 7-15, 2010, 7 pp.
Budagavi et al.,"Parallel context processing techniques for high coding efficiency entropy coding in HEVC", JCT-VC Meeting; Jul. 21, 2010-Jul. 28, 2010; Geneva; (Joint collaborativteam on Video Coding of ISO/IEC JTCI/SC29/WGII and ITU-T SG.16); URL:http://wftp3.itu.int/av-arch/JCTVC-sit e/ 3 No. JCTVC-B088, XP030007668, ISSN: 0000-0046, 11 pp.
Choi et al., "Adaptive Coefficient Scanning Based on the Intra Prediction Mode", ETRI Journal, vol. 29, No. 5, Oct. 1, 2007, pp. 694-696, XP55018056.
Davies et al., "Suggestion for a Test Model", 1. JCT-VC Meeting, Apr. 15, 2010-Apr. 23, 2010, Dresden, (Jointcollaborative Team on Video Coding of ISO/IEC JTCI/SC29/WGII and ITU-TSG.16), pp. 30, XP030007526.
Davies, "BBC's Response to the Call for Proposals on Video Compression Technology", Joint Collaborative Team on Video Coding (JCT-VC) of ITU-T SG16 WP3 and ISO/IEC JTC1/SC29/WG11, Document: JCTVC-A125, Apr. 2010, 30 pp.
International Search Report and Written Opinion—PCT/US2011/062715—ISA/EPO—Feb. 13, 2012, 16 pp.
International Telecommunication Union, "ITU-T H.264, Series H: Audiovisual and Multimedia Systems, Infrastructure of audiovisual services—Coding of moving video, Advanced video coding for generic audiovisual services," Mar. 2010, 669 pp.
ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.
Sole et al., "CE11: Unified scans for the significance map and coefficient level coding in high efficiency", JCTVC-F288, Joint Collaborative Team on Video Coding (JCT-VC) of ITU-T SG16 WP3 and ISO/IEC JTC1/SC29/WG11, 6th Meeting: Torino (Italy), Jul. 2011, 9 pp.
Jie, et al., "A most probable scan mode decision for H.264/AVC inter picture coding", IEEE International Conference on Computer Science and Information Technology, Aug. 8, 2009, pp. 401-405, XP031527376.
Joshi, et al., "CE7: Mode dependent intra residual coding", MPEG Meeting; Mar. 21, 2011-Mar. 25, 2011; Geneva; (Motion Picture Expert Group or ISO/IEC JTC1/SC29/WG11), No. m19613, XP030048180, 9 pp.
Kim et al., "Efficient entropy coding scheme for H.264/AVC lossless video coding," Elsevier, Image Communication, Apr. 24, 2010, 10 pp.
Lee et al., "An Efficient Encoding of DCT Blocks With Block-Adaptive Scanning", IEICE Transactions on Communications, Dec. 1, 1994, vol. E77-B, No. 12, Communications Society, Tokyo, JP, pp. 1489-1494, XP000498064, ISSN: 0916-8516.
Marpe, et al., "Unified PIPE-Based Entropy Coding for HEVC", JCT-VC Meeting; MPEG Meeting; Jul. 14, 2011-Jul. 22, 2011; Torino; (Joint Collaborative Team on Video Coding of ISO/IEC JTC1/SC29/WG11 and ITU-T SG.16); URL:http://wftp3.itu.int/av-arch/JCTVC-site/,No. JCTVC-F268, XP030009291, 16 pp.

McCann, et al., "Samsung's Response to the Call for Proposals on Video Compression Technology," Joint Collaborative Team on Video Coding (JCT-VC) of ITU-T SG-16 WP3 and ISO/IEC JTC1/SC29/WG11, 1st meeting, Document: JCTVC-A124, Dresden, DE, Apr. 15-23, 2010, 42 pp.
Schaar-Mitrea et al: "Novel embedded compression algorithm for memory reduction in MPEG codecs" Proceedings of the SPIE—The International Society for Optical Engineering, SPIE, US, vol. 3653, Dec. 28, 1998, pp. 864-873, XP007902593.
Min et al., "Adaptive significance map coding for large transform", JCT-VC Meeting, Jul. 14, 2011-Jul. 22, 2011, Torino, (Joint Collaborative Team on Video Coding of ISO/IEC JTC1/SC29/WG11 and ITU-T SG.16 ), URL: http://wftp3.itu.int/av-arch/JCTVC-site/, No. JCTVC-F598, XP030009621, 3 pp.
Misra, et al., "A memory efficient method for fast transposing run-length encoded images", This paper appears in: Proceedings of the Fifth International Conference on Document Analysis and Recognition, ICDAR '99, Sep. 20-22, 1999, 4 pp.
Nguyen, et al., "Context Set Selection for Coefficient Level Coding", JCT-VC Meeting; MPEG Meeting; Feb. 1, 2012-Feb. 10, 2012; San Jose; (Joint Collaborative Team on Video Coding of ISO/I EC JTCI/SC29/WGII and ITU-T SG. 16 ) ; URL:http://wftp3.itu.int/av-arch/JCTVC-site//, No. JCTVC-H0404, XP030111431, 8 pp.
Nguyen, et al., "Improved Context Modeling for Coding Quantized Transform Coefficients in Video Compression", Dec. 8, 2010, Picture Coding Symposium 2010; Dec. 8, 2010-Dec. 10, 2010; Nagoya, XP030082008, 378-381 pp.
Nguyen., et al., "Reduced-complexity entropy coding of transform coefficient levels using a combination of VLC and PIPE", 95. MPEG Meeting; Jan. 24, 2011-Jan. 28, 2011; Daegu; (Motion Picture Expert Group or ISO/IEC JTC1/SC29/wG11), No. m19102, XP030047669, 9 pp.
Puri, et al.,"Improvements in DCT Based Video Coding", Proceedings of SPIE, vol. 3024, No. Part 01, Feb. 12, 1997, pp. 676-688, XP000199866, ISSN: 0277-786X, DOI: 10.1117/12.263279 p. 680.
Seregin et al., "Low-complexity adaptive coefficients scanning", Joint Collaborative Team on Video Coding (JCT-VC) of ITU-T SG16 WP3 and ISO/IEC JTC1/SC29/WG11, vol. JCTVC-C205v3, Oct. 7, 2010, XP55018069, 4 pp.
Shim, et al., "Adaptive Scanning Patterns for Intra Prediction", ITU—Telecommunications Standardization Sector Study Group 16 Question 6 Video Coding Experts Group (VCEG) 34th Meeting: Antalya, Turkey, vol. VCEG-AH14, Jan. 12, 2008, XP55018051, 8 pp.
Sole et al., "Unified scans for the significance map and coefficient level coding in high coding efficiency," Document JCTVC-E335, 5th Meeting: Geneva, CH, Mar. 16-23, 2011, 5 pp.
Sole, et al., "CE11: Parallel Context Processing for the significance map in high coding efficiency", MPEG Meeting; Mar. 21, 2011-Mar. 25, 2011; Geneva; (Motion Picture Expert Group or ISO/IEC JTC1/SC29/WG11),No. m19866, Mar. 17, 2011,XP030048433, 5 pp.
Sole, et al., "CE11: Removal of the parsing dependency of residual coding on intra mode", MPEG Meeting; Nov. 28, 2011-Dec. 2, 2011; Geneva; (Motion Picture Expert Group or ISO/IEC JTC1/SC29/WG11),No. m21883, XP030050446, 6 pp.
Sole, et al., "Parallel Context Processing for the significance map in high coding efficiency", JCT-VC Meeting; MPEG Meeting; Jan. 20, 2011-Jan. 28, 2011; Daegu; (Joint Collaborative Team on Video Coding of ISO/IEC JTC1/SC29/WG11 and ITU-T SG. 16); URL: http://wftp3.itu.int/av-arch/JCTVC-site/, No. JCTVC-D262, XP030008302, ISSN: 0000-0013, 4 pp.
Sole, et al., "Parallel Context Processing for the significance map in high coding efficiency ", MPEG Meeting; Jan. 24, 2011-Jan. 28, 2011; Daegu; (Motion Picture Expert Group or ISO/IEC JTC1/SC29/WG11) No. m19026 21, XP030047594, 4 pp.
Sole, et al.,"Parallel processing of residual data in HE", JCT-VC Meeting; MPEG Meeting; Jul. 14, 2011-Jul. 22, 2011; Torino; (Joint Collaborative Team on Video Coding of ISO/IEC JTCI/SC29/WGII and ITU-T SG. 16) ; URL:http://wftp3.itu.int/av-arch/JCTVC-site/, No. JCTVC-F552, 3 pp.
Sole, et al., "Removal of the parsing dependency of residual coding on intra mode", JCT-VC Meeting; MPEG Meeting;Jul. 14, 2011-Jul. 22, 2011; Torino; (Joint Collaborative Team on Video Coding of

(56) References Cited

OTHER PUBLICATIONS

ISO/IEC JTC1/SC29/WG11 and ITU-T SG.16 ); URL:http://wftp3.itu.int/av-arch/JCTVC-site/,No. JCTVC-F550, XP030009573.

Sole, et al.,"CE11: Scanning Passes of Residual Data in HE", JCT-VC Meeting; MPEG Meeting; Nov. 21, 2011-Nov. 30, 2011; Geneva; (Joint Collaborative Team on Video Coding of ISO/IEC JTCI/SC29/WG11 and ITU-T SG. 16) ; URL: http://wftp3.itu.int/av-arch/JCTVC-site/, No. JCTVC-G320, XP030110304, 3 pp.

Sole, et al."JCTVC-D262—Parallel Context Processing for the significance map in high coding efficiency",Powerpoint, Qualcomm, Inc., Jan. 20-28, 2011, 8 pp.

Sze, CE11: Coding efficiency of tools in HHI Transform—Coding (JCTVC-A116), 95. MPEG Meeting; Jan. 24, 2011-Jan. 28, 2011; Daegu; (Motion Picture Expert Group or ISO / IEC JTCI/SC29/WGII), No. m18949, XP030047518, 8 pp.

Sze, et al., "Parallel Context Processing of Coefficient Level", JCT-VC Meeting;. MPEG Meeting; Jul. 14, 2011-Jul. 22, 2011; Torino; (Joint Collaborative Team on Video Coding of ISO/IEC JTC1/SC29/WG11 and ITU-T SG.16 );URL: http://wftp3.itu.int/av-arch/JCTVC-site/, No. JCTVC-F130, XP030009153, 4 pp.

Wiegand et al., "WD1: Working Draft 1 of High-Efficiency Video Coding", JCTVC-C403, 3rd Meeting: Guangzhou, CN, Oct. 7-15, 2010, 137 pp.

Wiegand et al., "WD2: Working Draft 2 of High-Efficiency Video Coding," JCTVC-D503, 4th Meeting: Daegu, KR, Jan. 20-28, 2011, 153 pp.

Wiegand et al., "WD3: Working Draft 3 of High-Efficiency Video Coding," Document JCTVC-E603, 5th Meeting: Geneva, CH, Mar. 16-23, 2011, 193 pp.

Winken, et al., "Video coding technology proposal by Fraunhofer HHI", JCT-VC Meeting; Apr. 15, 2010-Apr. 23, 2010; Dresden; (Jointcollaborative Team on Video Coding of ISO/IEC JTC1/SC29/WG11 and ITU-TSG. 16) ; URL: http://wftp3.itu.int/av-arch/JCTVC-site/, No. XP030007556, XP030007557, 28 pp.

Ye, et al., "Improved intra coding", VCEG Meeting; MPEG Meeting; Oct. 20, 2007-Oct. 20, 2007; Shenzhen; (Video Coding Experts Group of ITU-T SG.16), No. VCEG-AG11, XP030003615, ISSN: 0000-0095, 19 pp.

Yu et al., "Probability Modeling for Encoding Quantized Transform Coefficients", 25. Picture Coding symposium, Apr. 24, 2006-Apr. 26, 2006, XP30080334.

Zhang, et al., "Non-CE1: On CABAC parsing throughput", JCT-VC Meeting; MPEG Meeting; Feb. 1, 2012-Feb. 10, 2012; San Jose; (Joint Collaborative Team on Video Coding of ISO/IEC JTC1/SC29/WG11 and ITU-T SG.16 ); URL: http://wftp3.itu.int/av-arch/JCTVC-site/, No. JCTVC-H0533, 7 pp.

International Preliminary Report on Patentability—PCT/US2011/062715—The International Bureau of WIPO—Geneva, Switzerland, Mar. 11, 2013, 38 pp.

Second Written Opinion from International Application No. PCT/US2011/062715, dated Nov. 27, 2012, 6 pp.

Response to Written Opinion dated Feb. 13, 2012, from International Application No. PCT/US2011/062715, filed on Sep. 27, 2012, 52 pp.

Response to Second Written Opinion dated Nov. 27, 2012, from International Application No. PCT/US2011/062715, filed on Jan. 25, 2013, 48 pp.

International Telecommunication Union, "ITU-T H.265, Series H: Audiovisual and Multimedia Systems, Infrastructure of audiovisual services—Coding of moving video, Advanced video coding for generic audiovisual services," Apr. 2013, 317 pp.

Office Action from counterpart Japanese Application No. 2013-542151, dated Aug. 5, 2014, 4 pp.

Marpe, et al., "Context-based adaptive binary arithmetic coding in the H.264/AVC video compression standard", IEEE Transactions on Circuits and Systems for Video Technology, Jul. 2003, vol. 13 (7), pp. 620-636.

Davies, "Unified scan processing for high efficiency coefficient coding", JCT-VC Meeting; MPEG Meeting; Jan. 20, 2011-Jan. 28, 2011; Daegu; (Joint Collaborative Team on Video Coding of ISO/IEC JTC1/SC29/WG11and ITU-T SG. 16 ) ; XP030008259, ISSN: 0000-0013. URL: http://wftp3.itu.int/av-arch/JCTVC-site/, No. JCTVC-D219, 7 pp.

Winken, et al., "Video Coding Technology Proposal by Fraunhofer HHI", Powerpoint, Fraunhofer Institute for Telecommunications, Heinrich Hertz Institute, Apr. 24, 2010, 28 slides.

Zhang, et al., "Context-Based Entropy Coding in Avs Video Coding Standard", Signal Processing. Image Communication, Apr. 1, 2009, pp. 263-276, vol. 24, No. 4, Elsevier Science Publishers, XP026091625, 14 pp.

Marpe et al., "Novel entropy coding concept," Document JCTVC-A032, 1st Meeting: Dresden, DE, Apr. 15-23, 2010, 17 pp.

Sasai H., et al., "Simplified Context Modeling for Transform Coefficient Coding", Joint Collaborative Team on Video Coding (JCT-VC) of ITU-T SG16 WP3 and ISO/IEC JTC1/SC29/WG11 JCTVC-D185, Jan. 2011.

Sze (TI) V: "Context selection complexity in HEVC CABAC", 4. JCT-VC Meeting; 95. MPEG Meeting; Jan. 20, 2011-Jan. 28, 2011; Daegu;(Joint Collaborative Team on Video Coding of ISO/IEC JTC1/SC29/WG11and ITU-T SG.16 ); URL: http://wftp3.itu.int/av-arch/JCTVC-site/ No. JCTVC-D244, Jan. 16, 2011, XP030008284, ISSN: 0000-0013.

Ye et al., "Improved H.264 Intra Coding Based on Bi-Directional Intra Prediction, Directional Transform, and Adaptive Coefficient Scanning," 2008.

Zheng et al., "Cell: Mode Dependent Coefficient Scanning", 4. JCT-VC Meeting; 95. MPEG Meeting; Jan. 20, 2011-Jan. 28, 2011; Daegu; (Joint Collaborative Team on Video Coding of ISO/IEC JTC1/SC29/WG11and ITU-T SG.16); No. JCTVC-D393, Jan. 16, 2011, XP030008432, ISSN: 0000-0013, URL: http://wftp3.itu.int/av-arch/JCTVC-site.

Office Action from related U.S. Appl. No. 13/303,015 mailed on Dec. 11, 2014 (11 pages).

Amendment in response to Office Action from related U.S. Appl. No. 13/303,015, filed Jan. 7, 2015 (15 pages).

Office Action from corresponding European Application Serial No. 11802210.2 dated Feb. 13, 2015 (4 pages).

Office Action from corresponding Canadian Application Serial No. 2,818,436 dated Feb. 24, 2015 (6 pages).

\* cited by examiner

|   |   | 406 |   |
|---|---|---|---|
| 6 | 2 | 1 | 0 |
| 3 | 3 | 0 | 0 |
| 1 | 0 | 0 | 0 |
| 0 | 0 | 0 | 0 |

FIG. 4A

|   |   | 408 |   |
|---|---|---|---|
| 1 | 1 | 1 | 0 |
| 1 | 1 | 0 | 0 |
| 1 | 0 | 0 | 0 |
| 0 | 0 | 0 | 0 |

FIG. 4B

|   |   | 410 |   |
|---|---|---|---|
| 0 | 0 | 1 | 0 |
| 0 | 0 | 0 | 0 |
| 0 | 0 | 0 | 0 |
| 0 | 0 | 0 | 0 |

FIG. 4C

CODING THE POSITION OF A LAST SIGNIFICANT COEFFICIENT WITHIN A VIDEO BLOCK BASED ON A SCANNING ORDER FOR THE BLOCK IN VIDEO CODING

This application is a continuation of U.S. application Ser. No. 13/303,015, filed Nov. 22, 2011, which claims the benefit of each of U.S. Provisional Application No. 61/419,740, filed Dec. 3, 2010, U.S. Provisional Application No. 61/426,426, filed Dec. 22, 2010, U.S. Provisional Application No. 61/426,360, filed Dec. 22, 2010, and U.S. Provisional Application No. 61/426,372, filed Dec. 22, 2010. The entire content of each of the above referenced applications is hereby incorporated by reference.

TECHNICAL FIELD

This disclosure relates to video coding, and more particularly, to the coding of syntax information related to coefficients of a video block.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard presently under development, and extensions of such standards. The video devices may transmit, receive, encode, decode, and/or store digital video information more efficiently by implementing such video compression techniques.

Video compression techniques perform spatial (intra-picture) prediction and/or temporal (inter-picture) prediction to reduce or remove redundancy inherent in video sequences. For block-based video coding, a video slice (i.e., a video frame or a portion of a video frame) may be partitioned into video blocks, which may also be referred to as treeblocks, coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to as reference frames.

Spatial or temporal prediction results in a predictive block for a block to be coded. Residual data represents pixel differences between the original block to be coded and the predictive block. An inter-coded block is encoded according to a motion vector that points to a block of reference samples forming the predictive block, and the residual data indicating the difference between the coded block and the predictive block. An intra-coded block is encoded according to an intra-coding mode and the residual data. For further compression, the residual data may be transformed from the pixel domain to a transform domain, resulting in residual transform coefficients, which then may be quantized. The quantized transform coefficients, initially arranged in a two-dimensional array, may be scanned in order to produce a one-dimensional vector of transform coefficients, and entropy coding may be applied to achieve even more compression.

SUMMARY

This disclosure describes techniques for coding coefficients associated with a block of video data during a video coding process, including techniques for coding information that identifies a position of a last non-zero, or a last "significant" coefficient within the block according to a scanning order associated with the block, i.e., last significant coefficient position information for the block. The techniques of this disclosure may improve efficiency for coding of last significant coefficient position information for blocks of video data used to code the blocks by coding last significant coefficient position information for a particular block based on information that identifies the scanning order associated with the block, i.e., scanning order information for the block. In other words, the techniques may improve compression of the last significant coefficient position information for the blocks when the information is coded. The techniques of this disclosure may also allow coding systems to have less complexity relative to other systems, when coding the last significant coefficient position information for the blocks, by coding last significant coefficient position information for a particular block using common statistics when one of a plurality of scanning orders is used to code the block.

In one example, the coding efficiency may be improved, and the coding system complexity may be reduced, by coding x- and y-coordinates that indicate a position of a last significant coefficient within a particular block of video data according to a scanning order associated with the block when the scanning order comprises a first scanning order, and coding "swapped," or interchanged x- and y-coordinates that indicate the position of the last significant coefficient within the block according to the scanning order when the scanning order comprises a second scanning order.

In this example, the first and the second scanning orders may be symmetrical with respect to one another (or at least partially symmetrical). Because of the symmetry among the first and second scanning orders, the probability of the x-coordinate comprising a given value when the scanning order comprises the first scanning order may be the same as, or similar to the probability of the y-coordinate comprising the same value when the scanning order comprises the second scanning order, and vice versa. Similarly, the probability of the y-coordinate comprising a given value when the scanning order comprises the first scanning order may be the same as, or similar to the probability of the x-coordinate comprising the same value when the scanning order comprises the second scanning order, and vice versa. In other words, the x- and y-coordinates when the scanning order comprises the first scanning order may each have the same or similar probability of comprising a given value as the interchanged x- and y-coordinates, respectively, when the scanning order comprises the second scanning order. As such, the x- and y-coordinates and the interchanged x- and y-coordinates may be coded using common statistics for purposes of context adaptive entropy coding, which may result in using coding systems that have less complexity relative to other systems. Furthermore, the common statistics may be updated based on the x- and y-coordinates and the interchanged x- and y-coordinates, which may result in the statistics being more accurate than similar statistics updated using other techniques, and, thus, in coding the respective coordinates more efficiently.

In another example, the coding efficiency may be improved by coding last significant coefficient position information for a block of video data in an incremental manner, to the extent necessary, which may result in coding the information more efficiently. Furthermore, in cases where it is necessary to code the information in its entirety, the coding efficiency may be improved by coding the information using context adaptive entropy coding, such that statistics used to code the information are selected based at least in part on a scanning order associated with the block. Coding the information in this manner may result in using more accurate statistics than when using other methods, and, once again, in coding the last significant coefficient position information for the block more efficiently.

The techniques of this disclosure may be used with any context adaptive entropy coding methodology, including CABAC, probability interval partitioning entropy coding (PIPE), or another context adaptive entropy coding methodology. CABAC is described in this disclosure for purposes of illustration, but without limitation as to the techniques broadly described in this disclosure. Also, the techniques may be applied to coding of other types of data generally, e.g., in addition to video data.

Accordingly, the techniques of this disclosure may enable using more efficient coding methods relative to other methods, and using coding systems that have less complexity relative to other systems, when coding last significant coefficient position information for one or more blocks of video data. In this manner, there may be a relative bit savings for a coded bitstream including the information, and a relative reduction in complexity for a system used to code the information, when using the techniques of this disclosure.

In one example, a method of coding coefficients associated with a block of video data during a video coding process includes coding x- and y-coordinates that indicate a position of a last non-zero coefficient within the block according to a scanning order associated with the block when the scanning order comprises a first scanning order, and coding interchanged x- and y-coordinates that indicate the position of the last non-zero coefficient within the block according to the scanning order when the scanning order comprises a second scanning order, wherein the second scanning order is different than the first scanning order.

In another example, an apparatus for coding coefficients associated with a block of video data during a video coding process includes a video coder configured to code x- and y-coordinates that indicate a position of a last non-zero coefficient within the block according to a scanning order associated with the block when the scanning order comprises a first scanning order, and code interchanged x- and y-coordinates that indicate the position of the last non-zero coefficient within the block according to the scanning order when the scanning order comprises a second scanning order, wherein the second scanning order is different than the first scanning order.

In another example, a device for coding coefficients associated with a block of video data during a video coding process includes means for coding x- and y-coordinates that indicate a position of a last non-zero coefficient within the block according to a scanning order associated with the block when the scanning order comprises a first scanning order, and means for coding interchanged x- and y-coordinates that indicate the position of the last non-zero coefficient within the block according to the scanning order when the scanning order comprises a second scanning order, wherein the second scanning order is different than the first scanning order.

The techniques described in this disclosure may be implemented in hardware, software, firmware, or combinations thereof. If implemented in hardware, an apparatus may be realized as an integrated circuit, a processor, discrete logic, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a tangible computer-readable medium and loaded and executed in the processor.

Accordingly, this disclosure also contemplates a computer-readable medium comprising instructions that, when executed, cause a processor to code coefficients associated with a block of video data during a video coding process, wherein the instructions cause the processor to code x- and y-coordinates that indicate a position of a last non-zero coefficient within the block according to a scanning order associated with the block when the scanning order comprises a first scanning order, and code interchanged x- and y-coordinates that indicate the position of the last non-zero coefficient within the block according to the scanning order when the scanning order comprises a second scanning order, wherein the second scanning order is different than the first scanning order.

The details of one or more examples are set forth in the accompanying drawings and the description below. Other features, objects, and advantages will be apparent from the description and drawings, and from the claims.

BRIEF DESCRIPTION OF DRAWINGS

FIGS. 4A-4C are conceptual diagrams that illustrate an example of a block of video data and corresponding significant coefficient position information and last significant coefficient position information.

DETAILED DESCRIPTION

Figure 1:
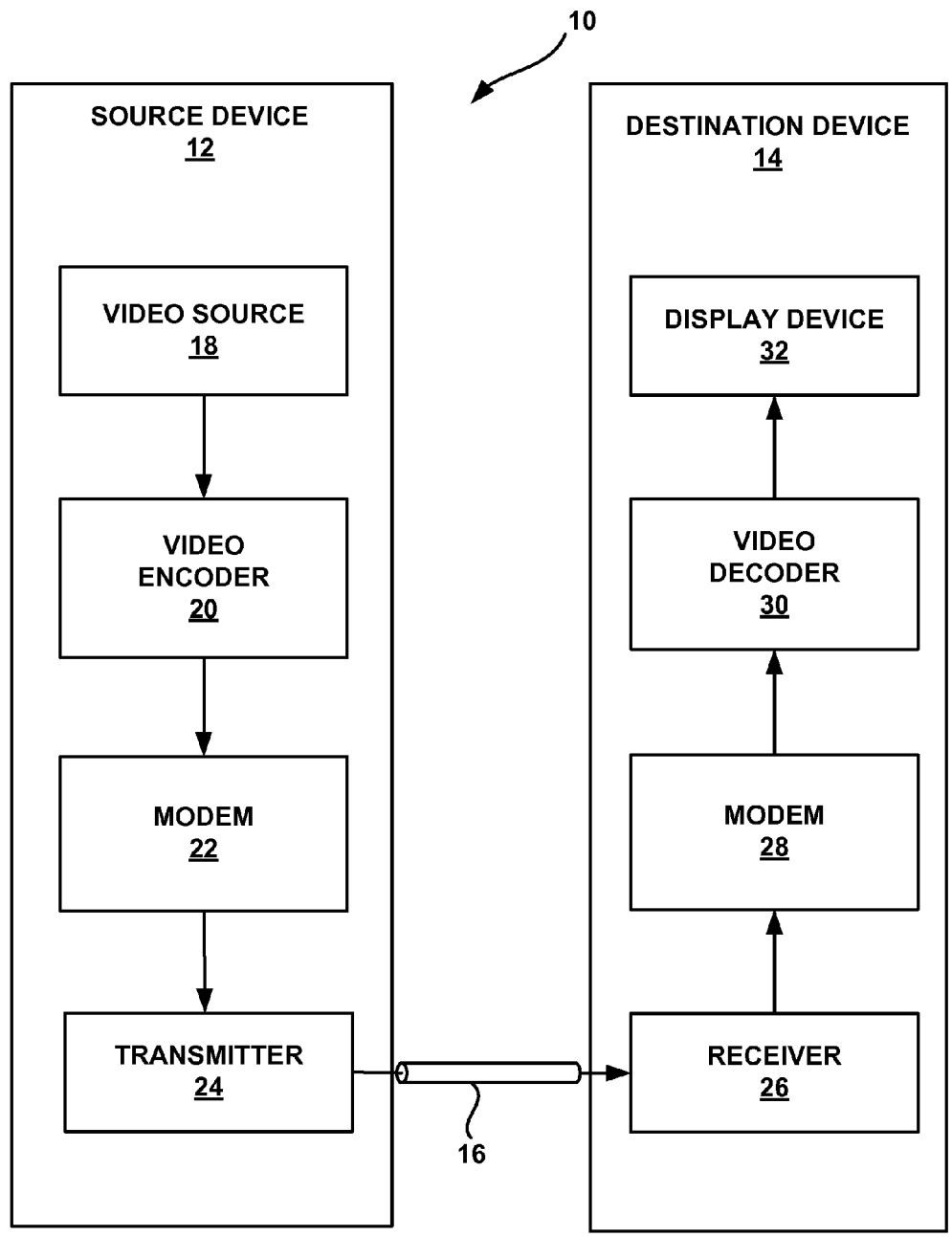
FIG. 1 is a block diagram that illustrates an example of a video encoding and decoding system that may implement techniques for efficiently coding last significant coefficient position information based on scanning order information for a block of video data, consistent with the techniques of this disclosure.

This disclosure describes techniques for coding coefficients associated with a block of video data during a video coding process, including techniques for coding information that identifies a position of a last non-zero, or a last "significant" coefficient within the block according to a scanning order associated with the block, i.e., last significant coefficient position information for the block. The techniques of this disclosure may improve efficiency for coding of last significant coefficient position information for blocks of video data used to code the blocks by coding last significant coefficient position information for a particular block based on information that identifies the scanning order associated with the block, i.e., scanning order information for the block. In other words, the techniques may improve compression of the last significant coefficient position information for the blocks when the information is coded. The techniques of this disclosure may also enable using coding systems that have less complexity relative to other systems when coding the last significant coefficient position information for the blocks, by coding last significant coefficient position information for a particular block using common statistics when one of a plurality of scanning orders is used to code the block.

In this disclosure, the term "coding" refers to encoding that occurs at the encoder or decoding that occurs at the decoder. Similarly, the term "coder" refers to an encoder, a decoder, or a combined encoder/decoder ("CODEC"). The terms coder, encoder, decoder and CODEC all refer to specific machines designed for the coding (encoding and/or decoding) of video data consistent with this disclosure.

In general, empirical testing performed in development of these techniques has demonstrated a correlation between last significant coefficient position information and scanning order information for a block of video data. For example, a position of a last significant coefficient within a block of video data according to a scanning order associated with the block, i.e., the scanning order used to code the block, may depend on the scanning order. In other words, statistics that indicate a probability of a given position within the block corresponding to the position of the last significant coefficient within the block according to the scanning order may vary depending on which scanning order is used to code the block.

Accordingly, coding the last significant coefficient position information for the block using context adaptive entropy coding, such that statistics used to code the information are selected based at least in part on the scanning order information for the block, may yield more accurate statistics, and thus may result in more efficient coding of the last significant coefficient position information.

Additionally, in accordance with the techniques of this disclosure, last significant coefficient position information for a block of video data may be coded using x- and y-coordinates that indicate the position of the last significant coefficient within the block according to the scanning order associated with the block. In these cases, the above-described statistics may indicate a probability of a coordinate, e.g., an x- or a y-coordinate, corresponding to the position of the last significant coefficient within the block according to the scanning order comprising a given value (e.g., "0," "1," "2," etc.). Because some scanning orders, e.g., a first scanning order and a second scanning order, may be symmetrical with respect to one another (or at least partially symmetrical), the probability of an x-coordinate comprising a given value when the scanning order comprises the first scanning order may be the same as, or similar to the probability of a y-coordinate comprising the same value when the scanning order comprises the second scanning order, and vice versa. Similarly, the probability of a y-coordinate comprising a given value when the scanning order comprises the first scanning order may be the same as, or similar to the probability of an x-coordinate comprising the same value when the scanning order comprises the second scanning order, and vice versa. That is, the x- and y-coordinates when the scanning order comprises the first scanning order may each have the same or similar probability of comprising a given value as "swapped," or interchanged x- and y-coordinates, respectively, when the scanning order comprises the second scanning order. As such, the x- and y-coordinates and the interchanged x- and y-coordinates may be coded using common statistics.

Accordingly, coding the x- and y-coordinates when the scanning order comprises the first scanning order, and coding the interchanged x- and y-coordinates when the scanning order comprises the second scanning order using the common statistics may result in reduced coding system complexity. Furthermore, updating the common statistics based on the x- and y-coordinates and the interchanged x- and y-coordinates may also yield more accurate statistics, which may, once again, result in more efficient coding of the last significant coefficient position information.

As one example, the techniques of this disclosure may improve coding efficiency and reduce coding system complexity by coding x- and y-coordinates that indicate a position of a last significant coefficient within a particular block of video data according to a scanning order associated with the block when the scanning order comprises a first scanning order, and coding interchanged x- and y-coordinates that indicate the position of the last significant coefficient within the block according to the scanning order when the scanning order comprises a second scanning order.

In this example, the x- and y-coordinates and the interchanged x- and y-coordinates may be coded using common statistics for purposes of context adaptive entropy coding, which may result in using coding systems that have less complexity relative to other systems, e.g., systems that include separate statistics for each scanning order that may be used within the systems to code blocks of video data. Furthermore, the common statistics may be updated based on the x- and y-coordinates and the interchanged x- and y-coordinates, which may result in the statistics being more accurate than similar statistics updated using other techniques, e.g., statistics updated for a particular scanning order that may be used within a system to code blocks of video data. As a result, the x- and y-coordinates and the interchanged x- and y-coordinates, i.e., the last significant coefficient position information for the block, may be coded more efficiently that similar information coded using other methods.

As another example, the techniques of this disclosure may improve coding efficiency by coding last significant coefficient position information for a block of video data in an incremental manner, to the extent necessary. As a result, the last significant coefficient position information may be coded using less information than when using other techniques, e.g., always coding the last significant coefficient position information for the block in its entirety. Furthermore, in cases where it is necessary to code the last significant coefficient position information in its entirety, the coding efficiency may be improved by coding the information using context adaptive entropy coding, such that statistics used to code the information are selected based at least in part on scanning order information for the block. Coding the last significant coefficient position information in this manner may result in using more accurate statistics than when using other methods, e.g., selecting the statistics without considering the scanning order information for the block, and, once again, in coding the last significant coefficient position information more efficiently.

In the examples described above, to code last significant coefficient position information for a block of video data using statistics, the information may be coded by performing a context adaptive binary arithmetic coding (CABAC) process that includes applying a context model that includes the statistics based on one or more contexts. In other examples, other context adaptive entropy coding processes, such as context adaptive variable length coding (CAVLC), probability interval partitioning entropy coding (PIPE), and other context adaptive entropy coding processes, may also use the techniques of this disclosure. CABAC is described in this disclosure for purposes of illustration, but without limitation as to the techniques broadly described in this disclosure. Also, the techniques may be applied to coding of other types of data generally, e.g., in addition to video data.

Coding last significant coefficient position information for one or more blocks of video data in the manner described above may enable using more efficient coding methods relative to other methods, and using coding systems that have less complexity relative to other systems. In this manner, there may be a relative bit savings for a coded bitstream including the information, and a relative reduction in complexity for a system used to code the information, when using the techniques of this disclosure.

FIG. 1 is a block diagram that illustrates an example of a video encoding and decoding system 10 that may implement techniques for efficiently coding last significant coefficient position information based on scanning order information for a block of video data, consistent with the techniques of this disclosure. As shown in FIG. 1, system 10 includes a source device 12 that transmits encoded video to a destination device 14 via a communication channel 16. Source device 12 and destination device 14 may comprise any of a wide range of devices. In some cases, source device 12 and destination device 14 may comprise wireless communication devices, such as wireless handsets, so-called cellular or satellite radio-telephones, or any wireless devices that can communicate video information over a communication channel 16, in which case communication channel 16 is wireless.

The techniques of this disclosure, however, which concern efficiently coding last significant coefficient position information based on scanning order information for a block of video data, are not necessarily limited to wireless applications or settings. These techniques may generally apply to any scenario where encoding or decoding is performed, including over-the-air television broadcasts, cable television transmissions, satellite television transmissions, streaming Internet video transmissions, encoded digital video that is encoded onto a storage medium or retrieved and decoded from a storage medium, or other scenarios. Accordingly, communication channel 16 is not required and the techniques of this disclosure may apply to settings where encoding is applied or where decoding is applied, e.g., without any data communication between encoding and decoding devices.

In the example of FIG. 1, source device 12 includes a video source 18, video encoder 20, a modulator/demodulator (modem) 22 and a transmitter 24. Destination device 14 includes a receiver 26, a modem 28, a video decoder 30, and a display device 32. In accordance with this disclosure, video encoder 20 of source device 12 and/or video decoder 30 of destination device 14 may be configured to apply the techniques for efficiently coding last significant coefficient position information based on scanning order information for a block of video data. In other examples, a source device and a destination device may include other components or arrangements. For example, source device 12 may receive video data from an external video source 18, such as an external camera. Likewise, destination device 14 may interface with an external display device, rather than including an integrated display device.

The illustrated system 10 of FIG. 1 is merely one example. Techniques for efficiently coding last significant coefficient position information based on scanning order information for a block of video data may be performed by any digital video encoding and/or decoding device. Although generally the techniques of this disclosure are performed by a video encoding device, the techniques may also be performed by a video encoder/decoder, typically referred to as a "CODEC." Moreover, the techniques of this disclosure may also be performed by a video preprocessor. Source device 12 and destination device 14 are merely examples of such coding devices in which source device 12 generates coded video data for transmission to destination device 14. In some examples, devices 12, 14 may operate in a substantially symmetrical manner such that each of devices 12, 14 includes video encoding and decoding components. Hence, system 10 may support one-way or two-way video transmission between video devices 12, 14, e.g., for video streaming, video playback, video broadcasting, or video telephony.

Video source 18 of source device 12 may include a video capture device, such as a video camera, a video archive containing previously captured video, and/or a video feed from a video content provider. As a further alternative, video source 18 may generate computer graphics-based data as the source video, or a combination of live video, archived video, and computer-generated video. In some cases, if video source 18 is a video camera, source device 12 and destination device 14 may form so-called camera phones or video phones. As mentioned above, however, the techniques described in this disclosure may be applicable to video coding in general, and may be applied to wireless and/or wired applications. In each case, the captured, pre-captured, or computer-generated video may be encoded by video encoder 20. The encoded video information may then be modulated by modem 22 according to a communication standard, and transmitted to destination device 14 via transmitter 24. Modem 22 may include various mixers, filters, amplifiers or other components designed for signal modulation. Transmitter 24 may include circuits designed for transmitting data, including amplifiers, filters, and one or more antennas.

Receiver 26 of destination device 14 receives information over channel 16, and modem 28 demodulates the information. Again, the video encoding process described above may implement one or more of the techniques described herein to efficiently code last significant coefficient position information based on scanning order information for a block of video data. The information communicated over channel 16 may include syntax information defined by video encoder 20, which is also used by video decoder 30, that includes syntax elements that describe characteristics and/or processing of blocks of video data (e.g., macroblocks, or coding units), e.g., last significant coefficient position information and/or scanning order information for the blocks, and other information. Display device 32 displays the decoded video data to a user, and may comprise any of a variety of display devices such as a cathode ray tube (CRT), a liquid crystal display (LCD), a plasma display, an organic light emitting diode (OLED) display, or another type of display device.

In the example of FIG. 1, communication channel 16 may comprise any wireless or wired communication medium, such as a radio frequency (RF) spectrum or one or more physical transmission lines, or any combination of wireless and wired media. Communication channel 16 may form part of a packet-based network, such as a local area network, a wide-area network, or a global network such as the Internet. Communication channel 16 generally represents any suitable communication medium, or collection of different communication media, for transmitting video data from source device 12 to destination device 14, including any suitable combination of wired or wireless media. Communication channel 16 may include routers, switches, base stations, or any other equipment that may be useful to facilitate communication from source device 12 to destination device 14. In other examples, encoding or decoding devices may implement techniques of this disclosure without any communication between such devices. For example, an encoding device may encode and store an encoded bitstream consistent with the techniques of this disclosure. Alternatively, a decoding device may receive or retrieve an encoded bitstream, and decode the bitstream consistent with the techniques of this disclosure.

Video encoder 20 and video decoder 30 may operate according to a video compression standard, such as the ITU-T H.264 standard, alternatively referred to as MPEG-4, Part 10, Advanced Video Coding (AVC). The techniques of this disclosure, however, are not limited to any particular coding standard. Other examples include MPEG-2, ITU-T H.263, and the High Efficiency Video Coding (HEVC) standard presently under development. In general, the techniques of this disclosure are described with respect to HEVC, but it should be understood that these techniques may be used in conjunction with other video coding standards as well. Although not shown in FIG. 1, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, MUX-DEMUX units may conform to the ITU H.223 multiplexer protocol, or other protocols such as the user datagram protocol (UDP).

Video encoder 20 and video decoder 30 each may be implemented as any of a variety of suitable encoder and decoder circuitry, such as one or more microprocessors, digital signal processors (DSPs), application specific integrated circuits (ASICs), field programmable gate arrays (FPGAs), discrete logic, software, hardware, firmware or any combinations thereof. Each of video encoder 20 and video decoder 30 may be included in one or more encoders or decoders, either of which may be integrated as part of a combined encoder/decoder (CODEC) in a respective camera, computer, mobile device, subscriber device, broadcast device, set-top box, server, or the like.

A video sequence typically includes a series of video frames. A group of pictures (GOP) generally comprises a series of one or more video frames. A GOP may include syntax data in a header of the GOP, a header of one or more frames of the GOP, or elsewhere, that describes a number of frames included in the GOP. Each frame may include frame syntax data that describes an encoding mode for the respective frame. A video encoder, e.g., video encoder 20, typically operates on video blocks within individual video frames in order to encode the video data. According to the ITU-T H.264 standard, a video block may correspond to a macroblock or a partition of a macroblock. According to other standards, e.g., HEVC described in greater detail below, a video block may correspond to a coding unit (e.g., a largest coding unit), or a partition of a coding unit. The video blocks may have fixed or varying sizes, and may differ in size according to a specified coding standard. Each video frame may include a plurality of slices, i.e., portions of the video frame. Each slice may include a plurality of video blocks, which may be arranged into partitions, also referred to as sub-blocks.

Depending on the specified coding standard, video blocks may be partitioned into various "N×N" sub-block sizes, such as 16×16, 8×8, 4×4, 2×2, and so forth. In this disclosure, "N×N" and "N by N" may be used interchangeably to refer to the pixel dimensions of the block in terms of vertical and horizontal dimensions, e.g., 16×16 pixels or 16 by 16 pixels. In general, a 16×16 block will have sixteen pixels in a vertical direction (y=16) and sixteen pixels in a horizontal direction (x=16). Likewise, an N×N block generally has N pixels in a vertical direction and N pixels in a horizontal direction, where N represents a nonnegative integer value. The pixels in a block may be arranged in rows and columns. Moreover, blocks need not necessarily have the same number of pixels in the horizontal direction as in the vertical direction. For example, blocks may comprise N×M pixels, where M is not necessarily equal to N. As one example, in the ITU-T H.264 standard, blocks that are 16 by 16 pixels in size may be referred to as macroblocks, and blocks that are less than 16 by 16 pixels may be referred to as partitions of a 16 by 16 macroblock. In other standards, e.g., HEVC, blocks may be defined more generally with respect to their size, for example, as coding units and partitions thereof, each having a varying, rather than a fixed size.

Video blocks may comprise blocks of pixel data in the pixel domain, or blocks of transform coefficients in the transform domain, e.g., following application of a transform, such as a discrete cosine transform (DCT), an integer transform, a wavelet transform, or a conceptually similar transform to residual data for a given video block, wherein the residual data represents pixel differences between video data for the block and predictive data generated for the block. In some cases, video blocks may comprise blocks of quantized transform coefficients in the transform domain, wherein, following application of a transform to residual data for a given video block, the resulting transform coefficients are also quantized.

Block partitioning serves an important purpose in block-based video coding techniques. Using smaller blocks to code video data may result in better prediction of the data for locations of a video frame that include high levels of detail, and may therefore reduce the resulting error (i.e., deviation of the prediction data from source video data), represented as residual data. While potentially reducing the residual data, such techniques may, however, require additional syntax information to indicate how the smaller blocks are partitioned relative to a video frame, and may result in an increased coded video bitrate. Accordingly, in some techniques, block partitioning may depend on balancing the desirable reduction in residual data against the resulting increase in bitrate of the coded video data due to the additional syntax information.

In general, blocks and the various partitions thereof (i.e., sub-blocks) may be considered video blocks. In addition, a slice may be considered to be a plurality of video blocks (e.g., macroblocks, or coding units), and/or sub-blocks (partitions of macroblocks, or sub-coding units). Each slice may be an independently decodable unit of a video frame. Alternatively, frames themselves may be decodable units, or other portions of a frame may be defined as decodable units. Furthermore, a GOP, also referred to as a sequence, may be defined as a decodable unit.

Efforts are currently in progress to develop a new video coding standard, currently referred to as High Efficiency Video Coding (HEVC). The emerging HEVC standard may also be referred to as H.265. The standardization efforts are based on a model of a video coding device referred to as the HEVC Test Model (HM). The HM presumes several capabilities of video coding devices over devices according to, e.g., ITU-T H.264/AVC. For example, whereas H.264 provides nine intra-prediction encoding modes, HM provides as many as thirty-five intra-prediction encoding modes, e.g., based on the size of a block being intra-prediction coded.

HM refers to a block of video data as a coding unit (CU). A CU may refer to a rectangular image region that serves as a basic unit to which various coding tools are applied for compression. In H.264, it may also be called a macroblock. Syntax data within a bitstream may define a largest coding unit (LCU), which is a largest CU in terms of the number of pixels. In general, a CU has a similar purpose to a macroblock of H.264, except that a CU does not have a size distinction. Thus, a CU may be partitioned, or "split" into sub-CUs.

An LCU may be associated with a quadtree data structure that indicates how the LCU is partitioned. In general, a quadtree data structure includes one node per CU of an LCU, where a root node corresponds to the LCU, and other nodes correspond to sub-CUs of the LCU. If a given CU is split into four sub-CUs, the node in the quadtree corresponding to the split CU includes four child nodes, each of which corresponds to one of the sub-CUs. Each node of the quadtree data structure may provide syntax information for the corresponding CU. For example, a node in the quadtree may include a split flag for the CU, indicating whether the CU corresponding to the node is split into four sub-CUs. Syntax information for a given CU may be defined recursively, and may depend on whether the CU is split into sub-CUs.

A CU that is not split (i.e., a CU corresponding a terminal, or "leaf" node in a given quadtree) may include one or more prediction units (PUs). In general, a PU represents all or a portion of the corresponding CU, and includes data for retrieving a reference sample for the PU for purposes of performing prediction for the CU. For example, when the CU is intra-mode encoded, the PU may include data describing an intra-prediction mode for the PU. As another example, when the CU is inter-mode encoded, the PU may include data defining a motion vector for the PU. The data defining the motion vector may describe, for example, a horizontal component of the motion vector, a vertical component of the motion vector, a resolution for the motion vector (e.g., one-quarter pixel precision or one-eighth pixel precision), a reference frame to which the motion vector points, and/or a reference list (e.g., list 0 or list 1) for the motion vector. Data for the CU defining the one or more PUs of the CU may also describe, for example, partitioning of the CU into the one or more PUs. Partitioning modes may differ between whether the CU is uncoded, intra-prediction mode encoded, or inter-prediction mode encoded.

A CU having one or more PUs may also include one or more transform units (TUs). Following prediction for a CU using one or more PUs, as described above, a video encoder may calculate one or more residual blocks for the respective portions of the CU corresponding to the one of more PUs. The residual blocks may represent a pixel difference between the video data for the CU and the predicted data for the one or more PUs. A set of residual values may be transformed, scanned, and quantized to define a set of quantized transform coefficients. A TU may define a partition data structure that indicates partition information for the transform coefficients that is substantially similar to the quadtree data structure described above with reference to a CU. A TU is not necessarily limited to the size of a PU. Thus, TUs may be larger or smaller than corresponding PUs for the same CU. In some examples, the maximum size of a TU may correspond to the size of the corresponding CU. In one example, residual samples corresponding to a CU may be subdivided into smaller units using a quadtree structure known as "residual quad tree" (RQT). In this case, the leaf nodes of the RQT may be referred as the TUs, for which the corresponding residual samples may be transformed and quantized.

Following intra-predictive or inter-predictive encoding to produce predictive data and residual data, and following any transforms (such as the 4×4 or 8×8 integer transform used in H.264/AVC or a discrete cosine transform DCT) to produce transform coefficients, quantization of transform coefficients may be performed. Quantization generally refers to a process in which transform coefficients are quantized to possibly reduce the amount of data used to represent the coefficients. The quantization process may reduce the bit depth associated with some or all of the coefficients. For example, an n-bit value may be rounded down to an m-bit value during quantization, where n is greater than m.

Following quantization, entropy coding of the quantized data (i.e., quantized transform coefficients) may be performed. The entropy coding may conform to the techniques of this disclosure with respect to efficiently coding last significant coefficient position information based on scanning order information for a block of video data, and may also use other entropy coding techniques, such as context adaptive variable length coding (CAVLC), CABAC, PIPE, or another entropy coding methodology. For example, coefficient values, represented as magnitudes and corresponding signs (e.g., "+1," or "−1") for the quantized transform coefficients may be encoded using the entropy coding techniques.

It should be noted that the prediction, transform, and quantization described above may be performed for any block of video data, e.g., to a PU and/or TU of a CU, or to a macroblock, depending on the specified coding standard. Accordingly, the techniques of this disclosure, relating to efficiently coding last significant coefficient position information based on scanning order information for a block of video data, may apply to any block of video data, e.g., to any block of quantized transform coefficients, including a macroblock, or a TU of a CU. Furthermore, a block of video data (e.g., a macroblock, or a TU of a CU) may include each of a luminance component (Y), a first chrominance component (U), and a second chrominance component (V) of the corresponding video data. As such, the techniques of this disclosure may be performed for each of the Y, U, and V components of a given block of video data.

In order to encode blocks of video data as described above, information regarding position of significant coefficients within a given block may also be generated and encoded. Subsequently, the values of the significant coefficients may be encoded, as described above. In H.264/AVC and the emerging HEVC standard, when using a context adaptive entropy coding process, e.g., a CABAC process, the position of significant coefficients within a block of video data may be encoded prior to encoding the values of the significant coefficients. The process of encoding the position of all of the significant coefficients within the block may be referred to as significance map (SM) encoding. FIGS. 4A-4C, described in greater detail below, are conceptual diagrams that illustrate an example of a 4×4 block of quantized transform coefficients and corresponding SM data.

A typical SM encoding procedure may be described as follows. For a given block of video data, an SM may be encoded only if there is at least one significant coefficient within the block. Presence of significant coefficients within a given block of video data may be indicated in a coded block pattern (e.g., using syntax element "coded_block_pattern," or CBP), which is a binary value coded for a set of blocks (such as luminance and chrominance blocks) associated with an area of pixels in the video data. Each bit in the CBP is referred to as a coded block flag (e.g., corresponding to syntax element "coded_block_flag") and used to indicate whether there is at least one significant coefficient within its corresponding block. In other words, a coded block flag is a one-bit symbol indicating whether there are any significant coefficients inside a single block of transform coefficients, and a CBP is a set of coded block flags for a set of related video data blocks.

Figures 5A, 5B, 5C:
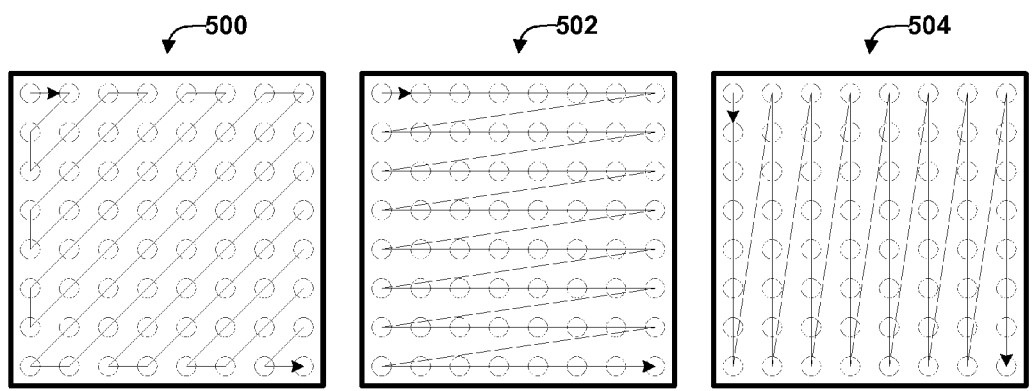
FIGS. 5A-5C are conceptual diagrams that illustrate examples of blocks of video data scanned using a zig-zag scanning order, a horizontal scanning order, and a vertical scanning order.

If a coded block flag indicates that no significant coefficients are present within the corresponding block (e.g., the flag equals "0"), no further information may be encoded for the block. However, if a coded block flag indicates that at least one significant coefficient exists within the corresponding block (e.g., the flag equals "1"), an SM may be encoded for the block by following a coefficient scanning order associated with the block. The scanning order may define the order in which the significance of each coefficient within the block is encoded as part of the SM encoding. In other words, scanning may serialize the two-dimensional block of coefficients to a one-dimensional representation to determine the significance of the coefficients. Different scanning orders (e.g., zigzag, horizontal, and vertical) may be used. FIGS. 5A-5C, also described in greater detail below, illustrate examples of some of the various scanning orders that may be used for 8×8 blocks of video data. The techniques of this disclose, however, may also apply with respect to a wide variety of other scanning orders, including a diagonal scanning order, scanning orders that are combinations of zigzag, horizontal, vertical, and/or diagonal scanning orders, as well as scanning orders that are partially zigzag, partially horizontal, partially vertical, and/or partially diagonal. In addition, the techniques of this disclosure may also consider a scanning order that is itself adaptive based on statistics associated with previously coded blocks of video data (e.g., blocks having the same block size or coding mode as the current block being coded). For example, an adaptive scanning order could be the scanning order associated with the block, in some cases.

Given a coded block flag that indicates that at least one significant coefficient exists within a given block, and a scanning order for the block, an SM for the block may be encoded as follows. The two-dimensional block of quantized transform coefficients may first be mapped into a one-dimensional array using the scanning order. For each coefficient in the array, following the scanning order, a one-bit significant coefficient flag (e.g., corresponding to syntax element "significant_coeff_flag") may be encoded. That is, each position in the array may be assigned a binary value, which may be set to "1" if the corresponding coefficient is significant, and set to "0" if it is non-significant (i.e., zero). If a given significant coefficient flag equals "1," indicating that the corresponding coefficient is significant, an additional one-bit last significant coefficient flag (e.g., corresponding to syntax element "last_significant_coeff_flag") may also be encoded, which may indicate whether the corresponding coefficient is the last significant coefficient within the array (i.e., within the block given the scanning order). Specifically, each last significant coefficient flag may be set to "1" if the corresponding coefficient is the last significant coefficient within the array, and set to "0" otherwise. If the last array position is reached in this manner, and the SM encoding process was not terminated by a last significant coefficient flag equal to "1," then the last coefficient in the array (and thereby the block given the scanning order) may be inferred to be significant, and no last significant coefficient flag may be encoded for the last array position.

FIGS. 4B-4C are conceptual diagrams that illustrate examples of sets of significant coefficient flags and last significant coefficient flags, respectively, corresponding to SM data for the block depicted in FIG. 4A, presented in map, rather than array form. It should be noted that significant coefficient flags and last significant coefficient flags, as described above, may be set to different values (e.g., a significant coefficient flag may be set to "0" if the corresponding coefficient is significant, and "1" if it is non-significant, and a last significant coefficient flag may be set to "0" if the corresponding coefficient is the last significant coefficient, and "1" if it is not the last significant coefficient) in other examples.

After the SM is encoded, as described above, the value of each significant coefficient (i.e., each significant coefficient's magnitude and sign, e.g., indicated by syntax elements "coeff_abs_level_minus1" and "coeff_sign_flag," respectively) in the block may also be encoded.

According to some techniques, a fixed scanning order may be used to code blocks of video data, as described above, e.g., the zig-zag scanning order. According to other techniques, multiple scanning orders may be used to code the blocks. In some examples, "adaptive coefficient scanning" (ACS) may be used, wherein the scanning order adapts over time, and the currently adapted scanning order is used to code a particular block of coefficients at any given time. In still other techniques, video encoder 20 may test several scanning orders based on one or more compression efficiency metrics and select the best scanning order to encode the blocks. Additionally, video encoder 20 may indicate the scanning order to video decoder 30 by encoding an ACS index, which may represent any one of the several scanning orders (e.g., using indices 0 for zig-zag, 1 for horizontal, and 2 for vertical scanning orders).

According to some techniques, video encoder 20 may encode the ACS index only when the last significant coefficient is not located in the first position in the scanning order (corresponding to the top-left position within the block commonly referred to as the "DC" position). Video encoder 20 may encode the ACS index in this manner because video decoder 30 does not need an indication of the scanning order used by video encoder 20 in the case the last (and only)

significant coefficient within the block is located in the DC position, since all possible scanning orders may start with the DC position, as shown in FIGS. 5 and 6, also described in greater detail below.

In the event the last significant coefficient within the block is not located in the DC position, video encoder 20 may encode the ACS index in the following manner. Video encoder 20 may encode a first signal (e.g., "bin1") that indicates whether the scanning order is the zig-zag scanning order (e.g., bin1="0") or not (e.g., bin1="1"). In the event the scanning order is not the zig-zag scanning order, video encoder 20 may encode a second signal (e.g., "bin2") that indicates whether the scanning order is the horizontal scanning order (e.g., bin2="0") or the vertical scanning order (e.g., bin2="1"). Similarly, video decoder 30 may receive and decode the first signal and the second signal to determine the ACS index. Accordingly, rather than always coding the ACS index, video encoder 20 and/or video decoder 30 may code the ACS index only when the last significant coefficient is not located in the DC position.

As previously described, according to the techniques of this disclosure, last significant coefficient position information for a particular block of video data may be coded using x- and y-coordinates that indicate a position of a last significant coefficient within the block according to a scanning order associated with the block. In some examples, the x-coordinate may correspond to a column number of the position within the block, and the y-coordinate may correspond to a row number of the position within the block. For example, the row and column numbers may be relative to row and column numbers corresponding to a reference, or "origin," position within the block, e.g., the DC position. As such, according to these techniques, last significant coefficient position information for a block of video data may not be coded using SM coding, as previously described, but rather by explicitly coding x- and y-coordinates of the position of the last significant coefficient within the block according to the scanning order associated with the block. According to such techniques, the x- and y-coordinates may be coded independently of the remaining SM data (i.e., significant coefficient flags, or significant coefficient position information) for the block. For example, the x- and y-coordinates may be coded prior to coding the significant coefficient position information for the block.

In some examples consistent with the techniques of this disclosure, to code the x- and y-coordinates, video encoder 20 and/or video decoder 30 may further determine statistics that indicate a probability of a given position within the block corresponding to the position of the last significant coefficient within the block according to the scanning order. In particular, the statistics may indicate a probability of a coordinate, e.g., an x- or a y-coordinate, corresponding to the position of the last significant coefficient within the block according to the scanning order comprising a given value (e.g., "0," "1," "2," etc.). In other words, the statistics may indicate a probability of each of the x- and y-coordinates previously described comprising a given value. Video encoder 20 and/or video decoder 30 may determine the statistics, and code the x- and y-coordinates based on the statistics, e.g., using context adaptive entropy coding. In some examples, video encoder 20 and/or video decoder 30 may determine the statistics using last significant coefficient position information for previously coded blocks of video data, e.g., values of x- and y-coordinates for the previously coded blocks. Video encoder 20 and/or video decoder 30 may update the statistics based on the x- and y-coordinates to reflect the probability of the respective coordinates comprising particular values. As previously described, the statistics may vary depending on which scanning order is used to code the block.

As one example consistent with the techniques of this disclosure, to code the x- and y-coordinates based on the statistics, video encoder 20 and/or video decoder 30 may perform a context adaptive entropy coding process (e.g., a CABAC process) that includes applying a context model that includes the statistics based on at least one context. For example, the at least one context may include one of the x- and y-coordinates and the scanning order. In this example, video encoder 20 and/or video decoder 30 may use the scanning order to select the particular context model that includes the statistics. That is, video encoder 20 and/or video decoder 30 may select unique statistics to code the x- and y-coordinates when using a particular scanning order to code the block.

Furthermore, in cases where one coordinate (e.g., y-coordinate) is coded after another coordinate (e.g., x-coordinate), video encoder 20 and/or video decoder 30 may code the coordinate using a value of the other, previously coded coordinate as a context. That is, a value of a previously coded one of the x- and y-coordinates may be used to further select statistics within the context model that indicate a probability of the other, presently coded coordinate comprising a given value. Video encoder 20 and/or video decoder 30 may then use the selected statistics to code the x- and y-coordinates by performing the context adaptive entropy coding process.

As another example consistent with the techniques of this disclosure, the x- and y-coordinates may each be represented using a unary codeword comprising a sequence of one or more bits, or "bins." In other words, the x- and y-coordinates may be "binarized." As such, to code the x- and y-coordinates based on the statistics, video encoder 20 and/or video decoder 30 may code each bin of a codeword corresponding to a particular coordinate by performing the context adaptive entropy coding process. In this example, the statistics included in the context model, indicating a probability of the coordinate comprising a given value, may include probability estimates that indicate a probability of each bin of the codeword corresponding to the coordinate comprising a given value (e.g., "0" or "1"). Furthermore, the statistics may include different probability estimates for each bin of the codeword, depending on the position of the respective bin within the codeword. In some examples, video encoder 20 and/or video decoder 30 may determine the probability estimates using values of corresponding bins for previously coded blocks of video data, e.g., bins of codewords corresponding to x- and y-coordinates for the previously coded blocks, e.g., as part of determining the statistics based on the last significant coefficient position information for the previously coded blocks, as previously described. In other examples, video encoder 20 and/or video decoder 30 also may update the probability estimates using the value of each bin, e.g., as part of updating the statistics based on the x- and y-coordinates, as also previously described. Video encoder 20 and/or video decoder 30 may use the probability estimates to code each bin by performing the context adaptive entropy coding process.

One drawback of the techniques described above is that, when coding last significant coefficient position information for a block of video data, video encoder 20 and/or video decoder 30 may use different statistics depending on the scanning order used by video encoder 20 and/or video decoder 30 to code the block. In other words, video encoder 20 and/or video decoder 30 may each determine and maintain (e.g., update) a plurality of sets of statistics in order to code last significant coefficient position information for blocks of video data when a plurality of scanning orders is used to code the blocks. In some cases, sets of statistics determined and maintained for scanning orders that are symmetrical with respect to one another may include the same, or similar information, as previously described. In these cases, determining and maintaining the sets of statistics may result in inefficient use of coding system resources and unnecessary coding system complexity.

Another drawback of the techniques described above is that, when video encoder 20 and/or video decoder 30 code last significant coefficient position information for blocks of video data using common statistics, irrespective of the scanning orders used to code the blocks, the statistics may not be as accurate as statistics that are individually determined and maintained (e.g., updated) for each scanning order. That is, the common statistics may indicate probabilities of positions within a given block of video data corresponding to a position of a last significant coefficient within the block according to a scanning order associated with the block less accurately than statistics individually determined and maintained for the particular scanning order used to code the block. In these cases, coding the last significant coefficient position information using the common statistics may result in reduced coding efficiency.

Yet another drawback of the techniques described above is that, in some cases, video encoder 20 and/or video decoder 30 may code a block of video data using one of a plurality of scanning orders that originate at a common position within the block, e.g., the DC position. In these cases, when a position of a last significant coefficient within the block according to a scanning order associated with the block corresponds to the common position, there are no other significant coefficients within the block beyond the coefficient located in the common position. Accordingly, video encoder 20 and/or video decoder 30 need not code the position of the last significant coefficient within the block. In other words, coding the last significant coefficient position information for the block in its entirety, e.g., represented using x- and y-coordinates as previously described, may not be necessary in this case, as this may once again result in reduced coding efficiency.

Additionally, in the above example, when the position of the last significant coefficient within the block does not correspond to the common position, and the last significant coefficient position information for the block must be coded in its entirety, the information may, in some cases, be coded using statistics that are not accurate, e.g., statistics which do not take advantage of the previously described correlation between the last significant coefficient position information and the scanning order information for the block, which may once again result in reduced coding efficiency.

Accordingly, this disclosure describes techniques that may enable coding last significant coefficient position information for a block of video data more efficiently relative to other techniques, and using coding systems having less complexity relative to other systems. As one example, the last significant coefficient position information may be coded using coding systems that have less complexity relative to other systems by coding the information using common statistics when one of a plurality of scanning orders is used to code the block, e.g., by coding x- and y-coordinates and interchanged x- and y-coordinates that indicate the information, depending on the scanning order used to code the block. According to this example, the last significant coefficient position information may also be coded more efficiently by updating the common statistics based on the x- and y-coordinates and interchanged x- and y-coordinates, which may result in the statistics being more accurate. As another example, the last significant coefficient position information may be coded more efficiently by coding the information in an incremental manner, to the extent necessary, and, when coding the information in its entirety, doing so based on the scanning order, e.g., using the scanning order as a context.

In some examples, video encoder 20 of source device 12 may be configured to encode certain blocks of video data (e.g., one or more macroblocks, or TUs of a CU), and video decoder 30 of destination device 14 may be configured to receive the encoded video data from video encoder 20, e.g., from modem 28 and receiver 26. In accordance with the techniques of this disclosure, as one example, video encoder 20 and/or video decoder 30 may be configured to code x- and y-coordinates that indicate a position of a last significant coefficient within a particular block of video data according to a scanning order associated with the block when the scanning order comprises a first scanning order. Video encoder 20 and/or video decoder 30 may be further configured to code interchanged x- and y-coordinates that indicate the position of the last significant coefficient within the block according to the scanning order when the scanning order comprises a second scanning order. For example, the second scanning order may be different than the first scanning order.

In this example, the first scanning order and the second scanning order may be symmetrical with respect to one another (or at least partially symmetrical). For example, the first scanning order may be a horizontal scanning order and the second scanning order may be a vertical scanning order, where the horizontal scanning order and the vertical scanning order originate at a common position within the block. For example, the common position may be the DC position, as previously described.

In this example, to code the x- and y-coordinates and the interchanged x- and y-coordinates, video encoder 20 and/or video decoder 30 may be further configured to determine statistics that indicate a probability of each of the x- and y-coordinates comprising a given value, wherein coding the x- and y-coordinates and the interchanged x- and y-coordinates comprises coding based on the statistics. For example, the probability of the x-coordinate comprising a given value may be used to code the x-coordinate and the interchanged y-coordinate, and the probability of the y-coordinate comprising a given value may be used to code the y-coordinate and the interchanged x-coordinate. Video encoder 20 and/or video decoder 30 may be further configured to update the statistics based on the x- and y-coordinates and the interchanged x- and y-coordinates. For example, the probability of the x-coordinate comprising a given value may be updated using the x-coordinate and the interchanged y-coordinate, and the probability of the y-coordinate comprising a given value may be updated using the y-coordinate and the interchanged x-coordinate.

As one example, to code the x- and y-coordinates and the interchanged x- and y-coordinates based on the statistics, video encoder 20 and/or video decoder 30 may be configured to perform a context adaptive entropy coding process (e.g., a CABAC process) that includes video encoder 20 and/or video decoder 30 applying a context model that includes the statistics based on at least one context. For example, the at least one context may include one of the x- and y-coordinates, the interchanged x- and y-coordinates, and the scanning order.

It should be noted that, in some examples, video encoder 20 and/or video decoder 30 may be further configured to code the x- and y-coordinates when the scanning order comprises a third scanning order. For example, the third scanning order may be different than the first scanning order and the second scanning order. As one example, the third scanning order may be a zig-zag scanning order, or a diagonal scanning order, where the zig-zag or diagonal scanning order also originates at the common position within the block, e.g., the DC position.

In this example, in some cases, video encoder 20 and/or video decoder 30 may be further configured to code information that identifies the scanning order, i.e., the scanning order information for the block. Additionally, in some cases, video encoder 20 and/or video decoder 30 may be further configured to code information that identifies positions of other significant coefficients within the block, i.e., the significant coefficient position information for the block.

As another example, video encoder 20 and/or video decoder 30 may be configured to code x- and y-coordinates that indicate a position of a last significant coefficient within a particular block of video data according to a scanning order associated with the block. For example, the scanning order may be one of a plurality of scanning orders, where each of the plurality of scanning orders originates at a common position within the block, e.g., the DC position.

In this example, to code the x- and y-coordinates, video encoder 20 and/or video decoder 30 may be configured to code information that indicates whether the x-coordinate corresponds to the common position, code information that indicates whether the y-coordinate corresponds to the common position, and in the event the x-coordinate does not correspond to the common position, and the y-coordinate does not correspond to the common position, code information that identifies the scanning order. Video encoder 20 and/or video decoder 30 may be further configured to, in the event the x-coordinate does not correspond to the common position, code the x-coordinate based on the scanning order, and, in the event the y-coordinate does not correspond to the common position, code the y-coordinate based on the scanning order.

In this example, to code the x-coordinate and the y-coordinate based on the scanning order, video encoder 20 and/or video decoder 30 may be configured to perform a context adaptive entropy coding process (e.g., a CABAC process) that includes video encoder 20 and/or video decoder 30 applying a context model based on at least one context. For example, the at least one context may include the scanning order.

In any case, after coding the last significant coefficient position information, and, in some cases, the scanning order information and the significant coefficient position information, i.e., the SM data, for the block in the manner described above, video encoder 20 and/or video decoder 30 may also code the value of each significant coefficient (e.g., each significant coefficient's magnitude and sign, indicated by syntax elements "coeff_abs_level_minus1" and "coeff_sign_flag," respectively) within the block.

Accordingly, the techniques of this disclosure may enable video encoder 20 and/or video decoder 30 to code the last significant coefficient position information for the block more efficiently than when using other methods, and may enable video encoder 20 and/or video decoder 30 to have less complexity relative to other systems. In this manner, there may be a relative bit savings for a coded bitstream including the last significant coefficient position information, and a relative reduction in complexity for video encoder 20 and/or video decoder 30 used to code the information, when using the techniques of this disclosure.

Video encoder 20 and video decoder 30 each may be implemented as any of a variety of suitable encoder or decoder circuitry, as applicable, such as one or more microprocessors, digital signal processors (DSPs), application specific integrated circuits (ASICs), field programmable gate arrays (FPGAs), discrete logic circuitry, software, hardware, firmware or any combinations thereof. Each of video encoder 20 and video decoder 30 may be included in one or more encoders or decoders, either of which may be integrated as part of a combined video encoder/decoder (CODEC). An apparatus including video encoder 20 and/or video decoder 30 may comprise an integrated circuit, a microprocessor, and/or a wireless communication device, such as a cellular telephone.

Figure 2:
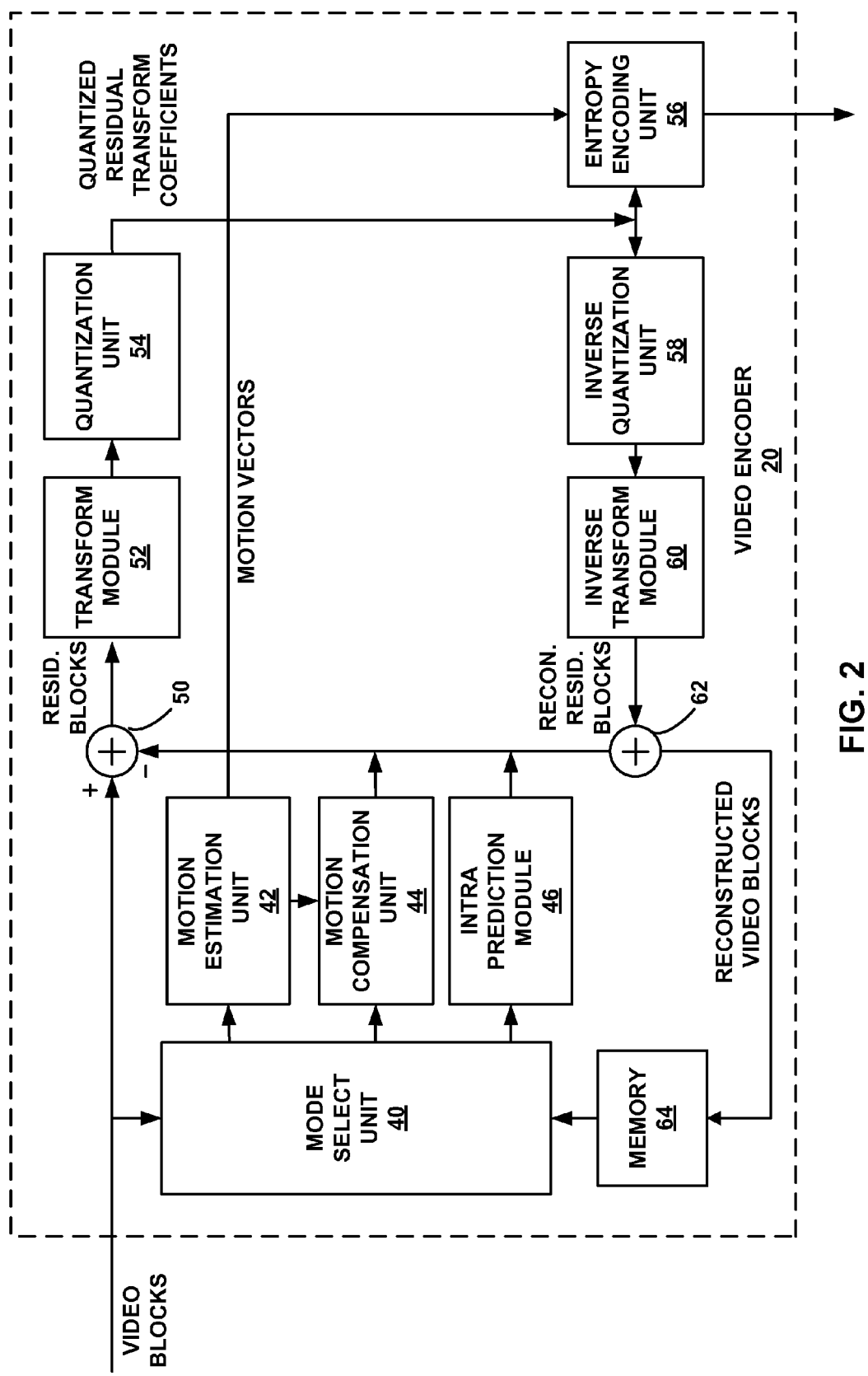
FIG. 2 is a block diagram that illustrates an example of a video encoder that may implement techniques for efficiently encoding last significant coefficient position information based on scanning order information for a block of video data, consistent with the techniques of this disclosure.

FIG. 2 is a block diagram that illustrates an example of a video encoder 20 that may implement techniques for efficiently encoding last significant coefficient position information based on scanning order information for a block of video data consistent with the techniques of this disclosure. Video encoder 20 may perform intra- and inter-coding of blocks within video frames, including macroblocks, CUs, and partitions or sub-partitions thereof. Intra-coding relies on spatial prediction to reduce or remove spatial redundancy in video within a given video frame. Inter-coding relies on temporal prediction to reduce or remove temporal redundancy in video within adjacent frames of a video sequence. Intra-mode (I-mode) may refer to any of several spatial based compression modes, and inter-modes, such as uni-directional prediction (P-mode) or bi-directional prediction (B-mode), may refer to any of several temporal-based compression modes.

As shown in FIG. 2, video encoder 20 receives a current block of video data within a video frame to be encoded. In the example of FIG. 2, video encoder 20 includes motion compensation unit 44, motion estimation unit 42, memory 64, summer 50, transform module 52, quantization unit 54, and entropy encoding unit 56. For video block reconstruction, video encoder 20 also includes inverse quantization unit 58, inverse transform module 60, and summer 62. A deblocking filter (not shown in FIG. 2) may also be included to filter block boundaries to remove blockiness artifacts from reconstructed video. If desired, the deblocking filter would typically filter the output of summer 62.

During the encoding process, video encoder 20 receives a video frame or slice to be coded. The frame or slice may be divided into multiple video blocks. Motion estimation unit 42 and motion compensation unit 44 may perform inter-predictive coding of a given received video block relative to one or more blocks in one or more reference frames to provide temporal compression. Intra-prediction module 46 may perform intra-predictive coding of a given received video block relative to one or more neighboring blocks in the same frame or slice as the block to be coded to provide spatial compression.

Mode select unit 40 may select one of the coding modes, i.e., one mode or multiple intra- or inter-coding modes, based on coding results (e.g., resulting coding rate and level of distortion), and based on a frame or slice type for the frame or slice including the given received block being coded, and provide the resulting intra- or inter-coded block to summer 50 to generate residual block data and to summer 62 to reconstruct the encoded block for use in a reference frame or reference slice. In general, intra-prediction involves predicting a current block relative to neighboring, previously coded blocks, while inter-prediction involves motion estimation and motion compensation to temporally predict the current block.

Motion estimation unit 42 and motion compensation unit 44 represent the inter-prediction elements of video encoder 20. Motion estimation unit 42 and motion compensation unit 44 may be highly integrated, but are illustrated separately for conceptual purposes. Motion estimation is the process of generating motion vectors, which estimate motion for video blocks. A motion vector, for example, may indicate the displacement of a predictive block within a predictive reference frame (or other coded unit) relative to the current block being coded within the current frame (or other coded unit). A predictive block is a block that is found to closely match the block to be coded, in terms of pixel difference, which may be determined by sum of absolute difference (SAD), sum of square difference (SSD), or other difference metrics. A motion vector may also indicate displacement of a partition of a block. Motion compensation may involve fetching or generating the predictive block based on the motion vector determined by motion estimation. Again, motion estimation unit 42 and motion compensation unit 44 may be functionally integrated, in some examples.

Motion estimation unit 42 may calculate a motion vector for a video block of an inter-coded frame by comparing the video block to video blocks of a reference frame in memory 64. Motion compensation unit 44 may also interpolate sub-integer pixels of the reference frame, e.g., an I-frame or a P-frame, for the purposes of this comparison. The ITU H.264 standard, as an example, describes two lists: list 0, which includes reference frames having a display order earlier than a current frame being encoded, and list 1, which includes reference frames having a display order later than the current frame being encoded. Therefore, data stored in memory 64 may be organized according to these lists.

Motion estimation unit 42 may compare blocks of one or more reference frames from memory 64 to a block to be encoded of a current frame, e.g., a P-frame or a B-frame. When the reference frames in memory 64 include values for sub-integer pixels, a motion vector calculated by motion estimation unit 42 may refer to a sub-integer pixel location of a reference frame. Motion estimation unit 42 and/or motion compensation unit 44 may also be configured to calculate values for sub-integer pixel positions of reference frames stored in memory 64 if no values for sub-integer pixel positions are stored in memory 64. Motion estimation unit 42 may send the calculated motion vector to entropy encoding unit 56 and motion compensation unit 44. The reference frame block identified by a motion vector may be referred to as an inter-predictive block, or, more generally, a predictive block. Motion compensation unit 44 may calculate prediction data based on the predictive block.

Intra-prediction module 46 may intra-predict a current block, as an alternative to the inter-prediction performed by motion estimation unit 42 and motion compensation unit 44, as described above. In particular, intra-prediction module 46 may determine an intra-prediction mode to use to encode a current block. In some examples, intra-prediction module 46 may encode a current block using various intra-prediction modes, e.g., during separate encoding passes, and intra-prediction module 46 (or mode select unit 40, in some examples) may select an appropriate intra-prediction mode to use from the tested modes. For example, intra-prediction module 46 may calculate rate-distortion values using a rate-distortion analysis for the various tested intra-prediction modes, and select the intra-prediction mode having the best rate-distortion characteristics among the tested modes. Rate-distortion analysis generally determines an amount of distortion (or error) between an encoded block and an original, unencoded block that was encoded to produce the encoded block, as well as a bit rate (that is, a number of bits) used to produce the encoded block. Intra-prediction module 46 may calculate ratios from the distortions and rates for the various encoded blocks to determine which intra-prediction mode exhibits the best rate-distortion value for the block.

After predicting a current block, e.g., using intra-prediction or inter-prediction, video encoder 20 may form a residual video block by subtracting the prediction data calculated by motion compensation unit 44 or intra-prediction module 46 from the original video block being coded. Summer 50 represents the component or components that may perform this subtraction operation. Transform module 52 may apply a transform, such as a discrete cosine transform (DCT) or a conceptually similar transform, to the residual block, producing a video block comprising residual transform coefficient values. Transform module 52 may perform other transforms, such as those defined by the H.264 standard, which are conceptually similar to DCT. Wavelet transforms, integer transforms, sub-band transforms or other types of transforms could also be used. In any case, transform module 52 may apply the transform to the residual block, producing a block of residual transform coefficients. The transform may convert the residual information from a pixel domain to a transform domain, such as a frequency domain. Quantization unit 54 may quantize the residual transform coefficients to further reduce bit rate. The quantization process may reduce the bit depth associated with some or all of the coefficients. The degree of quantization may be modified by adjusting a quantization parameter.

Following quantization, entropy encoding unit 56 may entropy encode the quantized transform coefficients, which may include CAVLC, CABAC, PIPE, or another entropy coding technique. Following the entropy coding by entropy encoding unit 56, the encoded video may be transmitted to another device or archived for later transmission or retrieval.

In some cases, entropy encoding unit 56 or another unit of video encoder 20 may be configured to perform other coding functions, in addition to entropy coding quantized transform coefficients as described above. For example, entropy encoding unit 56 may construct header information for the block (e.g., macroblock, CU, or LCU), or video frame containing the block, with appropriate syntax elements for transmission in the encoded video bitstream. According to some coding standards, such syntax elements may include last significant coefficient position information for the block (e.g., for a macroblock, or a TU of a CU), as previously described. As also previously described, the last significant coefficient position information may consume a high percentage of the overall compressed video bitrate if coded inefficiently. As such, this disclosure describes techniques that may enable coding the last significant coefficient position information for the block more efficiently than when using other methods. Furthermore, this disclosure describes using coding systems that have less complexity relative to other systems when coding the last significant coefficient position information for the block.

In some examples, entropy encoding unit 56 of video encoder 20 may be configured to encode certain blocks of video data (e.g., one or more macroblocks, or TUs of a CU). In accordance with the techniques of this disclosure, as one example, entropy encoding unit 56 may be configured to encode x- and y-coordinates that indicate a position of a last significant coefficient within a particular block of video data according to a scanning order associated with the block when the scanning order comprises a first scanning order. Entropy encoding unit 56 may be further configured to encode interchanged x- and y-coordinates that indicate the position of the last significant coefficient within the block according to the scanning order when the scanning order comprises a second scanning order. For example, the second scanning order may be different than the first scanning order.

In this example, the first scanning order and the second scanning order may be symmetrical with respect to one another (or at least partially symmetrical). For example, the first scanning order may be a horizontal scanning order and the second scanning order may be a vertical scanning order, where the horizontal and vertical scanning orders originate at a common position within the block, e.g., the DC position.

Specifically, the first scanning order and the second scanning order may each be a scanning order that may be used by entropy encoding unit 56 to encode the block. For example, the first and second scanning orders may be scanning orders used by video encoder 20 to encode blocks of video data, and by video decoder 30 to decode the blocks, within corresponding coding system 10 comprising video encoder 20 and video decoder 30. In some examples, the first and second scanning orders may be only some of the scanning orders used within system 10 to code the blocks. In other examples, the first and second scanning orders may be the only scanning orders used within system 10 to code the blocks.

Furthermore, the interchanged x- and y-coordinates also correspond to the last significant coefficient position information for the block, but are further processed, i.e., interchanged, by entropy encoding unit 56 to enable encoding the information more efficiently than when using other techniques, as previously described. Specifically, the interchanged x- and y-coordinates may enable using common statistics to encode the x- and y-coordinates and the interchanged x- and y-coordinates that indicate the last significant coefficient position information for the block, as also previously described.

In this example, to encode the x- and y-coordinates and the interchanged x- and y-coordinates, entropy encoding unit 56 may be further configured to determine statistics that indicate a probability of each of the x- and y-coordinates comprising a given value, wherein encoding the x- and y-coordinates and the interchanged x- and y-coordinates comprises encoding based on the statistics. For example, the probability of the x-coordinate comprising a given value may be used to encode the x-coordinate and the interchanged y-coordinate, and the probability of the y-coordinate comprising a given value may be used to encode the y-coordinate and the interchanged x-coordinate.

Generally, the statistics may indicate a probability of a given position within the block corresponding to the position of the last significant coefficient within the block according to the scanning order, when the scanning order comprises the first scanning order. In particular, the statistics may indicate a probability of a coordinate, e.g., an x- or a y-coordinate, corresponding to the position of the last significant coefficient within the block according to the scanning order, when the scanning order comprises the first scanning order, comprising a given value (e.g., "0," "1," "2," etc.).

As previously described, because the first and second scanning orders may be symmetrical with respect to one another (or at least partially symmetrical), the probability of the x-coordinate comprising a given value when the scanning order comprises the first scanning order may be the same as, or similar to the probability of the y-coordinate comprising the same value when the scanning order comprises the second scanning order, and vice versa. Similarly, the probability of the y-coordinate comprising a given value when the scanning order comprises the first scanning order may be the same as, or similar to the probability of the x-coordinate comprising the same value when the scanning order comprises the second scanning order, and vice versa. That is, the x- and y-coordinates when the scanning order comprises the first scanning order may each have the same or similar probability of comprising a given value as the interchanged x- and y-coordinates, respectively, when the scanning order comprises the second scanning order. As such, the statistics may further indicate the probability of each of the interchanged x- and y-coordinates comprising a given value. In some examples, entropy encoding unit 56 may determine the statistics using last significant coefficient position information for previously encoded blocks of video data, e.g., values of x- and y-coordinates and interchanged x- and y-coordinates for the previously encoded blocks.

Entropy encoding unit 56 may be further configured to update the statistics based on the x- and y-coordinates and the interchanged x- and y-coordinates, such that the probability of the x-coordinate comprising a given value is updated using the x-coordinate and the interchanged y-coordinate, and the probability of the y-coordinate comprising a given value is updated using the y-coordinate and the interchanged x-coordinate. For example, the updated statistics may be used to encode last significant coefficient position information for subsequently encoded blocks of video data in the manner described above.

As one example, to encode the x- and y-coordinates and the interchanged x- and y-coordinates based on the statistics, entropy encoding unit 56 may be configured to perform a context adaptive entropy coding process (e.g., a CABAC process) that includes entropy encoding unit 56 applying a context model that includes the statistics based on at least one context. For example, the at least one context may include one of the x- and y-coordinates, the interchanged x- and y-coordinates, and the scanning order. As previously mentioned, in addition to CABAC, the described techniques of interchanging the x- and y-coordinates for purposes of coding may also be used in other context adaptive entropy coding techniques, such as CAVLC, PIPE, or other context adaptive entropy coding techniques.

In this example, entropy encoding unit 56 may use the scanning order, e.g., the horizontal or vertical scanning order, to select the particular context model that includes the statistics. That is, entropy encoding unit 56 may select the same statistics to encode the x- and y-coordinates when using the first scanning order to encode the block, and to encode the interchanged x- and y-coordinates when using the second scanning order to encode the block. Furthermore, in cases where one coordinate (e.g., y-coordinate) is encoded after another coordinate (e.g., x-coordinate), entropy encoding unit 56 may encode the coordinate using a value of the other, previously encoded coordinate as a context. That is, a value of a previously encoded one of the x- and y-coordinates or the interchanged x- and y-coordinates, depending on the scanning order used to encode the block, may be used to further select statistics within the context model that indicate a probability of the other, presently encoded coordinate comprising a given value. Entropy encoding unit 56 may then use the selected statistics to encode the x- and y-coordinates and the interchanged x- and y-coordinates by performing the context adaptive entropy coding process.

As also previously described, in this example, the x- and y-coordinates and the interchanged x- and y-coordinates may each be represented using a unary codeword comprising a sequence of one or more bins, i.e., "binarized." As such, to encode the x- and y-coordinates and the interchanged x- and y-coordinates based on the statistics, entropy encoding unit 56 may encode each bin of a codeword corresponding to a particular coordinate by performing the context adaptive entropy coding process). In this example, the statistics included in the context model, indicating a probability of the coordinate comprising a given value, may include probability estimates that indicate a probability of each bin of the codeword corresponding to the coordinate comprising a given value (e.g., "0" or "1"). Furthermore, the statistics may include different probability estimates for each bin of the codeword, depending on the position of the respective bin within the codeword. In some examples, entropy encoding unit 56 may determine the probability estimates using values of corresponding bins for previously encoded blocks of video data, e.g., bins of codewords corresponding to x- and y-coordinates and interchanged x- and y-coordinates for the previously encoded blocks, e.g., as part of determining the statistics based on the last significant coefficient position information for the previously encoded blocks, as previously described. In other examples, entropy encoding unit 56 also may update the probability estimates using the value of each bin, e.g., as part of updating the statistics based on the x- and y-coordinates and the interchanged x- and y-coordinates, as also previously described. Entropy encoding unit 56 may use the probability estimates to encode each bin by performing the context adaptive entropy coding process.

As another example, in some cases, different values of a bin of a unary codeword for one (e.g., x-) coordinate may result in different probability estimates for a corresponding bin of a unary codeword for the other (e.g., y-) coordinate. As such, when encoding a bin of a unary codeword for one coordinate using probability estimates corresponding to the bin, as described above, using probability estimates that include information about a value of a corresponding bin of a unary codeword for the other coordinate may result in the probability estimates being accurate, and, therefore, may enable efficient encoding.

Encoding the x- and y-coordinates and the interchanged x- and y-coordinates (or x- and y-coordinates that indicate last significant coefficient position information for a block of video data, generally) in this "interleaved" manner may allow using mutual information of the respective x- and y-coordinates, which may allow encoding the coordinates more efficiently. Furthermore, some bins of a codeword for each of the x- and y-coordinates may be encoded using a first mode (e.g., a regular mode), while the remaining bins of the codeword may be encoded using a second mode (e.g., a bypass mode). Accordingly, separating the encoding of the bins of the codeword for each of the x- and y-coordinates in the manner described above may allow grouping bins encoded using particular coding mode (e.g., bypass mode) together, which may improve coding throughput.

In other words, in cases where each of the x- and y-coordinates and the interchanged x- and y-coordinates comprises a sequence of one or more bins, entropy encoding unit 56 may be configured to encode the x- and y-coordinates and the interchanged x- and y-coordinates by performing the context adaptive entropy coding process that includes applying the context model that includes the statistics based on the one of the x- and y-coordinates, and the interchanged x- and y-coordinates. Entropy encoding unit 56 may be configured to encode the x- and y-coordinates by encoding at least one bin of the sequence corresponding to one of the coordinates by selecting the statistics from the context model based at least in part on a value of a corresponding bin of the sequence corresponding to the other coordinate. Furthermore, entropy encoding unit 56 may be configured to encode the one or more bins of the sequence corresponding to the one coordinate and the one or more bins of the sequence corresponding to the other coordinate in an interleaved manner.

Accordingly, to encode the last significant coefficient position information, entropy encoding unit 56 may be configured to encode the x- and y-coordinates, and the interchanged x- and y-coordinates, in an interleaved manner. That is, entropy encoding unit 56 may be configured to encode each bin of a unary codeword for a given coordinate by performing a context adaptive entropy coding process that includes applying a context model based on a context, wherein the context may be a position of the bin within the unary codeword, as previously described, and a value of a corresponding, previously encoded bin of a unary codeword for the other coordinate.

It should be noted that, in other examples consistent with the techniques of this disclosure, other types of codewords, e.g., truncated unary codewords, exponential Golomb codewords, concatenated codewords, as well as combinations of various coding techniques, may be used.

It should also be noted that, in some examples, entropy encoding unit 56 may be further configured to encode the x- and y-coordinates when the scanning order comprises a third scanning order. For example, the third scanning order may be different than the first scanning order and the second scanning order. As one example, the third scanning order may be a zig-zag scanning order, or a diagonal scanning order, where the zig-zag or diagonal scanning order also originates at the common position within the block, e.g., the DC position.

In this example, entropy encoding unit 56 may be further configured to encode information that identifies the scanning order, i.e., the scanning order information for the block. Alternatively, as previously described, entropy encoding unit 56 may omit encoding the scanning order information for the block when entropy encoding unit 56 uses an adaptive scanning order to encode the block. Additionally, in some cases, entropy encoding unit 56 may be further configured to encode information that identifies positions of all other significant coefficients within the block, i.e., the significant coefficient position information for the block.

For example, the significant coefficient position information for the block may be represented using a sequence of significant coefficient flags, as previously described. As also previously described, the significant coefficient position information may be encoded by encoding each significant coefficient flag of the sequence by performing a context adaptive entropy coding process (e.g., a CABAC process) that includes applying a context model based on a context, wherein the context may include a position of the flag within the block according to the scanning order.

The context model may include probability estimates that indicate a probability of each flag comprising a given value (e.g., "0" or "1"). In some examples, entropy encoding unit 56 may determine the probability estimates using values of corresponding significant coefficient flags for previously encoded blocks of video data. In other examples, entropy encoding unit 56 also may update the probability estimates using the value of each flag to reflect the probability of the flag comprising a given value. For example, the updated probability estimates may be used to encode significant coefficient position information for subsequently encoded blocks of video data in the manner described above.

As another example, entropy encoding unit 56 may be configured to encode x- and y-coordinates that indicate a position of a last significant coefficient within a particular block of video data according to a scanning order associated with the block. For example, the scanning order may be one of a plurality of scanning orders, where each of the plurality of scanning orders originates at a common position within the block, e.g., the DC position.

In this example, to encode the x- and y-coordinates, entropy encoding unit 56 may be configured to encode information that indicates whether the x-coordinate corresponds to the common position, encode information that indicates whether the y-coordinate corresponds to the common position, and in the event the x-coordinate does not correspond to the common position, and the y-coordinate does not correspond to the common position, encode information that identifies the scanning order. Entropy encoding unit 56 may be further configured to, in the event the x-coordinate does not correspond to the common position, encode the x-coordinate based on the scanning order, and, in the event the y-coordinate does not correspond to the common position, encode the y-coordinate based on the scanning order.

In this example, to encode the x-coordinate and the y-coordinate based on the scanning order, entropy encoding unit 56 may be configured to perform a context adaptive entropy coding process (e.g., a CABAC process) that includes entropy encoding unit 56 applying a context model based on at least one context. For example, the at least one context may include the scanning order.

Additionally, as one example, entropy encoding unit 56 may be configured to encode one coordinate (e.g., y-coordinate) after another coordinate (e.g., x-coordinate), wherein entropy encoding unit 56 may be configured to encode the one coordinate using a value of the other, previously encoded coordinate as a context. As another example, where each of the x- and y-coordinates comprises a sequence of one or more bins, entropy encoding unit 56 may be configured to encode at least one bin of the sequence corresponding to one of the coordinates by selecting the statistics from the context model based at least in part on a value of a corresponding bin of the sequence corresponding to the other coordinate. Furthermore, entropy encoding unit 56 may be configured to encode the one or more bins of the sequence corresponding to the one coordinate and the one or more bins of the sequence corresponding to the other coordinate in an interleaved manner.

In any case, after encoding the last significant coefficient position information, and, in some cases, the scanning order information and the significant coefficient position information, i.e., the SM data, for the block in the manner described above, entropy encoding unit 56 may also encode the value of each significant coefficient (e.g., each significant coefficient's magnitude and sign, indicated by syntax elements "coeff_abs_level_minus1" and "coeff_sign_flag," respectively) within the block.

Accordingly, the techniques of this disclosure may enable entropy encoding unit 56 to encode the last significant coefficient position information for the block more efficiently than when using other methods, and may enable entropy encoding unit 56 to have less complexity relative to other systems. In this manner, there may be a relative bit savings for a coded bitstream including the last significant coefficient position information, and a relative reduction in complexity for entropy encoding unit 56 used to encode the information, when using the techniques of this disclosure.

Inverse quantization unit 58 and inverse transform module 60 apply inverse quantization and inverse transformation, respectively, to reconstruct the residual block in the pixel domain, e.g., for later use as a reference block. Motion compensation unit 44 may calculate a reference block by adding the residual block to a predictive block of one of the frames of memory 64. Motion compensation unit 44 may also apply one or more interpolation filters to the reconstructed residual block to calculate sub-integer pixel values for use in motion estimation. Summer 62 adds the reconstructed residual block to the motion compensated prediction block produced by motion compensation unit 44 to produce a reconstructed video block for storage in memory 64. The reconstructed video block may be used by motion estimation unit 42 and motion compensation unit 44 as a reference block to inter-code a block in a subsequent video frame.

In this manner, video encoder 20 represents an example of a video coder configured to code x- and y-coordinates that indicate a position of a last non-zero coefficient within a block of video data according to a scanning order associated with the block when the scanning order comprises a first scanning order, and code interchanged x- and y-coordinates that indicate the position of the last non-zero coefficient within the block according to the scanning order when the scanning order comprises a second scanning order, wherein the second scanning order is different than the first scanning order.

Figure 3:
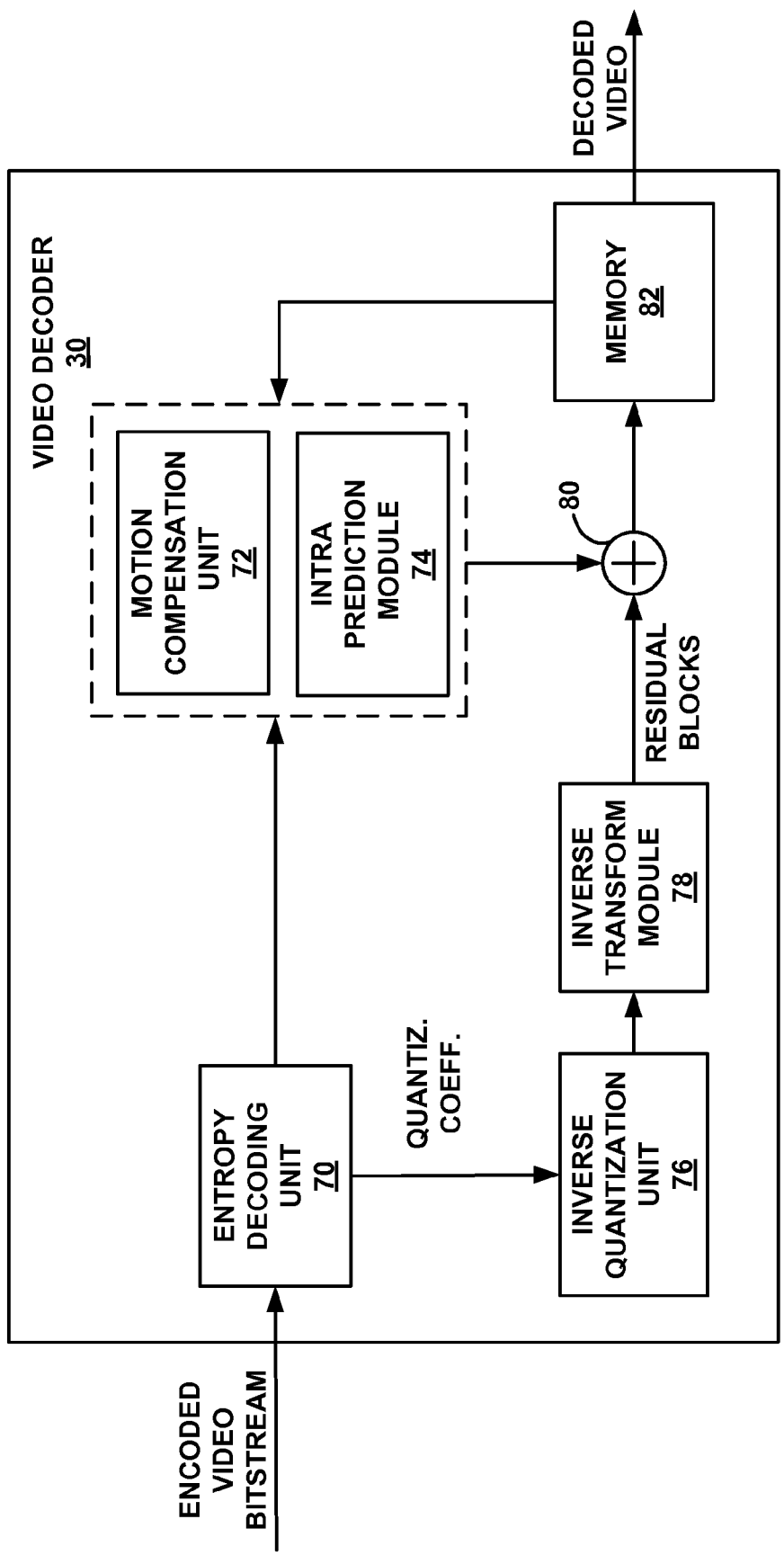
FIG. 3 is a block diagram that illustrates an example of a video decoder that may implement techniques for efficiently decoding encoded last significant coefficient position information based on scanning order information for a block of video data, consistent with the techniques of this disclosure.

FIG. 3 is a block diagram that illustrates an example of a video decoder 30 that may implement techniques for efficiently decoding encoded last significant coefficient position information based on scanning order information for a block of video data consistent with the techniques of this disclosure. In the example of FIG. 3, video decoder 30 includes an entropy decoding unit 70, motion compensation unit 72, intra-prediction module 74, inverse quantization unit 76, inverse transform unit 78, memory 82 and summer 80. Video decoder 30 may, in some examples, perform a decoding pass generally reciprocal to the encoding pass described with respect to video encoder 20 (FIG. 2). Motion compensation unit 72 may generate prediction data based on motion vectors received from entropy decoding unit 70.

In some examples, video decoder 30 may be configured to receive encoded video data (e.g., one or more macroblocks, or TUs of a CU) from video encoder 20. In accordance with the techniques of this disclosure, as one example, entropy decoding unit 70 may be configured to decode x- and y-coordinates that indicate a position of a last significant coefficient within a particular block of video data according to a scanning order associated with the block when the scanning order comprises a first scanning order. Entropy decoding unit 70 may be further configured to decode interchanged x- and y-coordinates that indicate the position of the last significant coefficient within the block according to the scanning order when the scanning order comprises a second scanning order. For example, the second scanning order may be different than the first scanning order.

In this example, the first scanning order and the second scanning order may be symmetrical with respect to one another (or at least partially symmetrical). For example, the first scanning order may be a horizontal scanning order and the second scanning order may be a vertical scanning order, where the horizontal scanning order and the vertical scanning order originate at a common position within the block, e.g., the DC position.

Specifically, the first scanning order and the second scanning order may each be a scanning order that may be used by entropy decoding unit 70 to decode the block. For example, the first and second scanning orders may be scanning orders used by video encoder 20 to encode blocks of video data, and by video decoder 30 to decode the blocks, within corresponding coding system 10 comprising video encoder 20 and video decoder 30. In some examples, the first and second scanning orders may be only some of the scanning orders used within system 10 to code the blocks. In other examples, the first and second scanning orders may be the only scanning orders used within system 10 to code the blocks.

Furthermore, the interchanged x- and y-coordinates also correspond to the last significant coefficient position information for the block, but are further processed, i.e., interchanged, by entropy decoding unit 70 to enable decoding the information more efficiently than when using other techniques, as previously described. Specifically, the interchanged x- and y-coordinates may enable using common statistics to decode the x- and y-coordinates and the interchanged x- and y-coordinates that indicate the last significant coefficient position information for the block, as also previously described.

In this example, to decode the x- and y-coordinates and the interchanged x- and y-coordinates, entropy decoding unit 70 may be further configured to determine statistics that indicate a probability of each of the x- and y-coordinates comprising a given value, wherein decoding the x- and y-coordinates and the interchanged x- and y-coordinates comprises decoding based on the statistics. For example, the probability of the x-coordinate comprising a given value may be used to decode the x-coordinate and the interchanged y-coordinate, and the probability of the y-coordinate comprising a given value may be used to decode the y-coordinate and the interchanged x-coordinate.

Generally, the statistics may indicate a probability of a given position within the block corresponding to the position of the last significant coefficient within the block according to the scanning order, when the scanning order comprises the first scanning order. In particular, the statistics may indicate a probability of a coordinate, e.g., an x- or a y-coordinate, corresponding to the position of the last significant coefficient within the block according to the scanning order, when the scanning order comprises the first scanning order, comprising a given value (e.g., "0," "1," "2," etc.).

As previously described, because the first and second scanning orders may be symmetrical with respect to one another (or at least partially symmetrical), the probability of the x-coordinate comprising a given value when the scanning order comprises the first scanning order may be the same as, or similar to the probability of the y-coordinate comprising the same value when the scanning order comprises the second scanning order, and vice versa. Similarly, the probability of the y-coordinate comprising a given value when the scanning order comprises the first scanning order may be the same as, or similar to the probability of the x-coordinate comprising the same value when the scanning order comprises the second scanning order, and vice versa. That is, the x- and y-coordinates when the scanning order comprises the first scanning order may each have the same or similar probability of comprising a given value as the interchanged x- and y-coordinates, respectively, when the scanning order comprises the second scanning order. As such, the statistics may further indicate the probability of each of the interchanged x- and y-coordinates comprising a given value. In some examples, entropy decoding unit 70 may determine the statistics using last significant coefficient position information for previously decoded blocks of video data, e.g., values of x- and y-coordinates and interchanged x- and y-coordinates for the previously decoded blocks.

Entropy decoding unit 70 may be further configured to update the statistics based on the x- and y-coordinates and the interchanged x- and y-coordinates. For example, the probability of the x-coordinate comprising a given value may be updated using the x-coordinate and the interchanged y-coordinate, and the probability of the y-coordinate comprising a given value may be updated using the y-coordinate and the interchanged x-coordinate. For example, the updated statistics may be used to decode last significant coefficient position information for subsequently decoded blocks of video data in the manner described above.

As one example, to decode the x- and y-coordinates and the interchanged x- and y-coordinates based on the statistics, entropy decoding unit 70 may be configured to perform a context adaptive entropy coding process (e.g., a CABAC process) that includes entropy decoding unit 70 applying a context model that includes the statistics based on at least one context. For example, the at least one context may include one of the x- and y-coordinates, the interchanged x- and y-coordinates, and the scanning order. As previously mentioned, in addition to CABAC, the described techniques of interchanging the x- and y-coordinates for purposes of coding may also be used in other context adaptive coding techniques, such as CAVLC, PIPE, or other context adaptive techniques.

In this example, entropy decoding unit 70 may use the scanning order, e.g., the horizontal or vertical scanning order, to select the particular context model that includes the statistics. That is, entropy decoding unit 70 may select the same statistics to decode the x- and y-coordinates when using the first scanning order to decode the block, and to decode the interchanged x- and y-coordinates when using the second scanning order to decode the block. Furthermore, in cases where one coordinate (e.g., y-coordinate) is decoded after another coordinate (e.g., x-coordinate), entropy decoding unit 70 may decode the coordinate using a value of the other, previously decoded coordinate as a context. That is, a value of a previously decoded one of the x- and y-coordinates or the interchanged x- and y-coordinates, depending on the scanning order used to decode the block, may be used to further select statistics within the context model that indicate a probability of the other, presently decoded coordinate comprising a given value. Entropy decoding unit 70 may then use the selected statistics to decode the x- and y-coordinates and the interchanged x- and y-coordinates by performing the context adaptive entropy coding process.

As also previously described, in this example, the x- and y-coordinates and the interchanged x- and y-coordinates may each be represented using a unary codeword comprising a sequence of one or more bins, i.e., "binarized." As such, to decode the x- and y-coordinates and the interchanged x- and y-coordinates based on the statistics, entropy decoding unit 70 may decode each bin of a codeword corresponding to a particular coordinate by performing the context adaptive entropy coding process. In this example, the statistics included in the context model, indicating a probability of the coordinate comprising a given value, may include probability estimates that indicate a probability of each bin of the codeword corresponding to the coordinate comprising a given value (e.g., "0" or "1"). Furthermore, the statistics may include different probability estimates for each bin of the codeword, depending on the position of the respective bin within the codeword. In some examples, entropy decoding unit 70 may determine the probability estimates using values of corresponding bins for previously decoded blocks of video data, e.g., bins of codewords corresponding to x- and y-coordinates and interchanged x- and y-coordinates for the previously decoded blocks, e.g., as part of determining the statistics based on the last significant coefficient position information for the previously decoded blocks, as previously described. In other examples, entropy decoding unit 70 also may update the probability estimates using the value of each bin, e.g., as part of updating the statistics based on the x- and y-coordinates and the interchanged x- and y-coordinates, as also previously described. Entropy decoding unit 70 may use the probability estimates to decode each bin by performing the context adaptive entropy coding process.

As another example, in some cases, different values of a bin of a unary codeword for one (e.g., x-) coordinate may result in different probability estimates for a corresponding bin of a unary codeword for the other (e.g., y-) coordinate. As such, when decoding a bin of a unary codeword for one coordinate using probability estimates corresponding to the bin, as described above, using probability estimates that include information about a value of a corresponding bin of a unary codeword for the other coordinate may result in the probability estimates being accurate, and, therefore, may enable efficient decoding.

Decoding the x- and y-coordinates and the interchanged x- and y-coordinates (or x- and y-coordinates that indicate last significant coefficient position information for a block of video data, generally) in this "interleaved" manner may allow using mutual information of the respective x- and y-coordinates, which may allow decoding the coordinates more efficiently. Furthermore, some bins of a codeword for each of the x- and y-coordinates may be decoded using a first mode (e.g., a regular mode), while the remaining bins of the codeword may be decoded using a second mode (e.g., a bypass mode). Accordingly, separating the decoding of the bins of the codeword for each of the x- and y-coordinates in the manner described above may allow grouping bins decoded using particular coding mode (e.g., bypass mode) together, which also may improve coding efficiency.

In other words, in cases where each of the x- and y-coordinates and the interchanged x- and y-coordinates comprises a sequence of one or more bins, entropy decoding unit 70 may be configured to decode the x- and y-coordinates and the interchanged x- and y-coordinates by performing the context adaptive entropy coding process that includes applying the context model that includes the statistics based on the one of the x- and y-coordinates, and the interchanged x- and y-coordinates. Entropy decoding unit 70 may be configured to decode the x- and y-coordinates by decoding at least one bin of the sequence corresponding to one of the coordinates by selecting the statistics from the context model based at least in part on a value of a corresponding bin of the sequence corresponding to the other coordinate. Furthermore, entropy decoding unit 70 may be configured to decode the one or more bins of the sequence corresponding to the one coordinate and the one or more bins of the sequence corresponding to the other coordinate in an interleaved manner.

Accordingly, to decode the last significant coefficient position information, entropy decoding unit 70 may be configured to decode the x- and y-coordinates, and the interchanged x- and y-coordinates, in an interleaved manner. That is, entropy decoding unit 70 may be configured to decode each bin of a unary codeword for a given coordinate by performing a context adaptive entropy coding process that includes applying a context model based on a context, wherein the context may be a position of the bin within the unary codeword, as previously described, and a value of a corresponding, previously decoded bin of a unary codeword for the other coordinate.

It should be noted that, in other examples consistent with the techniques of this disclosure, other types of codewords, e.g., truncated unary codewords, exponential Golomb codewords, concatenated codewords, as well as combinations of various coding techniques, may be used.

It should also be noted that, in some examples, entropy decoding unit 70 may be further configured to decode the x- and y-coordinates when the scanning order comprises a third scanning order. For example, the third scanning order may be different than the first scanning order and the second scanning order. As one example, the third scanning order may be a zig-zag scanning order, or a diagonal scanning order, where the zig-zag or diagonal scanning order also originates at the common position within the block, e.g., the DC position.

In this example, in some cases, entropy decoding unit 70 may be further configured to decode information that identifies the scanning order, i.e., the scanning order information for the block. Alternatively, as previously described, entropy decoding unit 70 may omit decoding the scanning order information for the block when entropy decoding unit 70 uses an adaptive scanning order to decode the block. Additionally, in some cases, entropy decoding unit 70 may be further configured to decode information that identifies positions of other significant coefficients within the block, i.e., the significant coefficient position information for the block.

For example, the significant coefficient position information for the block may be represented using a sequence of significant coefficient flags, as previously described. As also previously described, the significant coefficient position information may be decoded by decoding each significant coefficient flag of the sequence by performing a context adaptive entropy coding process (e.g., a CABAC process) that includes applying a context model based on a context, wherein the context may include a position of the flag within the block according to the scanning order.

Again, the context model may include probability estimates that indicate a probability of each flag comprising a given value (e.g., "0" or "1"). In some examples, entropy decoding unit 70 may determine the probability estimates using values of corresponding significant coefficient flags for previously decoded blocks of video data. In other examples, entropy decoding unit 70 also may update the probability estimates using the value of each flag to reflect the probability of the flag comprising a given value. For example, the updated probability estimates may be used to decode significant coefficient position information for subsequently decoded blocks of video data in the manner described above.

As another example, entropy decoding unit 70 may be configured to decode x- and y-coordinates that indicate a position of a last significant coefficient within a particular block of video data according to a scanning order associated with the block. For example, the scanning order may be one of a plurality of scanning orders, where each of the plurality of scanning orders originates at a common position within the block, e.g., the DC position.

In this example, to decode the x- and y-coordinates, entropy decoding unit 70 may be configured to decode information that indicates whether the x-coordinate corresponds to the common position, decode information that indicates whether the y-coordinate corresponds to the common position, and in the event the x-coordinate does not correspond to the common position, and the y-coordinate does not correspond to the common position, decode information that identifies the scanning order. Entropy decoding unit 70 may be further configured to, in the event the x-coordinate does not correspond to the common position, decode the x-coordinate based on the scanning order, and, in the event the y-coordinate does not correspond to the common position, decode the y-coordinate based on the scanning order.

In this example, to decode the x-coordinate and the y-coordinate based on the scanning order, entropy decoding unit 70 may be configured to perform a context adaptive entropy coding process (e.g., a CABAC process) that includes entropy decoding unit 70 applying a context model based on at least one context. For example, the at least one context may include the scanning order.

Additionally, as one example, entropy decoding unit 70 may be configured to decode one coordinate (e.g., y-coordinate) after another coordinate (e.g., x-coordinate), wherein entropy decoding unit 70 may be configured to decode the one coordinate using a value of the other, previously decoded coordinate as a context. As another example, where each of the x- and y-coordinates comprises a sequence of one or more bins, entropy decoding unit 70 may be configured to decode at least one bin of the sequence corresponding to one of the coordinates by selecting the statistics from the context model based at least in part on a value of a corresponding bin of the sequence corresponding to the other coordinate. Furthermore, entropy decoding unit 70 may be configured to decode the one or more bins of the sequence corresponding to the one coordinate and the one or more bins of the sequence corresponding to the other coordinate in an interleaved manner.

In any case, after decoding the last significant coefficient position information, and, in some cases, the scanning order information and the significant coefficient position information, i.e., the SM data, for the block in the manner described above, entropy decoding unit 70 may also decode the value of each significant coefficient (e.g., each significant coefficient's magnitude and sign, indicated by syntax elements "coeff_abs_level_minus1" and "coeff_sign_flag," respectively) within the block.

Accordingly, the techniques of this disclosure may enable entropy decoding unit 70 to decode the last significant coefficient position information for the block more efficiently than when using other methods, and may enable entropy decoding unit 70 to have less complexity relative to other systems. In this manner, there may be a relative bit savings for a coded bitstream including the last significant coefficient position information, and a relative reduction in complexity for entropy decoding unit 70 used to decode the information, when using the techniques of this disclosure.

Motion compensation unit 72 may use motion vectors received in the bitstream to identify a prediction block in reference frames in memory 82. Intra-prediction module 74 may use intra-prediction modes received in the bitstream to form a prediction block from spatially adjacent blocks.

Intra-prediction module 74 may use an indication of an intra-prediction mode for the encoded block to intra-predict the encoded block, e.g., using pixels of neighboring, previously decoded blocks. For examples in which the block is inter-prediction mode encoded, motion compensation unit 72 may receive information defining a motion vector, in order to retrieve motion compensated prediction data for the encoded block. In any case, motion compensation unit 72 or intra-prediction module 74 may provide information defining a prediction block to summer 80.

Inverse quantization unit 76 inverse quantizes. i.e., de-quantizes, the quantized block coefficients provided in the bitstream and decoded by entropy decoding unit 70. The inverse quantization process may include a conventional process, e.g., as defined by the H.264 decoding standard or as performed by the HEVC Test Model. The inverse quantization process may also include use of a quantization parameter $QP_Y$ calculated by video encoder 20 for each block to determine a degree of quantization and, likewise, a degree of inverse quantization that should be applied.

Inverse transform module 78 applies an inverse transform, e.g., an inverse DCT, an inverse integer transform, or a conceptually similar inverse transform process, to the transform coefficients in order to produce residual blocks in the pixel domain. Motion compensation unit 72 produces motion compensated blocks, possibly performing interpolation based on interpolation filters. Identifiers for interpolation filters to be used for motion estimation with sub-pixel precision may be included in the syntax elements. Motion compensation unit 72 may use interpolation filters as used by video encoder 20 during encoding of the video block to calculate interpolated values for sub-integer pixels of a reference block. Motion compensation unit 72 may determine the interpolation filters used by video encoder 20 according to received syntax information and use the interpolation filters to produce predictive blocks.

Motion compensation unit 72 uses some of the syntax information for the encoded block to determine sizes of blocks used to encode frame(s) of the encoded video sequence, partition information that describes how each block of a frame or slice of the encoded video sequence is partitioned, modes indicating how each partition is encoded, one or more reference frames (and reference frame lists) for each inter-encoded block or partition, and other information to decode the encoded video sequence. Intra-prediction module 74 may also use the syntax information for the encoded block to intra-predict the encoded block, e.g., using pixels of neighboring, previously decoded blocks, as described above.

Summer 80 sums the residual blocks with the corresponding prediction blocks generated by motion compensation unit 72 or intra-prediction module 74 to form decoded blocks. If desired, a deblocking filter may also be applied to filter the decoded blocks in order to remove blockiness artifacts. The decoded video blocks are then stored in memory 82, which provides reference blocks for subsequent motion compensation and also produces decoded video for presentation on a display device (such as display device 32 of FIG. 1).

In this manner, video decoder 30 represents an example of a video coder configured to code x- and y-coordinates that indicate a position of a last non-zero coefficient within a block of video data according to a scanning order associated with the block when the scanning order comprises a first scanning order, and code interchanged x- and y-coordinates that indicate the position of the last non-zero coefficient within the block according to the scanning order when the scanning order comprises a second scanning order, wherein the second scanning order is different than the first scanning order.

FIGS. 4A-4C are conceptual diagrams that illustrate an example of a block of video data and corresponding significant coefficient position information and last significant coefficient position information. As shown in FIG. 4A, a block of video data, e.g., a macroblock, or a TU of a CU, may include quantized transform coefficients. For example, as shown in FIG. 4A, block 400 may include quantized transform coefficients generated using prediction, transform, and quantization techniques previously described. Assume, for this example, that block 400 has a size of 2N×2N, wherein N equals to two. Accordingly, block 400 has a size of 4×4, and includes sixteen quantized transform coefficients, as also shown in FIG. 4A. Assume further, that the scanning order associated with block 400 is the zig-zag scanning order, as shown in FIG. 5A described in greater detail below.

In this example, a last significant coefficient within block 400 according to the zig-zag scanning order is a quantized transform coefficient equal to "1," located in position 406 within block 400. In other examples, as described above, a block may have a size that is smaller or larger than the size of block 400, and may include more or fewer quantized transform coefficients than block 400. In still other examples, the scanning order associated with block 400 may be a different scanning order. e.g., a horizontal scanning order, a vertical scanning order, a diagonal scanning order, or another scanning order.

FIG. 4B illustrates an example of significant coefficient flag data, i.e., significant coefficient flags represented in map, or block form, as previously described. In the example of FIG. 4B, block 402 may correspond to block 400 depicted in FIG. 4A. In other words, the significant coefficient flags of block 402 may correspond to the quantized transform coefficients of block 400. As shown in FIG. 4B, the significant coefficient flags of block 402 that are equal to "1" correspond to significant coefficients of block 400. Similarly, the significant coefficient flags of block 402 that are equal to "0" correspond to zero, or non-significant coefficients of block 400.

In this example, a significant coefficient flag of block 402 corresponding to the last significant coefficient within block 400 according to the zig-zag scanning order is a significant coefficient flag equal to "1," located in position 408 within block 402. In other examples, the values of significant coefficient flags used to indicate significant or non-significant coefficients may vary (e.g., significant coefficient flags equal to "0" may correspond to significant coefficients, and significant coefficient flags equal to "1" may correspond to non-significant coefficients).

FIG. 4C illustrates an example of last significant coefficient flag data, i.e., last significant coefficient flags represented in map, or block form, as also previously described. In the example of FIG. 4C, block 404 may correspond to block 400 and block 402 depicted in FIG. 4A and FIG. 4B, respectively. In other words, the last significant coefficient flags of block 404 may correspond to the quantized transform coefficients of block 400, and to the significant coefficient flags of block 402.

As shown in FIG. 4C, the last significant coefficient flag of block 404 that is equal to "1," located in position 410 within block 404, corresponds to a last significant coefficient of block 400, and to a last one of the significant coefficient flags of block 402 that are equal to "1," according to the zig-zag scanning order. Similarly, the last significant coefficient flags of block 404 that are equal to "0" (i.e., all remaining last significant coefficient flags) correspond to zero, or non-significant coefficients of block 400, and to all significant coefficient flags of block 402 that are equal to "1" other than the last one of such significant coefficient flags according to the zig-zag scanning order.

The values of the last significant coefficient flags used to indicate a last significant coefficient according to a scanning order may vary (e.g., a last significant coefficient flag equal to "0" may correspond to a last significant coefficient according to the scanning order, and last significant coefficient flags equal to "1" may correspond to all remaining coefficients). In any case, the significant coefficient flags of block 402, and the last significant coefficient flags of block 404, may be collectively referred to as SM data for block 400.

As described above, significant coefficient position information for a block of video data may be indicated by serializing significant coefficient flags for the block from a two-dimensional block representation, as depicted in block 402 shown in FIG. 4B, into a one-dimensional array, using a scanning order associated with the block. In the example of blocks 400-402 shown in FIGS. 4A-4B, again assuming the zig-zag scanning order, the significant coefficient position information for block 400 may be indicated by serializing the significant coefficient flags of block 402 into a one-dimensional array. That is, the significant coefficient position information for block 400 may be indicated by generating a sequence of significant coefficient flags of block 402 according to the zig-zag scanning order.

In this example, the generated sequence may correspond to a value "111111," representing the first 6 significant coefficient flags of block 402 according to the zig-zag scanning order. It should be noted that the generated sequence may contain significant coefficient flags corresponding to a range of block positions within block 400, starting from a first block position in the zig-zag scanning order (i.e., the DC position) and ending with a block position corresponding to the last significant coefficient of block 400 according to the zig-zag scanning order (i.e., corresponding to the last significant coefficient flag equal to "1" of block 404).

As also described above, last significant coefficient position information for the block may be indicated by serializing last significant coefficient flags for the block from a two-dimensional block representation, as depicted in block 404 shown in FIG. 4C, into a one-dimensional array, using a scanning order associated with the block. In the example of blocks 400-404 shown in FIGS. 4A-4C, again assuming the zig-zag scanning order, the last significant coefficient position information for block 400 may be indicated by serializing the last significant coefficient flags of block 404 into a one-dimensional array. That is, the last significant coefficient position information for block 400 may be indicated by generating a sequence of last significant coefficient flags of block 404 according to the zig-zag scanning order. In this example, the generated sequence may correspond to a value "000001," representing the first 6 last significant coefficient flags of block 404 according to the zig-zag scanning order.

Once again, it should be noted that the generated sequence may contain last significant coefficient flags corresponding to a range of block positions within block 400, starting from the first block position in the zig-zag scanning order, and ending with the block position corresponding to the last significant coefficient of block 400 according to the zig-zag scanning order (i.e., corresponding to the last significant coefficient flag equal to "1" of block 404). Accordingly, in this example, no last significant coefficient flags following the last significant coefficient flag equal to "1" according to the zig-zag scanning order are included in the sequence. Generally speaking, last significant coefficient flags following a last significant coefficient flag equal to "1" according to a scanning order associated with a block of video data may not be needed to indicate last significant coefficient position information for the block. As such, in some examples, these flags are omitted from the generated sequence of last significant coefficient flags used to indicate the information.

It should also be noted that, as described above, if the last significant coefficient is located within a last block position according to the scanning order (e.g., the bottom right block position), the generated sequence may not include a last significant coefficient flag corresponding to the last block position, because the position may be inferred to contain the last significant coefficient for the block. Accordingly, in this example, the generated sequence may correspond to a value "000000000000000," wherein the last significant coefficient flag corresponding to the last block position is not included in the sequence, and is inferred to equal "1."

FIGS. 5A-5C are conceptual diagrams that illustrate examples of blocks of video data scanned using a zig-zag scanning order, a horizontal scanning order, and a vertical scanning order, respectively. As shown in FIGS. 5A-5C, an 8×8 block of video data, e.g., a macroblock, or a TU of a CU, may include sixty-four quantized transform coefficients in corresponding block positions, denoted with circles. For example, blocks 500-504 may each include sixty-four quantized transform coefficients generated using prediction, transform, and quantization techniques previously described, again, wherein each corresponding block position is denoted with a circle. Assume, for this example, that blocks 500-504 have a size of 2N×2N, wherein N equals to four. Accordingly, blocks 500-504 have a size of 8×8.

As shown in FIG. 5A, the scanning order associated with block 500 is the zig-zag scanning order. The zig-zag scanning order scans the quantized transform coefficients of block 500 in a diagonal manner as indicated by the arrows in FIG. 5A. Similarly, as shown in FIGS. 5B and 5C, the scanning orders associated with blocks 502 and 504 are the horizontal scanning order and the vertical scanning order, respectively. The horizontal scanning order scans the quantized transform coefficients of block 502 in a horizontal line-by-line, or "raster" manner, while the vertical scanning order scans the quantized transform coefficients of block 504 in a vertical line-by-line, or "rotated raster" manner, also as indicated by the arrows in FIGS. 5B and 5C.

In other examples, as described above, a block may have a size that is smaller or larger than the size of blocks 500-504, and may include more or fewer quantized transform coefficients and corresponding block positions. In these examples, a scanning order associated with the block may scan the quantized transform coefficients of the block in a substantially similar manner as shown in the examples of 8×8 blocks 500-504 of FIGS. 5A-5C, e.g., a 4×4 block, or a 16×16 block, may be scanned following any of the scanning orders previously described.

As previously described, the techniques of this disclose may also apply with respect to a wide variety of other scanning orders, including a diagonal scanning order, scanning orders that are combinations of zigzag, horizontal, vertical, and/or diagonal scanning orders, as well as scanning orders that are partially zigzag, partially horizontal, partially vertical, and/or partially diagonal. In addition, the techniques of this disclosure may also consider a scanning order that is itself adaptive based on statistics associated with previously coded blocks of video data (e.g., blocks having the same block size or coding mode as the current block being coded). For example, an adaptive scanning order could be the scanning order associated with a block of video data, in some cases.

Figure 6A:
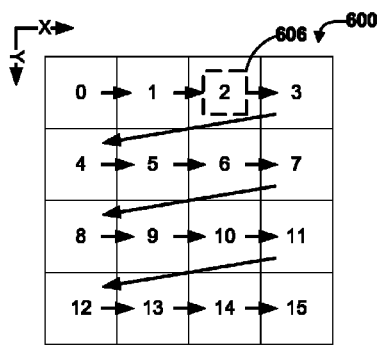
FIGS. 6A-6C are conceptual diagrams that illustrate examples of blocks of video data for which last significant coefficient position information is coded based on scanning order information, consistent with the techniques of this disclosure.
Figure 6B:
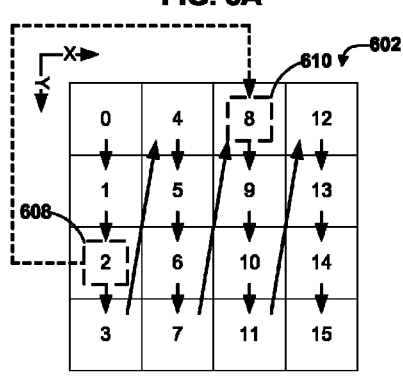
Figure 6C:
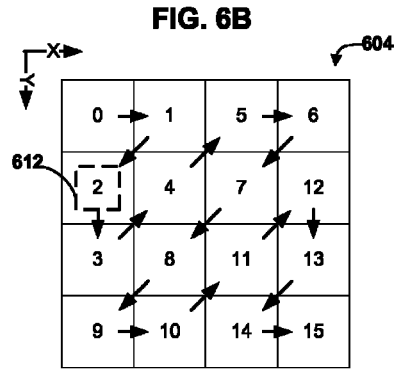

FIGS. 6A-6C are conceptual diagrams that illustrate examples of blocks of video data for which last significant coefficient position information is coded based on scanning order information, consistent with the techniques of this disclosure. As shown in FIG. 6A, block 600 may include sixteen block positions ordered from 0 to 15 according to the horizontal scanning order, as indicated by the arrows, and described above with reference to FIG. 5B. Each of the sixteen block positions may contain a quantized transform coefficient, as described above with reference to FIG. 4A. As also shown in FIG. 6A, a third position within block 600 according to the horizontal scanning order, corresponding to position "2," may be referred to as position 606. In this example, position 606 may be represented using x- and y-coordinates (2,0), where the x-coordinate equals "2," the y-coordinate equals "0," and a reference position, or "origin," corresponding to x- and y-coordinates (0,0), is located in the top left corner of block 600, i.e., the DC position, as described above. Assume for this example that position 606 corresponds to a position of a last significant coefficient within block 600 according to the horizontal scanning order.

Assume further that for block 600, there exist statistics that indicate a probability of a given position within block 600 corresponding to the position of the last significant coefficient within block 600 according to the horizontal scanning order. In particular, the statistics may indicate a probability of a coordinate, e.g., an x- or a y-coordinate, corresponding to the position of the last significant coefficient within the block according to the horizontal scanning order comprising a given value (e.g., "0," "1," "2," etc.). In other words, the statistics may indicate a probability of each of the x- and y-coordinates (2,0) previously described comprising a given value.

Furthermore, in some examples, the x- and y-coordinates may be coded based on the statistics, for example, by performing a context adaptive entropy coding process (e.g., a CABAC process) that includes applying a context model that includes the statistics based on at least one context. For example, the at least one context may include one of the x- and y-coordinates and the scanning order. In this example, the scanning order, e.g., the horizontal scanning order, may be used to select the particular context model that includes the statistics. Additionally, in cases where one coordinate (e.g., y-coordinate) is coded after another coordinate (e.g., x-coordinate), the coordinate may be coded using a value of the other, previously coded coordinate as a context. That is, a value of a previously coded one of the x- and y-coordinates may be used to further select statistics within the context model that indicate a probability of the other, presently coded coordinate comprising a given value.

Additionally, in some examples, the x- and y-coordinates may each be represented using a unary codeword comprising a sequence of one or more bins, i.e., "binarized." As such, to code the x- and y-coordinates based on the statistics, each bin of a codeword corresponding to a particular coordinate may be coded by performing the context adaptive entropy coding process. In this example, the statistics included in the context model, indicating a probability of the coordinate comprising a given value, may include probability estimates that indicate a probability of each bin of the codeword corresponding to the coordinate comprising a given value (e.g., "0" or "1"). Furthermore, the statistics may include different probability estimates for each bin of the codeword, depending on the position of the respective bin within the codeword.

As further shown in FIG. 6B, block 602 may also include sixteen block positions, once again ordered from 0 to 15, although, in this case, according to a vertical scanning order, as indicated by the arrows, and described above with reference to FIG. 5C. Each of the sixteen block positions may contain a quantized transform coefficient, as described above with reference to FIG. 4A. As also shown in FIG. 6B, a third position within block 602 according to the vertical scanning order, corresponding to position "2," may be referred to as position 608. In this example, position 608 may be represented using x- and y-coordinates (0,2), where the x-coordinate equals "0," the y-coordinate equals "2," and a reference position, or "origin," corresponding to x- and y-coordinates (0,0), is once again located in the top left corner of block 602, i.e., the DC position, as described above. Assume for this example that position 608 once again corresponds to a position of a last significant coefficient within block 602 according to the vertical scanning order.

In the examples of FIGS. 6A-6B, the horizontal scanning order of block 600 may be symmetrical with respect to the vertical scanning order of block 602, such that the probability of the x-coordinate, "2," of the position of the last significant coefficient within block 600 according to the horizontal scanning order comprising a given value may be the same as, or similar to the probability of the y-coordinate, "2," of the position of the last significant coefficient within block 602 according to the vertical scanning order comprising the same value, and vice versa. Similarly, the probability of the y-coordinate, "0," of the position of the last significant coefficient within block 600 according to the horizontal scanning order comprising a given value may be the same as, or similar to the probability of the x-coordinate, "0," of the position of the last significant coefficient within block 602 according to the vertical scanning order comprising the same value, and vice versa. That is, the x- and y-coordinates (2,0) of position 606 within block 600 may each have the same or similar probability of comprising a given value as interchanged x- and y-coordinates (0,2) of position 608 within block 602, respectively. As indicated by the dashed arrow in FIG. 6B, the interchanged x- and y-coordinates (0,2) of position 608 within block 602 may correspond to position 610 within block 602, which may be represented using x- and y-coordinates (2,0).

As such, in accordance with the techniques of this disclosure, common statistics that indicate the probability of a given position within block 600 corresponding to the position of the last significant coefficient within block 600 according to the horizontal scanning order may be used to code the x- and y-coordinates (2,0) of position 606 within block 600, as well as the interchanged x- and y-coordinates (0,2) of position 608 within block 602, as previously described.

As further shown in FIG. 6C, block 604 may also include sixteen block positions, once again ordered from 0 to 15, although, in this case, according to a zig-zag scanning order, as indicated by the arrows, and described above with reference to FIG. 5A. Each of the sixteen block positions may contain a quantized transform coefficient, as described above with reference to FIG. 4A. As also shown in FIG. 6C, a third position within block 604 according to the zig-zag scanning order, corresponding to position "2," may be referred to as position 612. In this example, position 612 may be represented using x- and y-coordinates (0,1), where the x-coordinate equals "0," the y-coordinate equals "1," and a reference position, or "origin," corresponding to x- and y-coordinates (0,0), is once again located in the top left corner of block 604, i.e., the DC position, as described above. Assume for this example that position 612 once again corresponds to a position of a last significant coefficient within block 604 according to the zig-zag scanning order.

In the example of FIG. 6C, the zig-zag scanning order of block 604 may not be symmetrical with respect to the horizontal or vertical scanning orders of blocks 600 and 602, respectively. As such, the identity or similarity of probabilities described above may not exists among the x- and y-coordinates corresponding to the position of the last significant coefficient within block 600 or block 602, and the x- and y-coordinates corresponding to the position of the last significant coefficient within block 604. Nevertheless, the x- and y-coordinates corresponding to the position of the last significant coefficient within blocks 604 may be coded using the common statistics described above with reference to the examples of FIGS. 6A-6B. For example, while using the common statistics to code the x- and y-coordinates may not accurately reflect the probability of the respective coordinates comprising particular values, coding the coordinates in this manner may nevertheless improve coding efficiency by using the common statistics, rather than separate statistics, thereby potentially reducing system complexity, as previously described.

Figure 7:
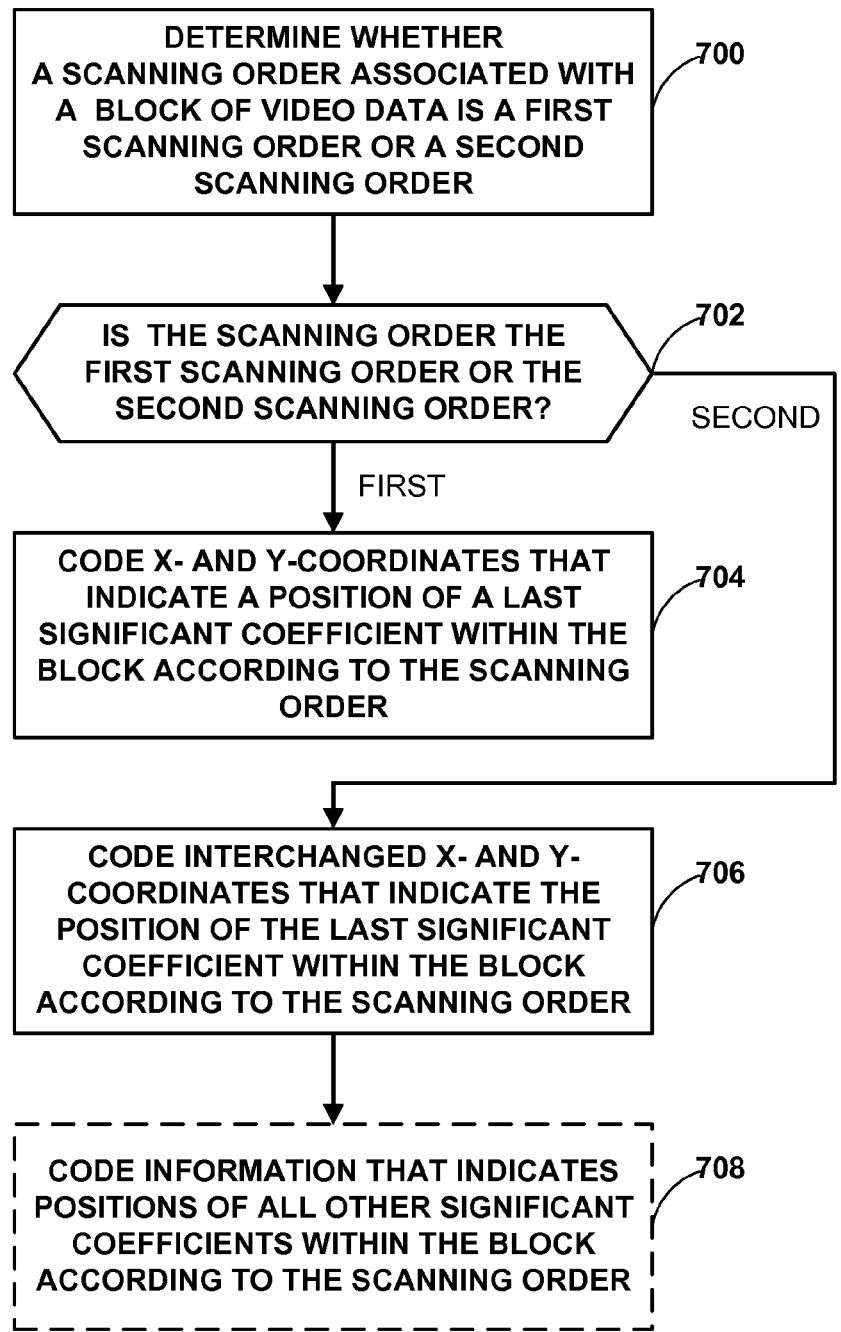
FIG. 7 is a flowchart that illustrates an example of a method for efficiently coding last significant coefficient position information based on scanning order information for a block of video data, consistent with the techniques of this disclosure.

FIG. 7 is a flowchart that illustrates an example of a method for efficiently coding last significant coefficient position information based on scanning order information for a block of video data, consistent with the techniques of this disclosure. The techniques of FIG. 7 may generally be performed by any processing unit or processor, whether implemented in hardware, software, firmware, or a combination thereof, and when implemented in software or firmware, corresponding hardware may be provided to execute instructions for the software or firmware. For purposes of example, the techniques of FIG. 7 are described with respect to video encoder 20 (FIGS. 1 and 2) and/or video decoder 30 (FIGS. 1 and 3), although it should be understood that other devices may be configured to perform similar techniques. Moreover, the steps illustrated in FIG. 7 may be performed in a different order or in parallel, and additional steps may be added and certain steps omitted, without departing from the techniques of this disclosure.

Initially, video encoder 20 and/or video decoder 30 may determine whether a scanning order associated with a block of video data is a first scanning order or a second scanning order (700). For example, the block may be a macroblock, or a TU of a CU, as previously described. Furthermore, the first scanning order and the second scanning order may be symmetrical with respect to one another (or at least partially symmetrical). For example, the first scanning order may be a horizontal scanning order and the second scanning order may be a vertical scanning order, wherein the horizontal scanning order and the vertical scanning order originate at a common position within the block, e.g., the DC position, as also previously described.

Specifically, the first scanning order and the second scanning order may each be a scanning order that may be used by video encoder 20 and/or video decoder 30 to code the block. For example, the first and second scanning orders may be scanning orders used by video encoder 20 to encode blocks of video data, and by video decoder 30 to decode the blocks, within corresponding coding system 10 comprising video encoder 20 and video decoder 30. In some examples, the first and second scanning orders may be only some of the scanning orders used within system 10 to code the blocks. In other examples, the first and second scanning orders may be the only scanning orders used within system 10 to code the blocks. In this manner, the example method of FIG. 7 may be applicable to any coding system that uses a plurality of scanning orders to code blocks of video data.

Video encoder 20 may make the determination whether the scanning order is the first scanning order or the second scanning order directly, e.g., as part of encoding the block. Video decoder 30 may make this determination by decoding scanning order information for the block. For example, video encoder 20 may encode the scanning order information as described in greater detail in the example method of FIG. 8, and video decoder 30 may decode the information, as also described in greater detail in the example method of FIG. 9.

In the event the scanning order is the first scanning order (702), video encoder 20 and/or video decoder 30 may further code x- and y-coordinates that indicate a position of a last significant coefficient within the block according to the scanning order (704), i.e., the last significant coefficient position information for the block. In the event the scanning order is the second scanning order (702), however, video encoder 20 and/or video decoder 30 may instead code interchanged x- and y-coordinates that indicate the position of the last significant coefficient within the block according to the scanning order (706). In this example, the interchanged x- and y-coordinates also correspond to the last significant coefficient position information for the block, but are further processed, i.e., interchanged, by video encoder 20 and/or video decoder 30 to enable coding the information more efficiently than when using other techniques, as previously described. Specifically, the interchanged x- and y-coordinates may enable using common statistics to code the x- and y-coordinates and the interchanged x- and y-coordinates that indicate the last significant coefficient position information for the block, as also previously described. In any case, the last significant coefficient position information for the block, whether represented using the x- and y-coordinates, or the interchanged x- and y-coordinates, may be encoded in the case of video encoder 20, and decoded in the case of video decoder 30.

To code the x- and y-coordinates and the interchanged x- and y-coordinates, video encoder 20 and/or video decoder 30 may further determine statistics that indicate a probability of a given position within the block corresponding to the position of the last significant coefficient within the block according to the scanning order, when the scanning order comprises the first scanning order. In particular, the statistics may indicate a probability of a coordinate, e.g., an x- or a y-coordinate, corresponding to the position of the last significant coefficient within the block according to the scanning order, when the scanning order comprises the first scanning order, comprising a given value (e.g., "0," "1," "2," etc.). In other words, the statistics may indicate a probability of each of the x- and y-coordinates previously described comprising a given value.

Because the first and second scanning orders may be symmetrical with respect to one another (or at least partially symmetrical), the probability of the x-coordinate comprising a given value when the scanning order comprises the first scanning order may be the same as, or similar to the probability of the y-coordinate comprising the same value when the scanning order comprises the second scanning order, and vice versa. Similarly, the probability of the y-coordinate comprising a given value when the scanning order comprises the first scanning order may be the same as, or similar to the probability of the x-coordinate comprising the same value when the scanning order comprises the second scanning order, and vice versa. That is, the x- and y-coordinates when the scanning order comprises the first scanning order may each have the same or similar probability of comprising a given value as the interchanged x- and y-coordinates, respectively, when the scanning order comprises the second scanning order. As such, the statistics may further indicate the probability of each of the interchanged x- and y-coordinates comprising a given value. In some examples, video encoder 20 and/or video decoder 30 may determine the statistics using last significant coefficient position information for previously coded blocks of video data, e.g., values of x- and y-coordinates and interchanged x- and y-coordinates for the previously coded blocks.

In this example, video encoder 20 and/or video decoder 30 may code the x- and y-coordinates and the interchanged x- and y-coordinates based on the statistics. For example, video encoder 20 and/or video decoder 30 may code the x- and y-coordinates and the interchanged x- and y-coordinates based on the statistics such that the probability of the x-coordinate comprising a given value is used to code the x-coordinate and the interchanged y-coordinate, and the probability of the y-coordinate comprising a given value is used to code the y-coordinate and the interchanged x-coordinate. Furthermore, video encoder 20 and/or video decoder 30 may update the statistics based on the x- and y-coordinates and the interchanged x- and y-coordinates to reflect the probability of the respective coordinates comprising particular values. In this example, the probability of the x-coordinate comprising a given value may be updated using the x-coordinate and the interchanged y-coordinate, and the probability of the y-coordinate comprising a given value may be updated using the y-coordinate and the interchanged x-coordinate. For example, the updated statistics may be used to code last significant coefficient position information for subsequently coded blocks of video data in the manner described above.

In some examples, to code the x- and y-coordinates and the interchanged x- and y-coordinates based on the statistics, video encoder 20 and/or video decoder 30 may perform a context adaptive entropy coding process (e.g., a CABAC process) that includes applying a context model that includes the statistics based on at least one context. For example, the at least one context may include one of the x- and y-coordinates, the interchanged x- and y-coordinates, and the scanning order. In this example, video encoder 20 and/or video decoder 30 may use the scanning order, e.g., the horizontal or vertical scanning order, to select the particular context model that includes the statistics. That is, video encoder 20 and/or video decoder 30 may select the same statistics to code the x- and y-coordinates when using the first scanning order to code the block, and to code the interchanged x- and y-coordinates when using the second scanning order to code the block.

Furthermore, in cases where one coordinate (e.g., y-coordinate) is coded after another coordinate (e.g., x-coordinate), video encoder 20 and/or video decoder 30 may code the coordinate using a value of the other, previously coded coordinate as a context. That is, a value of a previously coded one of the x- and y-coordinates or the interchanged x- and y-coordinates, depending on the scanning order used to code the block, may be used to further select statistics within the context model that indicate a probability of the other, presently coded coordinate comprising a given value. Video encoder 20 and/or video decoder 30 may then use the selected statistics to code the x- and y-coordinates and the interchanged x- and y-coordinates by performing the context adaptive entropy coding process.

In this example, the x- and y-coordinates and the interchanged x- and y-coordinates may each be represented using a unary codeword comprising a sequence of one or more bits, or bins, i.e., binarized. As such, to code the x- and y-coordinates and the interchanged x- and y-coordinates based on the statistics, video encoder 20 and/or video decoder 30 may code each bin of a codeword corresponding to a particular coordinate by performing the context adaptive entropy coding process. In this example, the statistics included in the context model, indicating a probability of the coordinate comprising a given value, may include probability estimates that indicate a probability of each bin of the codeword corresponding to the coordinate comprising a given value (e.g., "0" or "1"). Furthermore, the statistics may include different probability estimates for each bin of the codeword, depending on the position of the respective bin within the codeword. In some examples, video encoder 20 and/or video decoder 30 may determine the probability estimates using values of corresponding bins for previously coded blocks of video data, e.g., bins of codewords corresponding to x- and y-coordinates and interchanged x- and y-coordinates for the previously coded blocks, e.g., as part of determining the statistics based on the last significant coefficient position information for the previously coded blocks, as previously described. In other examples, video encoder 20 and/or video decoder 30 also may update the probability estimates using the value of each bin, e.g., as part of updating the statistics based on the x- and y-coordinates and the interchanged x- and y-coordinates, as also previously described. Video encoder 20 and/or video decoder 30 may use the probability estimates to code each bin by performing the context adaptive entropy coding process.

As another example, video encoder 20 and/or video decoder 30 may code the x- and y-coordinates and the interchanged x- and y-coordinates by coding at least one bin of the sequence corresponding to one of the coordinates by selecting the statistics from the context model based at least in part on a value of a corresponding bin of the sequence corresponding to the other coordinate. Furthermore, video encoder 20 and/or video decoder 30 may code the one or more bins of the sequence corresponding to the one coordinate and the one or more bins of the sequence corresponding to the other coordinate in an interleaved manner.

Finally, in some examples, video encoder 20 and/or video decoder 30 may code information that indicates positions of all other significant coefficients within the block according to the scanning order (708), i.e., the significant coefficient position information for the block. For example, the significant coefficient position information for the block may be represented using a sequence of significant coefficient flags, as previously described. As also previously described, the significant coefficient position information may be coded by coding each significant coefficient flag of the sequence by performing a context adaptive entropy coding process (e.g., a CABAC process) that includes applying a context model based on a context, wherein the context may include a position of the flag within the block according to the scanning order.

In this example, the context model may include probability estimates that indicate a probability of each flag comprising a given value (e.g., "0" or "1"). In some examples, video encoder 20 and/or video decoder 30 may determine the probability estimates using values of corresponding significant coefficient flags for previously coded blocks of video data. In other examples, video encoder 20 and/or video decoder 30 also may update the probability estimates using the value of each flag to reflect the probability of the flag comprising a given value. For example, the updated probability estimates may be used to code significant coefficient position information for subsequently coded blocks of video data in the manner described above.

In this manner, the method of FIG. 7 represents an example of a method of coding x- and y-coordinates that indicate a position of a last non-zero coefficient within a block of video data according to a scanning order associated with the block when the scanning order comprises a first scanning order, and coding interchanged x- and y-coordinates that indicate the position of the last non-zero coefficient within the block according to the scanning order when the scanning order comprises a second scanning order, wherein the second scanning order is different than the first scanning order.

Figure 8:
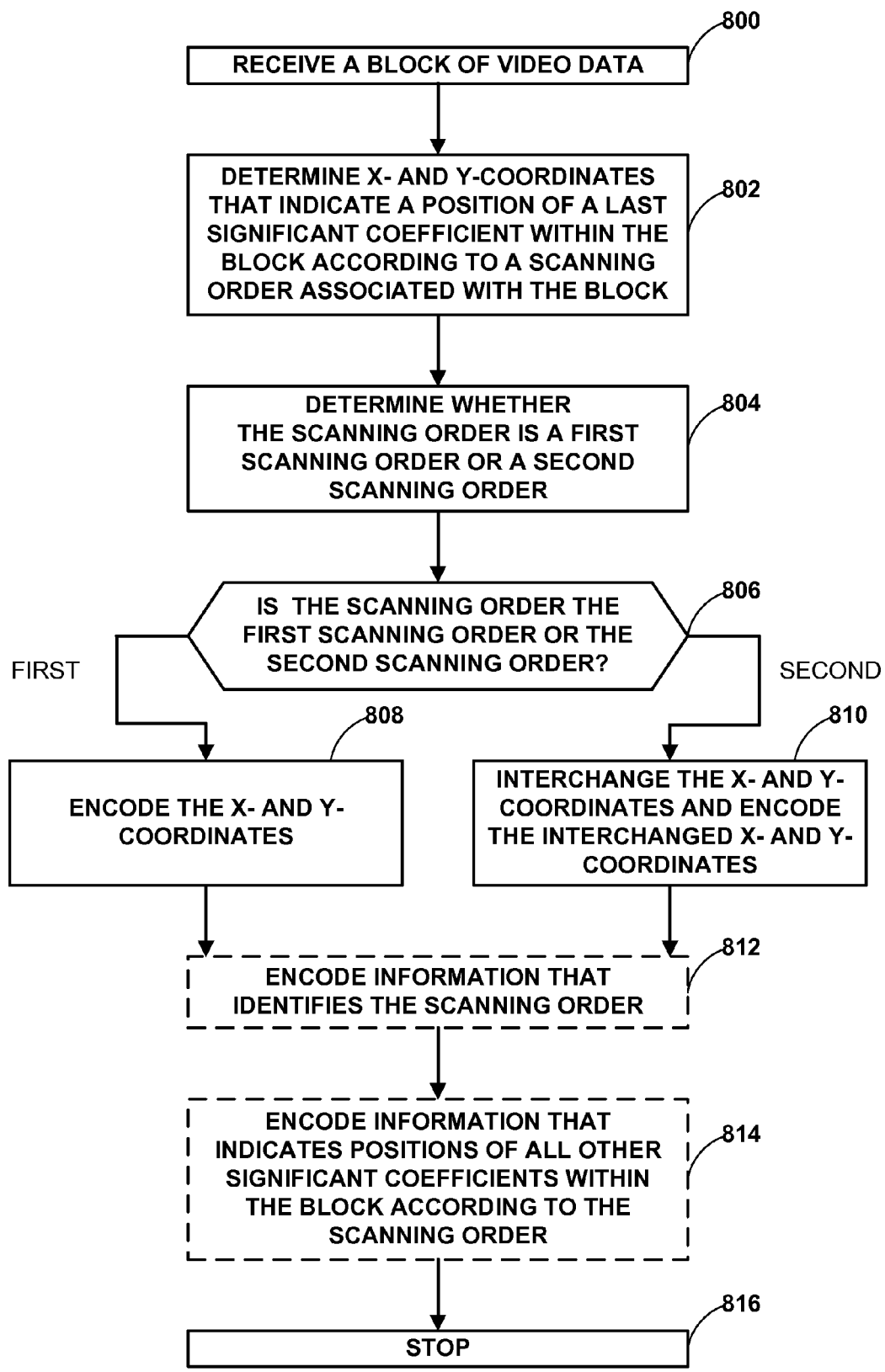
FIG. 8 is a flowchart that illustrates an example of a method for efficiently encoding last significant coefficient position information based on scanning order information for a block of video data, consistent with the techniques of this disclosure.

FIG. 8 is a flowchart that illustrates an example of a method for efficiently encoding last significant coefficient position information based on scanning order information for a block of video data, consistent with the techniques of this disclosure. The techniques of FIG. 8 may generally be performed by any processing unit or processor, whether implemented in hardware, software, firmware, or a combination thereof, and when implemented in software or firmware, corresponding hardware may be provided to execute instructions for the software or firmware. For purposes of example, the techniques of FIG. 8 are described with respect to entropy encoding unit 56 (FIG. 2), although it should be understood that other devices may be configured to perform similar techniques. Moreover, the steps illustrated in FIG. 8 may be performed in a different order or in parallel, and additional steps may be added and certain steps omitted, without departing from the techniques of this disclosure.

Initially, entropy encoding unit 56 may receive a block of video data (800). For example, the block may be a macroblock, or a TU of a CU, as previously described. Entropy encoding unit 56 may further determine x- and y-coordinates that indicate a position of a last significant coefficient within the block according to a scanning order associated with the block (802), i.e., the last significant coefficient position information for the block. For example, the scanning order may be a scanning order used by entropy encoding unit 56 to encode the block, and may be one of a plurality of scanning orders originating at a common position within the block, as previously described. As also previously described, the common position may correspond to the DC position. Furthermore, the x- and y-coordinates may each be represented using a unary codeword comprising a sequence of one or more bins.

Entropy encoding unit 56 may further determine whether the scanning order is a first scanning order or a second scanning order (804). For example, the first and second scanning orders may be scanning orders that may be used by entropy encoding unit 56 to encode blocks of video data within corresponding coding system 10 comprising video encoder 20 and video decoder 30, as previously described. In some examples, the first and second scanning orders may be only some of the scanning orders that may be used within system 10 to code the blocks. In other examples, the first and second scanning orders may be the only scanning orders used within system 10 to code the blocks. As previously described, the first and second scanning orders may be symmetrical with respect to one another (or at least partially symmetrical). For example, the first scanning order may be the horizontal scanning order, and the second scanning order may be the vertical scanning order. Entropy encoding unit 56 may make the determination whether the scanning order is the first scanning order or the second scanning order directly, e.g., as part of encoding the block.

In the event the scanning order is the first scanning order (806), entropy encoding unit 56 may further encode the x- and y-coordinates (808). In the event the scanning order is the second scanning order (806), however, entropy encoding unit 56 may instead interchange the x- and y-coordinates, and encode the interchanged x- and y-coordinates (810). As previously described, the interchanged x- and y-coordinates also correspond to the last significant coefficient position information for the block, but are further processed, i.e., interchanged, by entropy encoding unit 56 to enable encoding the information more efficiently than when using other techniques. Specifically, the interchanged x- and y-coordinates may enable using common statistics to encode the x- and y-coordinates and the interchanged x- and y-coordinates that indicate the last significant coefficient position information for the block, as also previously described. In any case, entropy encoding unit 56 may encode the last significant coefficient position information for the block, whether represented as the x- and y-coordinates or the interchanged x- and y-coordinates.

To encode the x- and y-coordinates and the interchanged x- and y-coordinates, entropy encoding unit 56 may further determine statistics that indicate a probability of a given position within the block corresponding to the position of the last significant coefficient within the block according to the scanning order, when the scanning order comprises the first scanning order. In particular, the statistics may indicate a probability of a coordinate, e.g., an x- or a y-coordinate, corresponding to the position of the last significant coefficient within the block according to the scanning order, when the scanning order comprises the first scanning order, comprising a given value (e.g., "0," "1," "2," etc.). In other words, the statistics may indicate a probability of each of the x- and y-coordinates previously described comprising a given value.

Because the first and second scanning orders may be symmetrical with respect to one another (or at least partially symmetrical), the probability of the x-coordinate comprising a given value when the scanning order comprises the first scanning order may be the same as, or similar to the probability of the y-coordinate comprising the same value when the scanning order comprises the second scanning order, and vice versa. Similarly, the probability of the y-coordinate comprising a given value when the scanning order comprises the first scanning order may be the same as, or similar to the probability of the x-coordinate comprising the same value when the scanning order comprises the second scanning order, and vice versa. That is, the x- and y-coordinates when the scanning order comprises the first scanning order may each have the same or similar probability of comprising a given value as the interchanged x- and y-coordinates, respectively, when the scanning order comprises the second scanning order. As such, the statistics may further indicate the probability of each of the interchanged x- and y-coordinates comprising a given value. In some examples, entropy encoding unit 56 may determine the statistics using last significant coefficient position information for previously encoded blocks of video data, e.g., values of x- and y-coordinates and interchanged x- and y-coordinates for the previously encoded blocks.

In this example, entropy encoding unit 56 may encode the x- and y-coordinates and the interchanged x- and y-coordinates based on the statistics. For example, entropy encoding unit 56 may encode the x- and y-coordinates and the interchanged x- and y-coordinates based on the statistics such that the probability of the x-coordinate comprising a given value is used to encode the x-coordinate and the interchanged y-coordinate, and the probability of the y-coordinate comprising a given value is used to encode the y-coordinate and the interchanged x-coordinate. Furthermore, entropy encoding unit 56 may update the statistics based on the x- and y-coordinates and the interchanged x- and y-coordinates to reflect the probability of the respective coordinates comprising particular values. In this example, the probability of the x-coordinate comprising a given value may be updated using the x-coordinate and the interchanged y-coordinate, and the probability of the y-coordinate comprising a given value may be updated using the y-coordinate and the interchanged x-coordinate. For example, the updated statistics may be used to encode last significant coefficient position information for subsequently encoded blocks of video data in the manner described above.

In some examples, to encode the x- and y-coordinates and the interchanged x- and y-coordinates based on the statistics, entropy encoding unit 56 may perform a context adaptive entropy coding process (e.g., a CABAC process) that includes applying a context model that includes the statistics based on at least one context. For example, the at least one context may include one of the x- and y-coordinates, the interchanged x- and y-coordinates, and the scanning order. In this example, entropy encoding unit 56 may use the scanning order, e.g., the horizontal or vertical scanning order, to select the particular context model that includes the statistics. That is, entropy encoding unit 56 may select the same statistics to encode the x- and y-coordinates when using the first scanning order to encode the block, and to encode the interchanged x- and y-coordinates when using the second scanning order to encode the block.

Furthermore, in cases where one coordinate (e.g., y-coordinate) is encoded after another coordinate (e.g., x-coordinate), entropy encoding unit 56 may encode the coordinate using a value of the other, previously encoded coordinate as a context. That is, a value of a previously encoded one of the x- and y-coordinates or the interchanged x- and y-coordinates, depending on the scanning order used to encode the block, may be used to further select statistics within the context model that indicate a probability of the other, presently encoded coordinate comprising a given value. Entropy encoding unit 56 may then use the selected statistics to encode the x- and y-coordinates and the interchanged x- and y-coordinates by performing the context adaptive entropy coding process.

In this example, the x- and y-coordinates and the interchanged x- and y-coordinates may each be represented using a unary codeword comprising a sequence of one or more bins, i.e., binarized. As such, to encode the x- and y-coordinates and the interchanged x- and y-coordinates based on the statistics, entropy encoding unit 56 may encode each bin of a codeword corresponding to a particular coordinate by performing the context adaptive entropy coding process. In this example, the statistics included in the context model, indicating a probability of the coordinate comprising a given value, may include probability estimates that indicate a probability of each bin of the codeword corresponding to the coordinate comprising a given value (e.g., "0" or "1"). Furthermore, the statistics may include different probability estimates for each bin of the codeword, depending on the position of the respective bin within the codeword. In some examples, entropy encoding unit 56 may determine the probability estimates using values of corresponding bins for previously encoded blocks of video data, e.g., bins of codewords corresponding to x- and y-coordinates and interchanged x- and y-coordinates for the previously encoded blocks, e.g., as part of determining the statistics based on the last significant coefficient position information for the previously encoded blocks, as previously described. In other examples, entropy encoding unit 56 also may update the probability estimates using the value of each bin, e.g., as part of updating the statistics based on the x- and y-coordinates and the interchanged x- and y-coordinates, as also previously described. Entropy encoding unit 56 may use the probability estimates to encode each bin by performing the context adaptive entropy coding process.

As previously described, as another example, entropy encoding unit 56 may encode the x- and y-coordinates and the interchanged x- and y-coordinates by encoding at least one bin of the sequence corresponding to one of the coordinates by selecting the statistics from the context model based at least in part on a value of a corresponding bin of the sequence corresponding to the other coordinate. Furthermore, entropy encoding unit 56 may encode the one or more bins of the sequence corresponding to the one coordinate and the one or more bins of the sequence corresponding to the other coordinate in an interleaved manner.

In any case, entropy encoding unit 56 may further encode information that identifies the scanning order (812), i.e., the scanning order information for the block. In some examples, where the scanning order includes one of two scanning orders used within system 10 to code blocks of video data, entropy encoding unit 56 may encode the scanning order information using a single bin. For example, entropy encoding unit 56 may encode the single bin to indicate whether the scanning order is a first scanning order (e.g., bin="0") or a second scanning order (bin="1"). In other examples, where the scanning order includes one of three scanning orders that may be used by system 10 to code blocks of video data, entropy encoding unit 56 may encode the scanning order information using between one and two bins. For example, entropy encoding unit 56 may encode a first bin to indicate whether the scanning order is a first scanning order (e.g., bin1="0" if the scanning order is the first scanning order, and bin1="1" otherwise). In the event the first bin indicates that the scanning order is not the first scanning order, entropy encoding unit 56 may encode a second bin to indicate whether the scanning order is a second scanning order (e.g., bin2="0"), or a third scanning order (e.g., bin2="1"). In other examples, other methods of encoding the scanning order information for the block may be used, including using other values of bins. In some examples, entropy encoding unit 56 may signal each bin directly in the bitstream. In other examples, entropy encoding unit 56 may further encode each bin using a context adaptive entropy coding process (e.g., a CABAC process) in a similar manner as described above with reference to encoding bins of a codeword corresponding to one of the x- and y-coordinates and the interchanged x- and y-coordinates. Alternatively, as previously described, entropy encoding unit 56 may omit encoding the scanning order information for the block when entropy encoding unit 56 uses an adaptive scanning order to encode the block.

In some examples, entropy encoding unit 56 may further encode information that indicates positions of all other significant coefficients within the block according to the scanning order (814), i.e., the significant coefficient position information for the block. As previously described, for example, the significant coefficient position information for the block may be represented using a sequence of significant coefficient flags. As also previously described, the significant coefficient position information may be encoded by encoding each significant coefficient flag of the sequence by performing a context adaptive entropy coding process (e.g., a CABAC process) that includes applying a context model based on a context, wherein the context may include a position of the flag within the block according to the scanning order.

The context model may include probability estimates that indicate a probability of each flag comprising a given value (e.g., "0" or "1"). In some examples, entropy encoding unit 56 may determine the probability estimates using values of corresponding significant coefficient flags for previously encoded blocks of video data. In other examples, entropy encoding unit 56 also may update the probability estimates using the value of each flag to reflect the probability of the flag comprising a given value. For example, the updated probability estimates may be used to encode significant coefficient position information for subsequently encoded blocks of video data in the manner described above.

Finally, entropy encoding unit 56 may stop encoding the last significant coefficient position information based on the scanning order information for the block (816). For example, entropy encoding unit 56 may proceed to other coding tasks, e.g., encoding of other syntax elements for the block, or a subsequent block, as described above.

In this manner, the method of FIG. 8 represents an example of a method of coding x- and y-coordinates that indicate a position of a last non-zero coefficient within a block of video data according to a scanning order associated with the block when the scanning order comprises a first scanning order, and coding interchanged x- and y-coordinates that indicate the position of the last non-zero coefficient within the block according to the scanning order when the scanning order comprises a second scanning order, wherein the second scanning order is different than the first scanning order.

Figure 9:
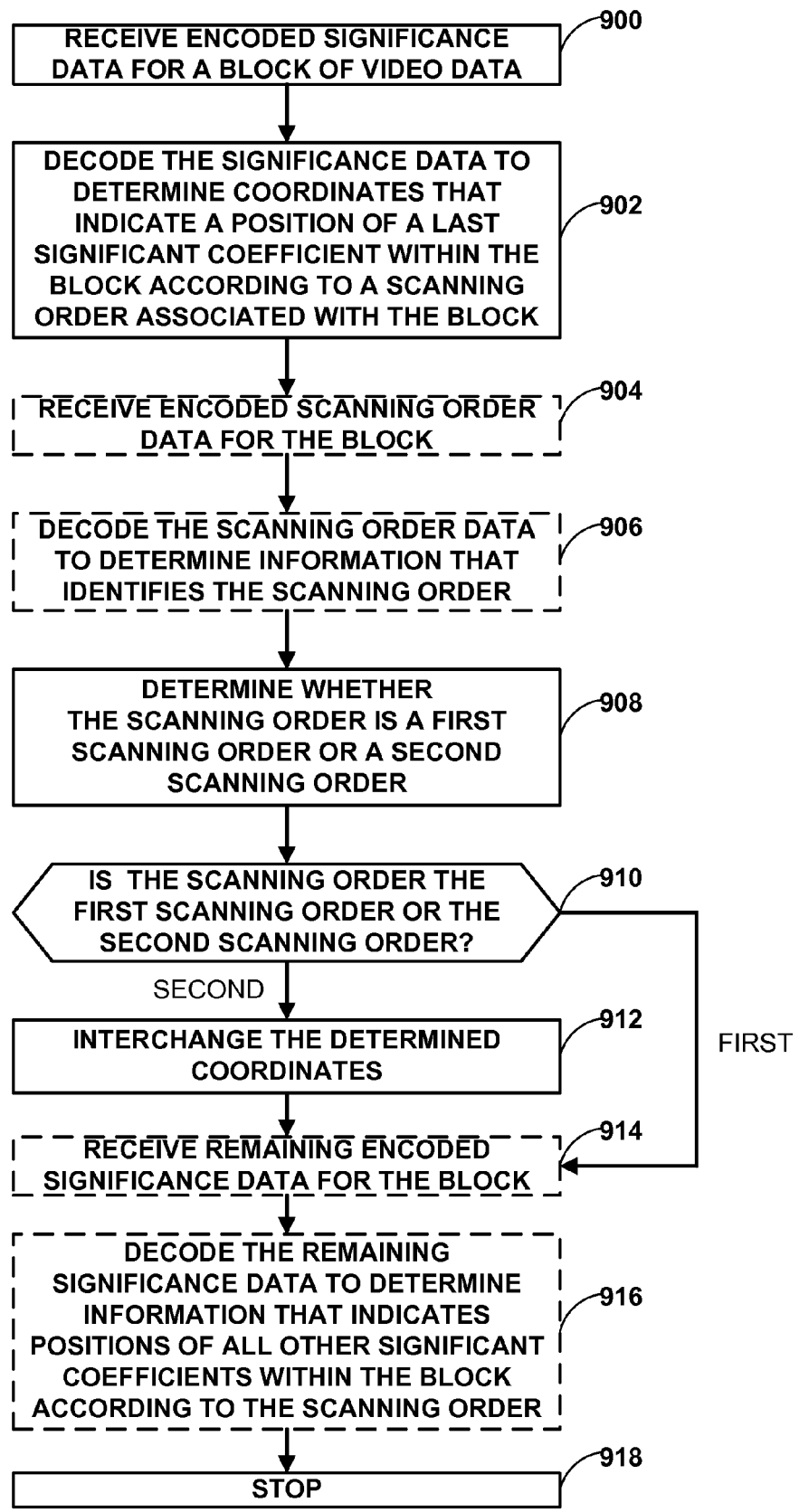
FIG. 9 is a flowchart that illustrates an example of a method for efficiently decoding encoded last significant coefficient position information based on scanning order information for a block of video data, consistent with the techniques of this disclosure.

FIG. 9 is a flowchart that illustrates an example of a method for efficiently decoding encoded last significant coefficient position information based on scanning order information for a block of video data, consistent with the techniques of this disclosure. The techniques of FIG. 9 may generally be performed by any processing unit or processor, whether implemented in hardware, software, firmware, or a combination thereof, and when implemented in software or firmware, corresponding hardware may be provided to execute instructions for the software or firmware. For purposes of example, the techniques of FIG. 9 are described with respect to entropy decoding unit 70 (FIG. 3), although it should be understood that other devices may be configured to perform similar techniques. Moreover, the steps illustrated in FIG. 9 may be performed in a different order or in parallel, and additional steps may be added and certain steps omitted, without departing from the techniques of this disclosure.

Initially, entropy decoding unit 70 may receive encoded significance data for a block of video data (900). For example, the block may be a macroblock, or a TU of a CU, as previously described. Entropy decoding unit 70 may further decode the significance data to determine coordinates that indicate a position of a last significant coefficient within the block according to a scanning order associated with the block (902), i.e., the last significant coefficient position information for the block. The scanning order may be a scanning order used by an entropy encoding unit, e.g., entropy encoding unit 56 of FIG. 2, to encode the block, and may be one of a plurality of scanning orders originating at a common position within the block, as previously described. As also previously described, the common position may correspond to the DC position. Furthermore, the determined coordinates may each be represented using a unary codeword comprising a sequence of one or more bins.

As described above with reference to the example of FIG. 8, the determined coordinates may correspond to x- and y-coordinates or interchanged x- and y-coordinates that indicate the position of the last significant coefficient within the block according to the scanning order, depending on the scanning order. For example, the coordinates may correspond to the x- and y-coordinates when the scanning order comprises a first scanning order, and to the interchanged x- and y-coordinates when the scanning order comprises a second scanning order. The x- and y-coordinates and the interchanged x- and y-coordinates correspond to the last significant coefficient position information for the block, but the interchanged x- and y-coordinates are further processed, i.e., interchanged, to enable coding the information more efficiently than when using other techniques. Specifically, the interchanged x- and y-coordinates may enable using common statistics to code the x- and y-coordinates and the interchanged x- and y-coordinates that indicate the last significant coefficient position information for the block, as also previously described.

In any case, in a similar manner as previously described with reference to the example of entropy encoding unit 56 of FIG. 8, to decode the significance data to determine the coordinates, entropy decoding unit 70 may further determine statistics that indicate a probability of a given position within the block corresponding to the position of the last significant coefficient within the block according to the scanning order, when the scanning order comprises the first scanning order. In particular, the statistics may indicate a probability of a coordinate, e.g., an x- or a y-coordinate, corresponding to the position of the last significant coefficient within the block according to the scanning order, when the scanning order comprises the first scanning order, comprising a given value (e.g., "0," "1," "2," etc.). In other words, the statistics may indicate a probability of each of the x- and y-coordinates previously described comprising a given value.

Because the first and second scanning orders may be symmetrical with respect to one another (or at least partially symmetrical), the probability of the x-coordinate comprising a given value when the scanning order comprises the first scanning order may be the same as, or similar to the probability of the y-coordinate comprising the same value when the scanning order comprises the second scanning order, and vice versa. Similarly, the probability of the y-coordinate comprising a given value when the scanning order comprises the first scanning order may be the same as, or similar to the probability of the x-coordinate comprising the same value when the scanning order comprises the second scanning order, and vice versa. That is, the x- and y-coordinates when the scanning order comprises the first scanning order may each have the same or similar probability of comprising a given value as the interchanged x- and y-coordinates, respectively, when the scanning order comprises the second scanning order. As such, the statistics may further indicate the probability of each of the interchanged x- and y-coordinates comprising a given value. In some examples, entropy decoding unit 70 may determine the statistics using last significant coefficient position information for previously decoded blocks of video data, e.g., values of x- and y-coordinates and interchanged x- and y-coordinates for the previously decoded blocks.

In this example, entropy decoding unit 70 may decode the significance data to determine the coordinates, i.e., the x- and y-coordinates, or the interchanged x- and y-coordinates, based on the statistics. For example, entropy decoding unit 70 may decode the significance data to determine the x- and y-coordinates or the interchanged x- and y-coordinates based on the statistics such that the probability of the x-coordinate comprising a given value is used to decode the significance data to determine the x-coordinate and the interchanged y-coordinate, and the probability of the y-coordinate comprising a given value is used to decode the significance data to determine the y-coordinate and the interchanged x-coordinate. Furthermore, entropy decoding unit 70 may update the statistics based on the x- and y-coordinates and the interchanged x- and y-coordinates to reflect the probability of the respective coordinates comprising particular values. In this example, the probability of the x-coordinate comprising a given value may be updated using the x-coordinate and the interchanged y-coordinate, and the probability of the y-coordinate comprising a given value may be updated using the y-coordinate and the interchanged x-coordinate. For example, the updated statistics may be used to decode significance data to determine significant coefficient position information for subsequently decoded blocks of video data in the manner described above.

In some examples, to decode the significance data to determine the x- and y-coordinates or the interchanged x- and y-coordinates based on the statistics, entropy decoding unit 70 may perform a context adaptive entropy coding process (e.g., a CABAC process) that includes applying a context model that includes the statistics based on at least one context. For example, the at least one context may include one of the x- and y-coordinates, the interchanged x- and y-coordinates, and the scanning order. In this example, entropy decoding unit 70 may use the scanning order, e.g., the horizontal or vertical scanning order, to select the particular context model that includes the statistics. That is, entropy decoding unit 70 may select the same statistics to decode the significance data to determine the x- and y-coordinates when using the first scanning order to decode the block, and to determine the interchanged x- and y-coordinates when using the second scanning order to decode the block.

The x- and y-coordinates and the interchanged x- and y-coordinates may each be represented using a unary codeword comprising a sequence of one or more bins, i.e., binarized. As such, to decode the significance data to determine the x- and y-coordinates, or the interchanged x- and y-coordinates based on the statistics, entropy decoding unit 70 may decode the significance data to determine each bin of a codeword corresponding to a particular coordinate by performing the context adaptive entropy coding process. In this example, the statistics included in the context model, indicating a probability of the coordinate comprising a given value, may include probability estimates that indicate a probability of each bin of the codeword corresponding to the coordinate comprising a given value (e.g., "0" or "1"). Furthermore, the statistics may include different probability estimates for each bin of the codeword, depending on the position of the respective bin within the codeword. In some examples, entropy decoding unit 70 may determine the probability estimates using values of corresponding bins for previously decoded blocks of video data, e.g., bins of codewords corresponding to x- and y-coordinates and interchanged x- and y-coordinates for the previously decoded blocks, e.g., as part of determining the statistics based on the last significant coefficient position information for the previously decoded blocks, as previously described. In other examples, entropy decoding unit 70 also may update the probability estimates using the value of each bin, e.g., as part of updating the statistics based on the x- and y-coordinates and the interchanged x- and y-coordinates, as also previously described. Entropy decoding unit 70 may use the probability estimates to decode the significance data to determine each bin by performing the context adaptive entropy coding process.

As previously described, as another example, entropy decoding unit 70 may decode the x- and y-coordinates and the interchanged x- and y-coordinates by decoding at least one bin of the sequence corresponding to one of the coordinates by selecting the statistics from the context model based at least in part on a value of a corresponding bin of the sequence corresponding to the other coordinate. Furthermore, entropy decoding unit 70 may decode the one or more bins of the sequence corresponding to the one coordinate and the one or more bins of the sequence corresponding to the other coordinate in an interleaved manner.

Entropy decoding unit 70 may further receive encoded scanning order data for the block (904). Entropy decoding unit 70 may further decode the scanning order data to determine information that identifies the scanning order (906), i.e., the scanning order information for the block. Alternatively, as previously described, entropy decoding unit 70 may not receive and decode the encoded the scanning order data for the block when entropy decoding unit 70 uses an adaptive scanning order to decode the block. In an y case, entropy decoding unit 70 may further determine whether the scanning order is a first scanning order or a second scanning order (908). For example, the first and second scanning orders may be scanning orders that may be used by entropy decoding unit 70 to decode blocks of video data within corresponding coding system 10 comprising video encoder 20 and video decoder 30, as previously described. The first and second scanning orders may be only some of the scanning orders that may be used within system 10 to code the blocks. In other examples, the first and second scanning orders may be the only scanning orders used within system 10 to code the blocks. In some cases, the first and second scanning orders may be symmetrical with respect to one another (or at least partially symmetrical). For example, the first scanning order may be a horizontal scanning order, and the second scanning order may be a vertical scanning order. Entropy decoding unit 70 may make the determination whether the scanning order is the first scanning order or the second scanning order using the determined scanning order information for the block.

In the event the scanning order is the first scanning order (910), entropy decoding unit 70 may continue to decode the block using the determined x- and y-coordinates. In some examples, entropy decoding unit 70 may further receive remaining encoded significance data for the block (914). Entropy decoding unit 70 may further decode the remaining significance data to determine information that indicates positions of all other significant coefficients within the block according to the scanning order (916), i.e., the significant coefficient position information for the block. As previously described, for example, the significant coefficient position information for the block may be represented using a sequence of significant coefficient flags. As also previously described, the remaining significance data may be decoded to determine the significant coefficient position information by decoding the remaining significance data to determine each significant coefficient flag of the sequence by performing a context adaptive entropy coding process (e.g., a CABAC process) that includes applying a context model based on a context, wherein the context may include a position of the flag within the block according to the scanning order.

The context model may include probability estimates that indicate a probability of each flag comprising a given value (e.g., "0" or "1"). In some examples, entropy decoding unit 70 may determine the probability estimates using values of corresponding significant coefficient flags for previously decoded blocks of video data. In other examples, entropy decoding unit 70 also may update the probability estimates using the value of each flag to reflect the probability of the flag comprising a given value. For example, the updated probability estimates may be used to decode remaining significance data to determine significant coefficient position information for subsequently decoded blocks of video data in the manner described above.

In the event the scanning order is the second scanning order (910), however, entropy decoding unit 70 may interchange the determined x- and y-coordinates (912), and continue to decode the block using the interchanged x- and y-coordinates in a similar manner as described above with reference to steps (914) and (916). As previously described, the x- and y-coordinates and the interchanged x- and y-coordinates correspond to the last significant coefficient position information for the block, but the interchanged x- and y-coordinates are further processed to enable coding the information more efficiently than when using other techniques.

Finally, entropy decoding unit 70 may stop decoding the last significant coefficient position information based the scanning order information for the block (918). For example, entropy decoding unit 70 may proceed to other coding tasks, e.g., decoding of other syntax elements for the block, or a subsequent block, as described above.

In this manner, the method of FIG. 9 represents an example of a method of coding x- and y-coordinates that indicate a position of a last non-zero coefficient within a block of video data according to a scanning order associated with the block when the scanning order comprises a first scanning order, and coding interchanged x- and y-coordinates that indicate the position of the last non-zero coefficient within the block according to the scanning order when the scanning order comprises a second scanning order, wherein the second scanning order is different than the first scanning order.

Figure 10:
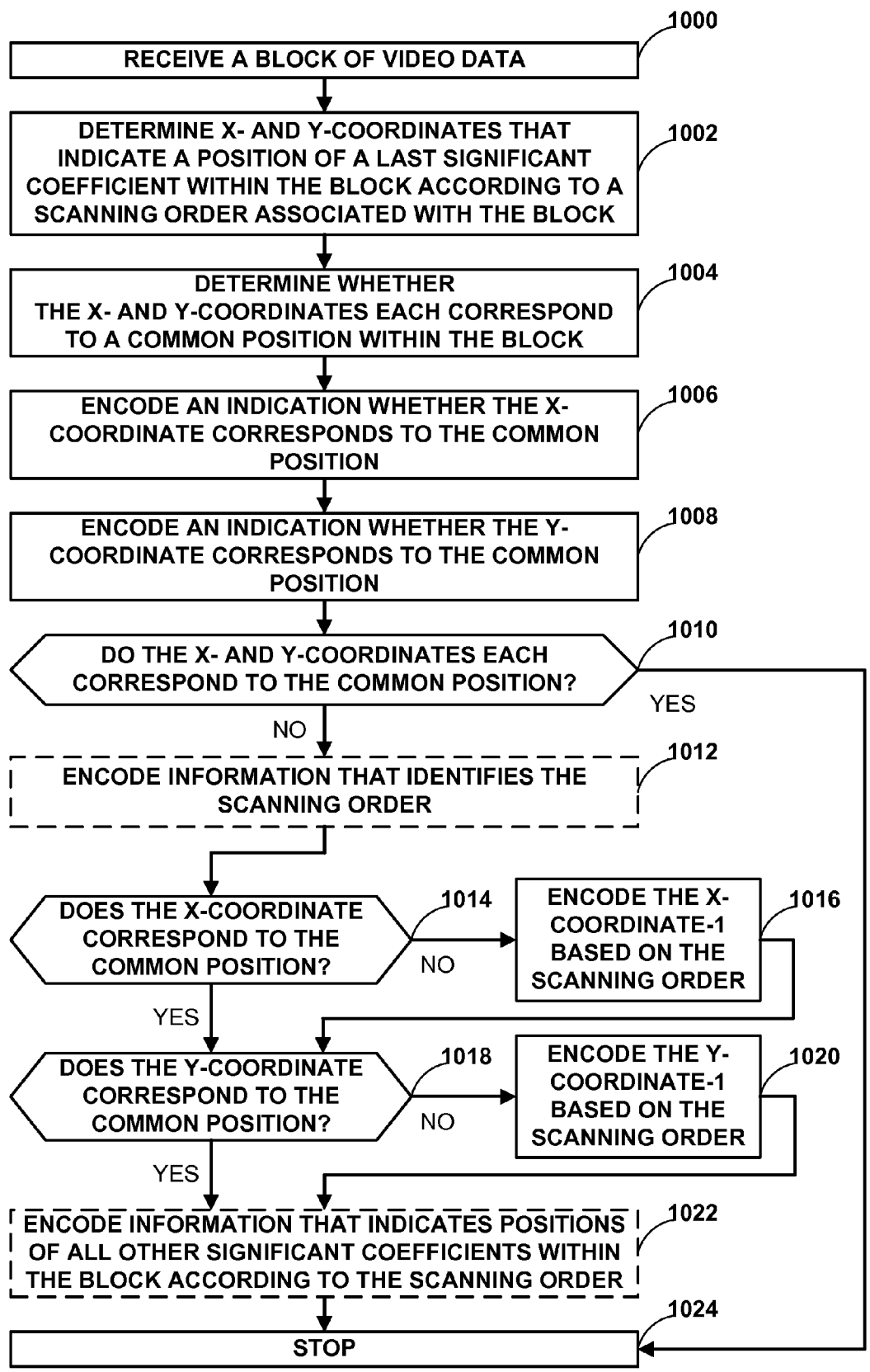
FIG. 10 is a flowchart that illustrates another example of a method for efficiently encoding last significant coefficient position information based on scanning order information for a block of video data, consistent with the techniques of this disclosure.

FIG. 10 is a flowchart that illustrates another example of a method for efficiently encoding last significant coefficient position information based on scanning order information for a block of video data, consistent with the techniques of this disclosure. The techniques of FIG. 10 may generally be performed by any processing unit or processor, whether implemented in hardware, software, firmware, or a combination thereof, and when implemented in software or firmware, corresponding hardware may be provided to execute instructions for the software or firmware. For purposes of example, the techniques of FIG. 10 are described with respect to entropy encoding unit 56 (FIG. 2), although it should be understood that other devices may be configured to perform similar techniques. Moreover, the steps illustrated in FIG. 10 may be performed in a different order or in parallel, and additional steps may be added and certain steps omitted, without departing from the techniques of this disclosure.

Initially, entropy encoding unit 56 may receive a block of video data (1000). For example, the block may be a macroblock, or a TU of a CU, as previously described. Entropy encoding unit 56 may further determine x- and y-coordinates that indicate a position of a last significant coefficient within the block according to a scanning order associated with the block (1002), i.e., the last significant coefficient position information for the block. For example, the scanning order may be a scanning order used by entropy encoding unit 56 to encode the block, and may be one of a plurality of scanning orders used to code blocks of video data within corresponding coding system 10 comprising video encoder 20 and video decoder 30. For example, each of the plurality of scanning orders may originate at a common position within the block, e.g., the DC position. Furthermore, as also previously described, the x- and y-coordinates may each be represented using a unary codeword comprising a sequence of one or more bins.

Entropy encoding unit 56 may further determine whether the x- and y-coordinates each correspond to a common position within the block (1004). The common position may correspond to the DC position. Entropy encoding unit 56 may make the above determination directly, e.g., as part of determining the x- and y-coordinates, as described above.

Entropy encoding unit 56 may further encode an indication whether the x-coordinate corresponds to the common position (1006). Similarly, entropy encoding unit 56 may further encode an indication whether the y-coordinate corresponds to the common position (1008). Entropy encoding unit 56 may encode each indication using a single bin. For example, entropy encoding unit 56 may encode a first bin that indicates whether the x-coordinate corresponds to the common position (e.g., bin1="1") or otherwise (bin1="0"), and a second bin that indicates whether the y-coordinate corresponds to the common position (e.g., bin2="1") or otherwise (bin2="0"). In some examples, entropy encoding unit 56 may signal each bin directly in the bitstream. In other examples, entropy encoding unit 56 may further encode each bin using a context adaptive entropy coding process in a similar manner as described above with reference to FIGS. 7-9, e.g., by performing a CABAC process that includes applying a context model based on a context.

In the event the x- and y-coordinates each correspond to the common position (1010), entropy encoding unit 56 may stop encoding the last significant coefficient position information based on the scanning order information for the block (1024). In other words, in cases where the x- and y-coordinates each correspond to the common position, no additional significant coefficients beyond the last (and only) significant coefficient within the block according to the scanning order exist within the block. In such cases, entropy encoding unit 56 does not need to encode any additional last significant coefficient position information, or any scanning order information or significant coefficient position information, for the block. In such cases, entropy encoding unit 56 may proceed to other coding tasks, e.g., encoding of other syntax elements for the block, or a subsequent block.

In the event the x- and y-coordinates do not each correspond to the common position (1010), entropy encoding unit 56 may further encode information that identifies the scanning order (1012), i.e., the scanning order information for the block. In some examples, where the scanning order includes one of two scanning orders used within system 10 to code blocks of video data, entropy encoding unit 56 may encode the scanning order information using a single bin. For example, entropy encoding unit 56 may encode the single bin to indicate whether the scanning order is a first scanning order (e.g., bin="0") or a second scanning order (bin="1"). In other examples, where the scanning order includes one of three scanning orders that may be used by system 10 to code blocks of video data, entropy encoding unit 56 may encode the scanning order information using between one and two bins. For example, entropy encoding unit 56 may encode a first bin to indicate whether the scanning order is a first scanning order (e.g., bin1="0" if the scanning order is the first scanning order, and bin1="1" otherwise). In the event the first bin indicates that the scanning order is not the first scanning order, entropy encoding unit 56 may encode a second bin to indicate whether the scanning order is a second scanning order (e.g., bin2="0"), or a third scanning order (e.g., bin2="1"). In other examples, other methods of encoding the scanning order information for the block may be used, including using other values of bins. In some examples, entropy encoding unit 56 may signal each bin directly in the bitstream. In other examples, entropy encoding unit 56 may further encode each bin using a context adaptive entropy coding process in a similar manner as described above with reference to FIGS. 7-9, e.g., by performing a CABAC process that includes applying a context model based on a context. Alternatively, as previously described, entropy encoding unit 56 may not encode the scanning order information for the block when entropy encoding unit 56 uses an adaptive scanning order to encode the block.

In any case, in the event the x-coordinate does not correspond to the common position (1014), entropy encoding unit 56 may further encode the x-coordinate based on the scanning order (1016). Similarly, in the event the y-coordinate does not correspond to the common position (1018), entropy encoding unit 56 may further encode the y-coordinate based on the scanning order (1020). To encode the x- and y-coordinates, entropy encoding unit 56 may further determine statistics that indicate a probability of a given position within the block corresponding to the position of the last significant coefficient within the block according to the scanning order. In particular, the statistics may indicate a probability of a coordinate, e.g., an x- or a y-coordinate, corresponding to the position of the last significant coefficient within the block according to the scanning order comprising a given value (e.g., "0," "1," "2," etc.). In other words, the statistics may indicate a probability of each of the x- and y-coordinates previously described comprising a given value. In some examples, entropy encoding unit 56 may determine the statistics using last significant coefficient position information for previously encoded blocks of video data, e.g., values of x- and y-coordinates for the previously encoded blocks.

In some examples, the statistics may vary depending on the scanning order. In particular, the probability of a given position within the block corresponding to the position of the last significant coefficient within the block according to the scanning order may vary depending on the scanning order. That is, different scanning orders may result in different statistics for the last significant coefficient position information for the block. As such, when encoding the last significant coefficient position information for the block based on the statistics, choosing the statistics based at least in part on the scanning order may result in using accurate statistics and, therefore, may enable efficient encoding. Hence, entropy encoding unit 56 may encode the x- and y-coordinates based on the statistics, wherein entropy encoding unit 56 selects the statistics based at least in part on the scanning order. Accordingly, entropy encoding unit 56 may encode the x- and y-coordinates based on the scanning order. Furthermore, entropy encoding unit 56 may update the statistics based on the x- and y-coordinates to reflect the probability of the respective coordinates comprising particular values. For example, the updated statistics may be used to encode last significant coefficient position information for subsequently encoded blocks of video data in the manner described above.

In some examples, to encode the x- and y-coordinates based on the statistics, entropy encoding unit 56 may perform a context adaptive entropy coding process (e.g., a CABAC process) that includes applying a context model that includes the statistics based on at least one context. For example, the at least one context may include one of the x- and y-coordinates and the scanning order. In this example, entropy encoding unit 56 may use the scanning order to select the particular context model that includes the statistics. In this manner, entropy encoding unit 56 may encode the x- and y-coordinates based on the scanning order. Furthermore, in cases where one coordinate (e.g., y-coordinate) is encoded after another coordinate (e.g., x-coordinate), entropy encoding unit 56 may encode the coordinate using a value of the other, previously encoded coordinate as a context. That is, a value of a previously encoded one of the x- and y-coordinates may be used to further select statistics within the context model that indicate a probability of the other, presently encoded coordinate comprising a given value. Entropy encoding unit 56 may then use the selected statistics to encode the x- and y-coordinates by performing the context adaptive entropy coding process.

In this example, the x- and y-coordinates may each be represented using a unary codeword comprising a sequence of one or more bins, i.e., binarized. As such, to encode the x- and y-coordinates based on the statistics, entropy encoding unit 56 may encode each bin of a codeword corresponding to a particular coordinate by performing the context adaptive entropy coding process. In this example, the statistics included in the context model, indicating a probability of the coordinate comprising a given value, may include probability estimates that indicate a probability of each bin of the codeword corresponding to the coordinate comprising a given value (e.g., "0" or "1"). Furthermore, the statistics may include different probability estimates for each bin of the codeword, depending on the position of the respective bin within the codeword. In some examples, entropy encoding unit 56 may determine the probability estimates using values of corresponding bins for previously encoded blocks of video data. e.g., bins of codewords corresponding to x- and y-coordinates for the previously encoded blocks, e.g., as part of determining the statistics based on the last significant coefficient position information for the previously encoded blocks, as previously described. In other examples, entropy encoding unit 56 also may update the probability estimates using the value of each bin, e.g., as part of updating the statistics based on the x- and y-coordinates, as also previously described. Entropy encoding unit 56 may use the probability estimates to encode each bin by performing the context adaptive entropy coding process.

As previously described, as another example, entropy encoding unit 56 may encode the x- and y-coordinates by encoding at least one bin of the sequence corresponding to one of the coordinates by selecting the statistics from the context model based at least in part on a value of a corresponding bin of the sequence corresponding to the other coordinate. Furthermore, entropy encoding unit 56 may encode the one or more bins of the sequence corresponding to the one coordinate and the one or more bins of the sequence corresponding to the other coordinate in an interleaved manner.

In some examples, prior to encoding each coordinate, entropy encoding unit 56 may subtract a value "1" from each coordinate in order to allow the coordinates to be coded more efficiently than when using other methods. For example, entropy encoding unit 56 may subtract the value "1" from each coordinate prior to encoding the coordinate in order to reduce the amount of information used to code the coordinates. Similarly, an entropy decoding unit, e.g., entropy decoding unit 70 described in greater detail in the example of FIG. 11, may add a value "1" to each coordinate after decoding the coordinate, in order to determine the coordinate.

In some examples, entropy encoding unit 56 may further encode information that indicates positions of all other significant coefficients within the block according to the scanning order (1022), i.e., the significant coefficient position information for the block. As previously described, the significant coefficient position information for the block may be represented using a sequence of significant coefficient flags. As also previously described, the significant coefficient position information may be encoded by encoding each significant coefficient flag of the sequence by performing a context adaptive entropy coding process (e.g., a CABAC process) that includes applying a context model based on a context, wherein the context may include a position of the flag within the block according to the scanning order.

In this example, the context model may include probability estimates that indicate a probability of each flag comprising a given value (e.g., "0" or "1"). In some examples, entropy encoding unit 56 may determine the probability estimates using values of corresponding significant coefficient flags for previously encoded blocks of video data. In other examples, entropy encoding unit 56 also may update the probability estimates using the value of each flag to reflect the probability of the flag comprising a given value. For example, the updated probability estimates may be used to encode significant coefficient position information for subsequently encoded blocks of video data in the manner described above.

Finally, entropy encoding unit 56 may stop encoding the last significant coefficient position information based on the scanning order information for the block (1024). For example, entropy encoding unit 56 may proceed to other coding tasks, e.g., encoding of other syntax elements for the block, or a subsequent block, as previously described.

In this manner, the method of FIG. 10 represents an example of a method of coding x- and y-coordinates that indicate a position of a last non-zero coefficient within a block of video data according to a scanning order associated with the block when the scanning order comprises a first scanning order, and coding interchanged x- and y-coordinates that indicate the position of the last non-zero coefficient within the block according to the scanning order when the scanning order comprises a second scanning order, wherein the second scanning order is different than the first scanning order.

Figure 11:
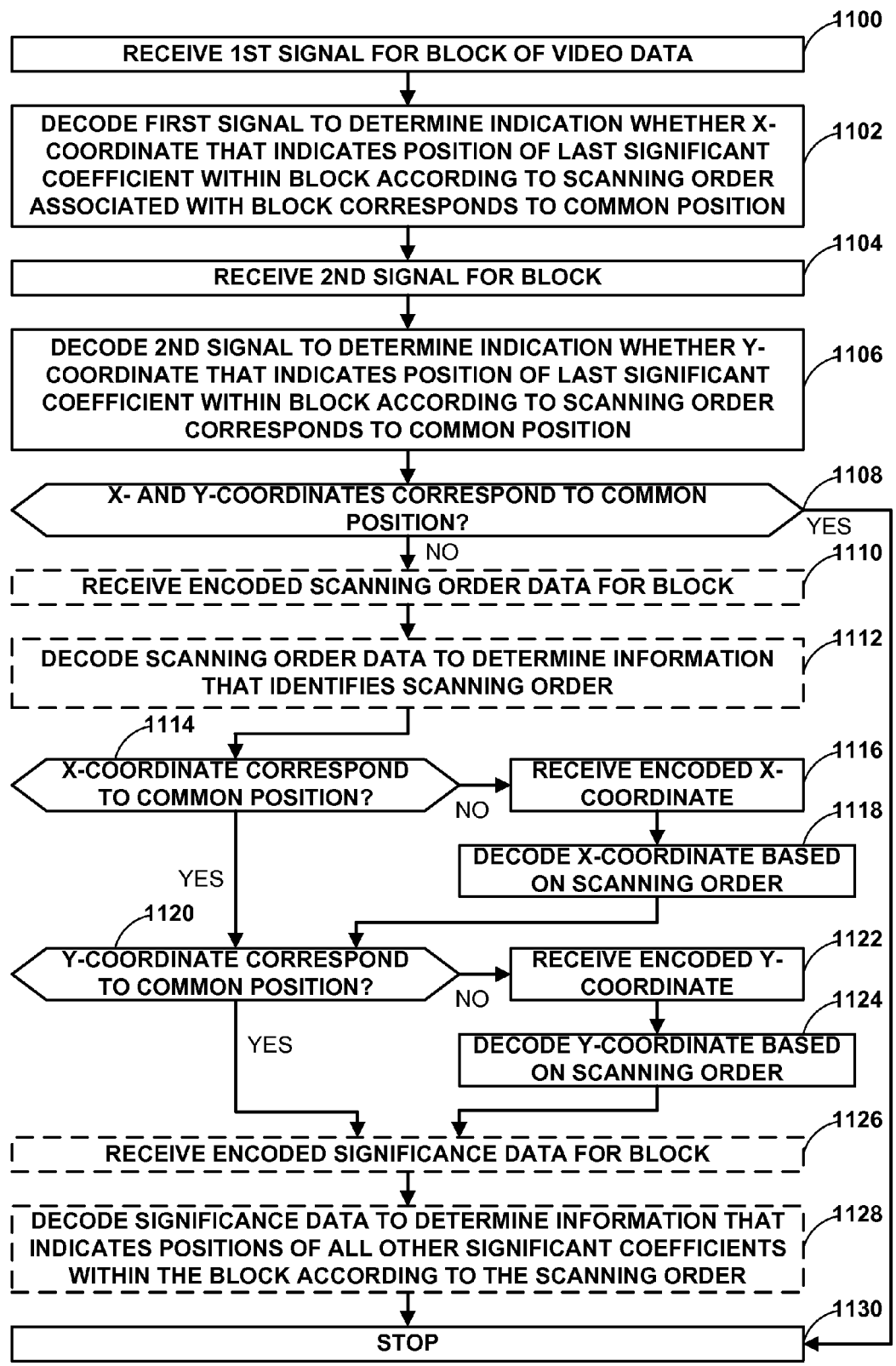
FIG. 11 is a flowchart that illustrates another example of a method for efficiently decoding encoded last significant coefficient position information based on scanning order information for a block of video data, consistent with the techniques of this disclosure.

FIG. 11 is a flowchart that illustrates another example of a method for efficiently decoding encoded last significant coefficient position information based on scanning order information for a block of video data, consistent with the techniques of this disclosure. The techniques of FIG. 11 may generally be performed by any processing unit or processor, whether implemented in hardware, software, firmware, or a combination thereof, and when implemented in software or firmware, corresponding hardware may be provided to execute instructions for the software or firmware. For purposes of example, the techniques of FIG. 11 are described with respect to entropy decoding unit 70 (FIG. 3), although it should be understood that other devices may be configured to perform similar techniques. Moreover, the steps illustrated in FIG. 11 may be performed in a different order or in parallel, and additional steps may be added and certain steps omitted, without departing from the techniques of this disclosure.

Initially, entropy decoding unit 70 may receive a first signal for a block of video data (1100). The block may be a macroblock, or a TU of a CU, as previously described. Entropy decoding unit 70 may further decode the first signal to determine an indication whether an x-coordinate that indicates a position of a last significant coefficient within the block according to a scanning order associated with the block corresponds to a common position (1102). Similarly, entropy decoding unit 70 may further receive a second signal for the block (1104). Entropy decoding unit 70 may further decode the second signal to determine an indication whether a y-coordinate that indicates the position of the last significant coefficient within the block according to the scanning order corresponds to the common position (1106).

For example, the scanning order may be a scanning order used by an entropy encoding unit, e.g., entropy encoding unit 56, to encode the block, and may be one of a plurality of scanning orders used to code blocks of video data in corresponding coding system 10 comprising video encoder 20 and video decoder 30. For example, each of the plurality of scanning orders may originate at the common position, as previously described. The common position may correspond to the DC position.

Furthermore, each indication may comprise a single bin. For example, entropy decoding unit 70 may decode the first signal to determine a first bin that indicates whether the x-coordinate corresponds to the common position (e.g., bin1="1") or otherwise (bin1="0"), and decode the second signal to determine a second bin that indicates whether the y-coordinate corresponds to the common position (e.g., bin2="1") or otherwise (bin2="0"). In some examples, entropy decoding unit 70 may receive each bin directly in the bitstream. That is, the first signal and the second signal may comprise the first bin and the second bin, respectively. In other examples, entropy decoding unit 70 may decode the first and second signals to determine the respective bins using a context adaptive entropy coding process in a similar manner as described above with reference to FIGS. 7-9, e.g., by performing a CABAC process that includes applying a context model based on a context.

In the event the x- and y-coordinates each correspond to the common position (1108), entropy decoding unit 70 may stop decoding the encoded last significant coefficient position information based on the scanning order information for the block (1130). In other words, in cases where the x- and y-coordinates each correspond to the common position, no additional significant coefficients beyond the last (and only) significant coefficient within the block according to the scanning order exist within the block. In such cases, entropy decoding unit 70 does not need to decode any additional last significant coefficient position information, or any scanning order information or significant coefficient position information, for the block. For example, in such cases, entropy decoding unit 70 may proceed to other coding tasks. e.g., decoding of other syntax elements for the block, or a subsequent block.

In the event the x- and y-coordinates do not each correspond to the common position (1108), entropy decoding unit 70 may further receive encoded scanning order data for the block (1110). Entropy decoding unit 70 may further decode the scanning order data to determine information that identifies the scanning order (1112), i.e., the scanning order information for the block. In some examples, where the scanning order includes one of two scanning orders used within system 10 to code blocks of video data, entropy decoding unit 70 may decode the scanning order data to determine a single bin. For example, the single bin may indicate whether the scanning order is a first scanning order (e.g., bin="0") or a second scanning order (bin="1"). In other examples, where the scanning order includes one of three scanning orders that may be used within system 10 to code blocks of video data, entropy decoding unit 70 may decode the scanning order data to determine between one and two bins. For example, entropy decoding unit 70 may determine a first bin that indicates whether the scanning order is a first scanning order (e.g., bin1="0" if the scanning order is the first scanning order, and bin1="1" otherwise). In the event the first bin indicates that the scanning order is not the first scanning order, entropy decoding unit 70 may determine a second bin that indicates whether the scanning order is a second scanning order (e.g., bin2="0"), or a third scanning order (e.g., bin2="1"). In other examples, other methods of determining the scanning order information for the block may be used, including using other values of bins. In some examples, entropy decoding unit 70 may receive each bin directly in the bitstream. That is, the scanning order data may comprise the one or more bins. In other examples, entropy decoding unit 70 may decode the scanning order data to determine each bin using a context adaptive entropy coding process in a similar manner as described above with reference to FIGS. 7-9, e.g., by performing a CABAC process that includes applying a context model based on a context. Alternatively, as previously described, entropy decoding unit 70 may not receive and decode the encoded the scanning order data for the block when entropy decoding unit 70 uses an adaptive scanning order to decode the block.

In any case, in the event the x-coordinate does not correspond to the common position (1114), entropy decoding unit 70 may further receive the encoded x-coordinate (1116), and decode the x-coordinate based on the scanning order (1118). Similarly, in the event the y-coordinate does not correspond to the common position (1120), entropy decoding unit 70 may further receive the encoded y-coordinate (1122), and decode the y-coordinate based on the scanning order (1124). As previously described, to decode the encoded x- and y-coordinates, entropy decoding unit 70 may further determine statistics that indicate a probability of a given position within the block corresponding to the position of the last significant coefficient within the block according to the scanning order, in a substantially similar manner as described above with reference to entropy encoding unit 56. The statistics may indicate a probability of a coordinate, e.g., an x- or a y-coordinate, corresponding to the position of the last significant coefficient within the block according to the scanning order comprising a given value (e.g., "0," "1," "2," etc.). In other words, the statistics may indicate a probability of each of the x- and y-coordinates previously described comprising a given value. In some examples, entropy decoding unit 70 may determine the statistics using last significant coefficient position information for previously decoded blocks of video data, e.g., values of x- and y-coordinates for the previously decoded blocks.

In some examples, the statistics may vary depending on the scanning order. In particular, the probability of a given position within the block corresponding to the position of the last significant coefficient within the block according to the scanning order may vary depending on the scanning order. That is, different scanning orders may result in different statistics for the last significant coefficient position information for the block. As such, when decoding the encoded last significant coefficient position information for the block based on the statistics, choosing the statistics based at least in part on the scanning order may result in using accurate statistics and, therefore, may enable efficient decoding. As such, entropy decoding unit 70 may decode the encoded x- and y-coordinates based on the statistics, wherein entropy decoding unit 70 selects the statistics based at least in part on the scanning order. Accordingly, entropy decoding unit 70 may decode the encoded x- and y-coordinates based on the scanning order. Furthermore, entropy decoding unit 70 may update the statistics based on the x- and y-coordinates to reflect the probability of the respective coordinates comprising particular values. For example, the updated statistics may be used to decode encoded last significant coefficient position information for subsequently decoded blocks of video data in the manner described above.

In some examples, to decode the encoded x- and y-coordinates based on the statistics, entropy decoding unit 70 may perform a context adaptive entropy coding process (e.g., a CABAC process) that includes applying a context model that includes the statistics based on at least one context. For example, the at least one context may include one of the x- and y-coordinates and the scanning order. In this example, entropy decoding unit 70 may use the scanning order to select the particular context model that includes the statistics. In this manner, entropy decoding unit 70 may decode the encoded x- and y-coordinates based on the scanning order. Furthermore, in cases where one encoded coordinate (e.g., y-coordinate) is decoded after another encoded coordinate (e.g., x-coordinate), entropy decoding unit 70 may decode the coordinate using a value of the other, previously decoded coordinate as a context. That is, a value of a previously decoded one of the x- and y-coordinates may be used to further select statistics within the context model that indicate a probability of the other, presently decoded coordinate comprising a given value. Entropy decoding unit 70 may then use the selected statistics to decode the encoded x- and y-coordinates by performing the context adaptive entropy coding process.

The x- and y-coordinates may each be represented using a unary codeword comprising a sequence of one or more bins, i.e., binarized. As such, to decode the encoded x- and y-coordinates based on the statistics, entropy decoding unit 70 may decode each bin of a codeword corresponding to a particular coordinate by performing the context adaptive entropy coding process. In this example, the statistics included in the context model, indicating a probability of the coordinate comprising a given value, may include probability estimates that indicate a probability of each bin of the codeword corresponding to the coordinate comprising a given value (e.g., "0" or "1"). Furthermore, the statistics may include different probability estimates for each bin of the codeword, depending on the position of the respective bin within the codeword. In some examples, entropy decoding unit 70 may determine the probability estimates using values of corresponding bins for previously decoded blocks of video data. e.g., bins of codewords corresponding to x- and y-coordinates for the previously decoded blocks, e.g., as part of determining the statistics based on the last significant coefficient position information for the previously decoded blocks, as previously described. In other examples, entropy decoding unit 70 also may update the probability estimates using the value of each bin, e.g., as part of updating the statistics based on the x- and y-coordinates, as also previously described. Entropy decoding unit 70 may use the probability estimates to decode each bin by performing the context adaptive entropy coding process.

As previously described, as another example, entropy decoding unit 70 may decode the x- and y-coordinates by decoding at least one bin of the sequence corresponding to one of the coordinates by selecting the statistics from the context model based at least in part on a value of a corresponding bin of the sequence corresponding to the other coordinate. Furthermore, entropy decoding unit 70 may decode the one or more bins of the sequence corresponding to the one coordinate and the one or more bins of the sequence corresponding to the other coordinate in an interleaved manner.

Upon decoding each coordinate, entropy decoding unit 70 may add a value "1" to each coordinate in order to allow the coordinates to be coded more efficiently than when using other methods. For example, as also previously described, an entropy encoding unit, e.g., entropy encoding unit 56, may encode the x- and y-coordinates by first subtracting the value "1" from each coordinate in order to reduce the amount of information used to code the coordinates. As such, entropy decoding unit 70 may add the value "1" to each coordinate after decoding the coordinate, in order to determine the coordinate.

In some examples, entropy decoding unit 70 may further receive encoded significance data for the block (1126). In these examples, entropy decoding unit 70 may decode the significance data to determine information that indicates positions of all other significant coefficients within the block according to the scanning order (1128), i.e., the significant coefficient position information for the block. As previously described, the significant coefficient position information for the block may be represented using a sequence of significant coefficient flags. As also previously described, the significant coefficient position information may be decoded by decoding each significant coefficient flag of the sequence by performing a context adaptive entropy coding process (e.g., a CABAC process) that includes applying a context model based on a context, wherein the context may include a position of the flag within the block according to the scanning order.

In this example, the context model may include probability estimates that indicate a probability of each flag comprising a given value (e.g., "0" or "1"). In some examples, entropy decoding unit 70 may determine the probability estimates using values of corresponding significant coefficient flags for previously decoded blocks of video data. In other examples, entropy decoding unit 70 also may update the probability estimates using the value of each flag to reflect the probability of the flag comprising a given value. For example, the updated probability estimates may be used to decode encoded significant coefficient position information for subsequently decoded blocks of video data in the manner described above.

Finally, entropy decoding unit 70 may stop decoding the encoded last significant coefficient position information based on the scanning order information for the block (1130). For example, entropy decoding unit 70 may proceed to other coding tasks, e.g., decoding of other syntax elements for the block, or a subsequent block, as previously described.

In this manner, the method of FIG. 11 represents an example of a method of coding x- and y-coordinates that indicate a position of a last non-zero coefficient within a block of video data according to a scanning order associated with the block when the scanning order comprises a first scanning order, and coding interchanged x- and y-coordinates that indicate the position of the last non-zero coefficient within the block according to the scanning order when the scanning order comprises a second scanning order, wherein the second scanning order is different than the first scanning order.

Therefore, in accordance with the techniques of this disclosure, an encoded bitstream may comprise last significant coefficient position information for a block of video data, i.e., for coefficients associated with the block. In particular, video encoder 20 may encode x- and y-coordinates that indicate a position of a last significant coefficient within the block according to a scanning order associated with the block when the scanning order comprises a first scanning order, and encode interchanged x- and y-coordinates that indicate the position of the last significant coefficient within the block according to the scanning order when the scanning order comprises a second scanning order. For example, the second scanning order may be different than the first scanning order. Video decoder 30 may, in turn, decode the last significant coefficient position information for the block. In particular, video decoder 30 may decode the x- and y-coordinates when the scanning order comprises the first scanning order, and decode the interchanged x- and y-coordinates when the scanning order comprises the second scanning order.

Accordingly, this disclosure also contemplates a computer-readable medium comprising a data structure stored thereon that includes an encoded bitstream. The encoded bitstream stored on the computer-readable medium may comprise video data encoded using a specific format, and encoded information that identifies a position of a last significant coefficient within a block of video data according to a scanning order associated with the block, represented using x- and y-coordinates. The specific order in which the x- and y-coordinates are encoded within the bitstream depends on whether the scanning order associated with the block comprises a first scanning order or a second scanning order. More specifically, if the scanning order comprises the first scanning order, the bitstream may include the last significant coefficient position information for the block encoded using x- and y-coordinates. In this case, the last significant coefficient position information for the block may be decoded, and the resulting x- and y-coordinates may be used directly to decode the block. Alternatively, if the scanning order comprises the second scanning order, then the bitstream may include the last significant coefficient position information for the block encoded using interchanged x- and y-coordinates. In this case, the last significant coefficient position information may be decoded, wherein the interchanged x- and y-coordinates are further interchanged, and the resulting x- and y-coordinates may be used to decode the block.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of coding a block of coefficients associated with a block of video data during a video coding process, the method comprising:
    determining contexts for performing context adaptive entropy coding of the x- and y-coordinates indicating a horizontal position and a vertical position, respectively, of a last non-zero coefficient within the block of coefficients, wherein the contexts indicate a probability of each of the x- and y-coordinates comprising a given value when the coefficients of the block of video data are scanned in a first scanning order;
    in the case that the coefficients are scanned in the first scanning order, entropy coding the x-coordinate and the y-coordinate using the determined contexts such that the x-coordinate is entropy coded based on the probability of the x-coordinate having a given value and the y-coordinate is entropy coded based on the probability of the y-coordinate having a given value; and
    in the case that the coefficients are scanned in the second scanning order, interchanging the x- and y-coordinates and entropy coding the interchanged x-coordinate and the interchanged y-coordinate using the determined contexts such that the interchanged x-coordinate is entropy coded based on the probability of the y-coordinate having a given value and the interchanged y-coordinate is entropy coded based on the probability of the x-coordinate having a given value.

2. The method of claim 1, wherein the first scanning order comprises a horizontal scanning order and the second scanning order comprises a vertical scanning order.

3. The method of claim 1, wherein entropy coding the x- and y-coordinates and the interchanged x- and y-coordinates comprises coding a sequence of one or more bins, wherein the contexts indicate probabilities of each of the bins having a given value.

4. The method of claim 1, wherein coding comprises decoding, the method further comprising:
    receiving entropy encoded values indicative of the x-coordinate and y-coordinate in the video bitstream, wherein entropy coding the respective ones of the x- and y-coordinates or the interchanged x- and y-coordinates comprises entropy decoding the received entropy encoded values so as to obtain the respective ones of x- and y-coordinates or the interchanged x- and y-coordinates;
    receiving encoded values of non-zero coefficients associated with the block of video data in a bitstream; and
    decoding the encoded values of the non-zero coefficients based on the respective ones of the x- and y-coordinates and the interchanged x- and y-coordinates.

5. The method of claim 1, wherein coding comprises encoding, and wherein entropy coding the respective ones of the x- and y-coordinates or the interchanged x- and y-coordinates comprises entropy encoding the respective ones of the x- and y-coordinates or the interchanged x- and y-coordinate so as to obtain the entropy encoded values indicative of the x-coordinate and y-coordinate; the method further comprising:
    encoding values of non-zero coefficients associated with the block of video data based on the respective ones of the x- and y-coordinates and the interchanged x- and y-coordinates; and
    outputting entropy encoded values indicative of the x-coordinate and y-coordinate and the encoded values of the non-zero coefficients in a video bitstream.

6. An apparatus for coding a block of coefficients associated with a block of video data during a video coding process, the apparatus comprising:
    a memory configured to store video data; and
    a processor in communication with the memory and configured to:
        determine contexts for performing context adaptive entropy coding of the x- and y-coordinates indicating a horizontal position and a vertical position, respectively, of a last non-zero coefficient within the block of coefficients, wherein the contexts indicate a probability of each of the x- and y-coordinates comprising a given value when the coefficients of the block of video data are scanned in a first scanning order;
        in the case that the coefficients are scanned in the first scanning order, entropy code the x-coordinate and the y-coordinate using the determined contexts such that the x-coordinate is entropy coded based on the probability of the x-coordinate having a given value and the y-coordinate is entropy coded based on the probability of the y-coordinate having a given value; and
        in the case that the coefficients are scanned in the second scanning order, interchange the x- and y-coordinates and entropy code the interchanged x-coordinate and the interchanged y-coordinate using the determined contexts such that the interchanged x-coordinate is entropy coded based on the probability of the y-coordinate having a given value and the interchanged y-coordinate is entropy coded based on the probability of the x-coordinate having a given value.

7. The apparatus of claim 6, wherein the first scanning order comprises a horizontal scanning order and the second scanning order comprises a vertical scanning order.

8. The apparatus of claim 6, wherein to entropy code the x- and y-coordinates and the interchanged x- and y-coordinates, the processor is configured to code a sequence of one or more bins, wherein the contexts indicate probabilities of each of the bins having a given value.

9. The apparatus of claim 6, wherein the processor is further configured to:
- receive entropy encoded values indicative of the x-coordinate and y-coordinate in the video bitstream, wherein to entropy code the respective ones of the x- and y-coordinates or the interchanged x- and y-coordinates, the processor is configured to entropy decode the received entropy encoded values so as to obtain the respective ones of x- and y-coordinates or the interchanged x- and y-coordinates;
- receive encoded values of non-zero coefficients associated with the block of video data in a bitstream; and
- decode the encoded values of the non-zero coefficients based on the respective ones of the x- and y-coordinates and the interchanged x- and y-coordinates.

10. The apparatus of claim 6, wherein to entropy code the respective ones of the x- and y-coordinates or the interchanged x- and y-coordinates, the processor is configured to entropy encode the respective ones of the x- and y-coordinates or the interchanged x- and y-coordinates so as to obtain the entropy encoded values indicative of the x-coordinate and y-coordinate and wherein the processor is further configured to:
- decode values of non-zero coefficients associated with the block of video data based on the respective ones of the x- and y-coordinates and the interchanged x- and y-coordinates; and
- output entropy encoded values indicative of the x-coordinate and y-coordinate and the encoded values of the non-zero coefficients in a video bitstream.

11. A non-transitory computer-readable medium having stored thereon instructions that, when executed, cause a processor to code coefficients associated with a block of video data during a video coding process, wherein the instructions cause the processor to:
- determine contexts for performing context adaptive entropy coding of the x- and y-coordinates indicating a horizontal position and a vertical position, respectively, of a last non-zero coefficient within the block, wherein the contexts indicate a probability of each of the x- and y-coordinates comprising a given value when the coefficients of the block of video data are scanned in a first scanning order;
- when the coefficients of the block of video data are scanned in the first scanning order, code the x-coordinate and the y-coordinate using the determined contexts such that the x-coordinate is coded based on the probability of the x-coordinate comprising a given value and the y-coordinate is coded based on the probability of the y-coordinate comprising a given value; and
- interchange the x- and y-coordinates when the coefficients of the block of video data are scanned in the second scanning order and code the interchanged x-coordinate and the interchanged y-coordinate using the determined contexts such that the interchanged x-coordinate is coded based on the probability of the y-coordinate comprising a given value and the interchanged y-coordinate is coded based on the probability of the x-coordinate comprising a given value.

12. The computer-readable medium of claim 11, wherein the first scanning order comprises a horizontal scanning order and the second scanning order comprises a vertical scanning order.

13. The computer-readable medium of claim 11, wherein to entropy code the x- and y-coordinates and the interchanged x- and y-coordinates, the instructions cause the processor to code a sequence of one or more bins, wherein the contexts indicate probabilities of each of the bins having a given value.

14. The computer-readable medium of claim 11, wherein the instructions further cause the processor to:
- receive entropy encoded values indicative of the x-coordinate and y-coordinate in the video bitstream, wherein to entropy code the respective ones of the x- and y-coordinates or the interchanged x- and y-coordinates, the processor is configured to entropy decode the received entropy encoded values so as to obtain the respective ones of x- and y-coordinates or the interchanged x- and y-coordinates;
- receive encoded values of non-zero coefficients associated with the block of video data in a bitstream; and
- decode the encoded values of the non-zero coefficients based on the respective ones of the x- and y-coordinates and the interchanged x- and y-coordinates.

15. The computer-readable medium of claim 11, wherein to entropy code the respective ones of the x- and y-coordinates or the interchanged x- and y-coordinates, the instructions cause the processor to entropy encode the respective ones of the x- and y-coordinates or the interchanged x- and y-coordinates so as to obtain the entropy encoded values indicative of the x-coordinate and y-coordinate and wherein the instructions further cause the processor:
- decode values of non-zero coefficients associated with the block of video data based on the respective ones of the x- and y-coordinates and the interchanged x- and y-coordinates; and
- output entropy encoded values indicative of the x-coordinate and y-coordinate and the encoded values of the non-zero coefficients in a video bitstream.

* * * * *